US008137468B2

(12) United States Patent  
Choi et al.

(10) Patent No.: US 8,137,468 B2
(45) Date of Patent: Mar. 20, 2012

(54) HEATED VALVE MANIFOLD FOR AMPOULE

(75) Inventors: Kenric T. Choi, San Jose, CA (US); Son T. Nguyen, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 428 days.

(21) Appl. No.: 12/405,692

(22) Filed: Mar. 17, 2009

(65) Prior Publication Data

US 2009/0232986 A1    Sep. 17, 2009

Related U.S. Application Data

(60) Provisional application No. 61/037,271, filed on Mar. 17, 2008.

(51) Int. Cl.
 *C23C 16/00*    (2006.01)
(52) U.S. Cl. .................... 118/724; 427/255.28
(58) Field of Classification Search ............ 427/255.18; 118/724
 See application file for complete search history.

(56) References Cited

U.S. PATENT DOCUMENTS

| | | | |
|---|---|---|---|
| 6,921,062 B2 | 7/2005 | Gregg et al. | |
| 7,300,038 B2 | 11/2007 | Gregg et al. | |
| 2006/0257295 A1 | 11/2006 | Chen et al. | |
| 2007/0110898 A1 | 5/2007 | Ganguli et al. | |
| 2007/0194470 A1 | 8/2007 | Dedontney | |
| 2007/0235085 A1 | 10/2007 | Nakashima et al. | |
| 2008/0041310 A1 | 2/2008 | Gregg et al. | |
| 2008/0085226 A1* | 4/2008 | Fondurulia et al. ........... | 422/198 |
| 2008/0149031 A1 | 6/2008 | Chu et al. | |
| 2010/0255198 A1* | 10/2010 | Cleary et al. ............. | 427/255.39 |

FOREIGN PATENT DOCUMENTS

JP    2000174005 A   *  6/2000

OTHER PUBLICATIONS

Machine Translation of JP2000-174005, Takamatsu et al.*
PCT International Search Report and Written Opinion dated Aug. 25, 2009 for International Application No. PCT/US2009/037430.

* cited by examiner

*Primary Examiner* — Matthew Daniels
*Assistant Examiner* — Lisa Herring
(74) *Attorney, Agent, or Firm* — Patterson & Sheridan, L.L.P.

(57) ABSTRACT

Embodiments of the invention provide an apparatus and a method for generating a gaseous chemical precursor that may be used in a vapor deposition processing system. In one embodiment, the apparatus contains a valve manifold assembly, which includes a valve assembly body having at least one embedded electric heater, an inlet channel passing through the valve assembly body, a first pneumatic valve and a first manual valve coupled to the valve assembly body and positioned to control fluid flow within the inlet channel, an outlet channel passing through the valve assembly body, and a second pneumatic valve and a second manual valve coupled to the valve assembly body and positioned to control fluid flow within the outlet channel. The valve manifold assembly further contains a bypass channel connected to and between the inlet and outlet channels, and containing a bypass valve positioned to control fluid flow within the bypass channel.

3 Claims, 39 Drawing Sheets

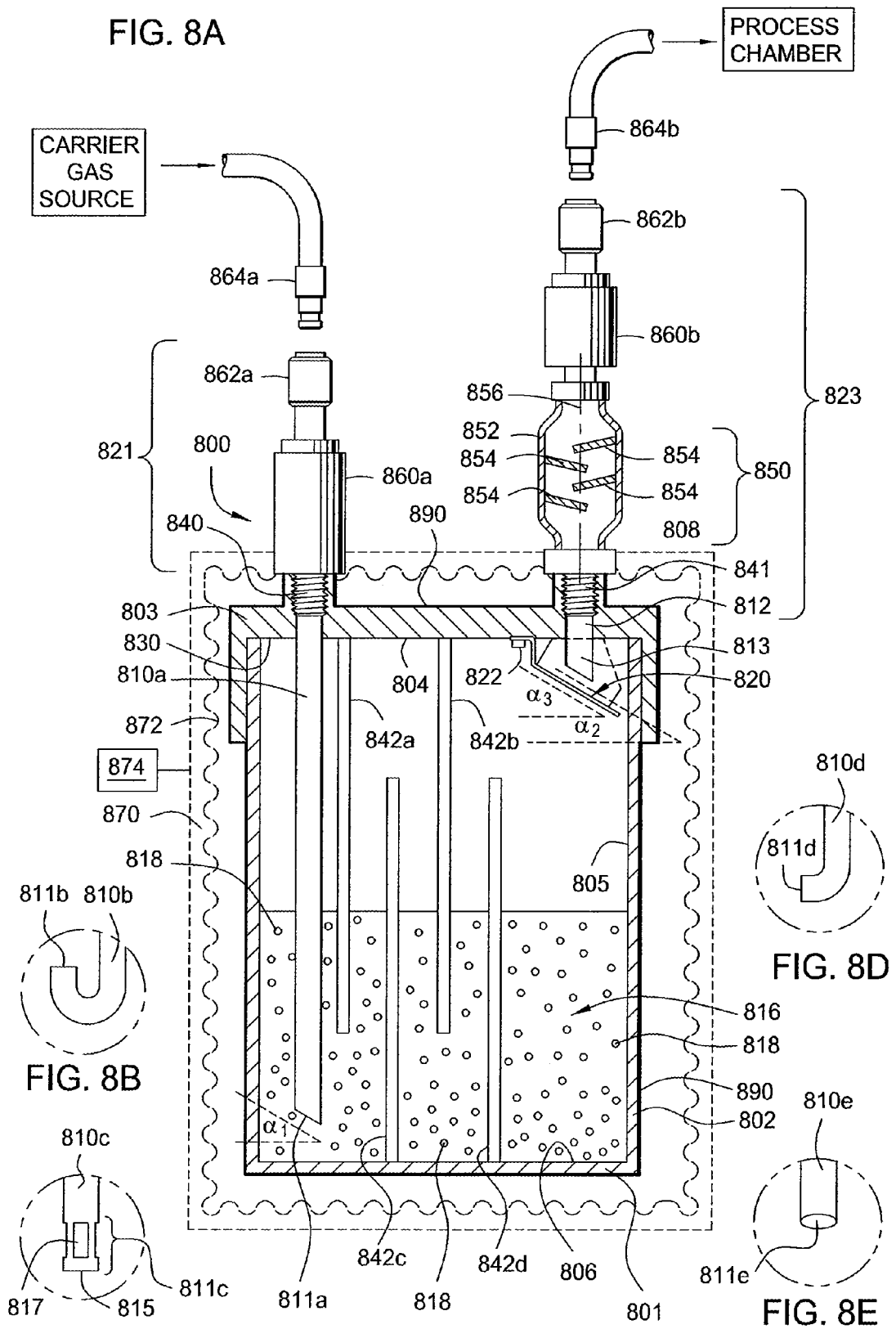

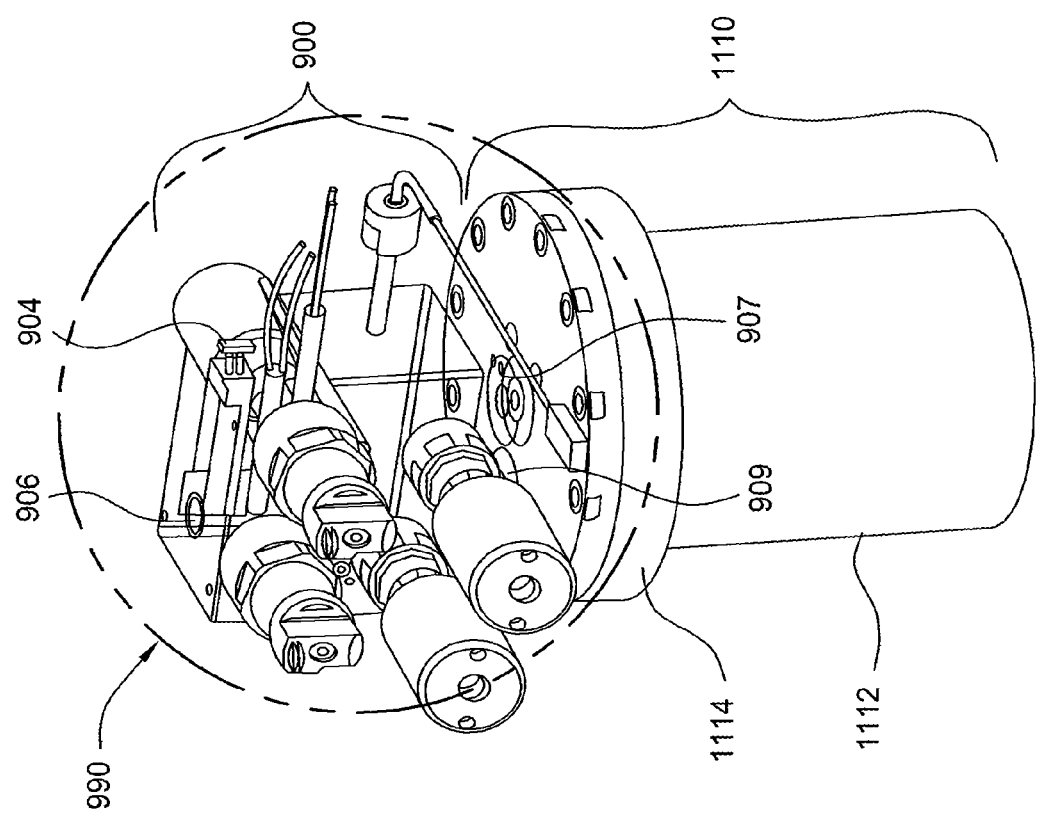

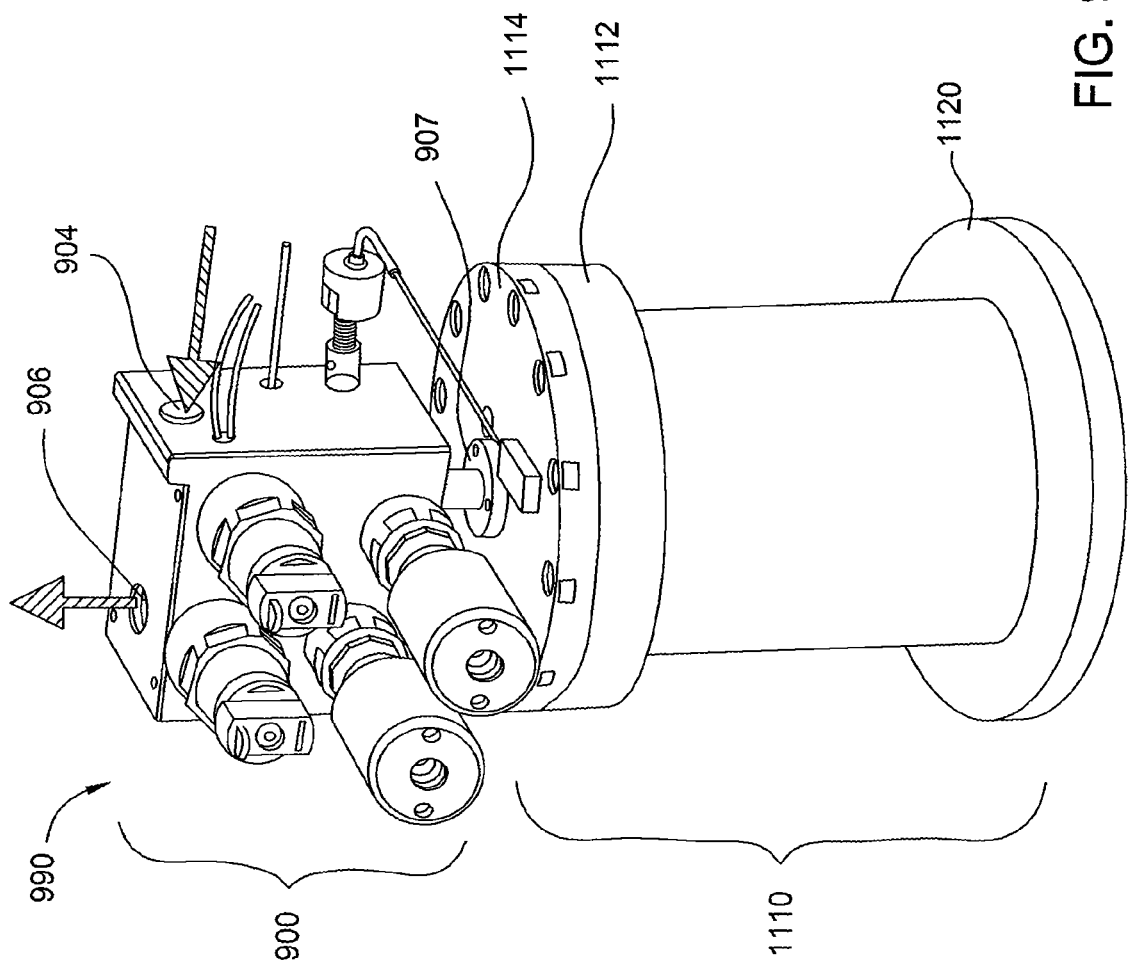

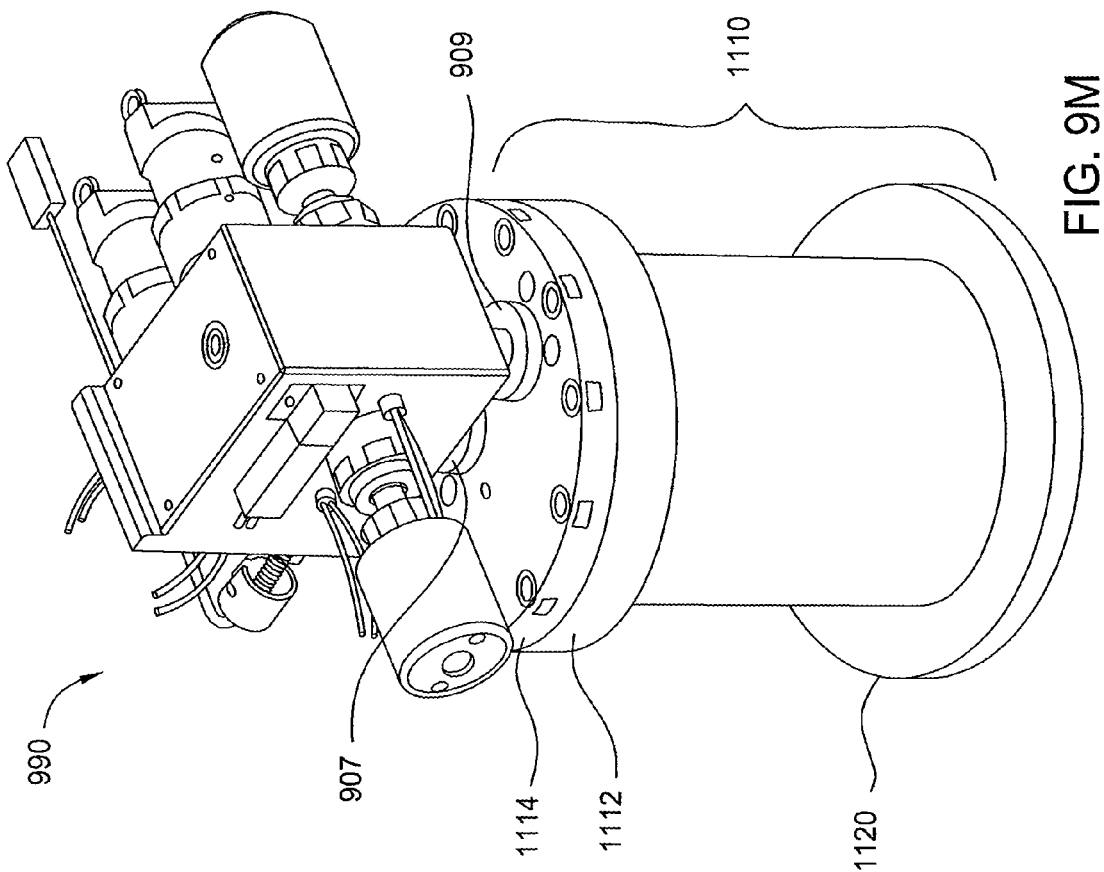

HEATED VALVE MANIFOLD FOR AMPOULE

CROSS-REFERENCE TO RELATED APPLICATIONS

This application claims priority to U.S. Provisional Patent Application Ser. No. 61/037,271, filed Mar. 17, 2008. Each of the aforementioned related patent applications is herein incorporated by reference in its entirety.

BACKGROUND OF THE INVENTION

1. Field of the Invention

Embodiments of the invention relate to an apparatus and a method for storing and delivering chemical precursors, and more particularly, to a heated valve manifold and methods thereof.

2. Description of the Related Art

Integrated circuits have evolved into complex devices that include millions of transistors, capacitors, and resistors on a single chip. The evolution of chip design continually requires faster circuitry and greater circuit density demanding increasingly precise fabrication processes. The precision processing of substrates requires precise control of temperature, rate, and pressure in the delivery of fluids used during processing.

Chemical vapor deposition (CVD) and atomic layer deposition (ALD) are vapor deposition processes are used to form or deposit various materials on a substrate. In general, CVD and ALD processes involve the delivery of gaseous reactants to the substrate surface where a chemical reaction takes place under temperature and pressure conditions favorable to the thermodynamics of the reaction. The type and composition of the layers that may be formed using a CVD process or an ALD process are limited by the ability to deliver a chemical reactant or precursor to the substrate surface. Various liquid precursors have been successfully used during CVD and ALD applications by delivering the liquid precursors within a carrier gas.

A carrier gas is in some cases passed through a heated vessel or canister, such as an ampoule or bubbler, which contains a volatile liquid precursor under conditions conducive to vaporize the precursor. In other cases, a carrier gas is passed through a heated vessel containing a solid precursor under conditions conducive to sublime the solid precursor. The sublimation process is typically performed in a vessel loaded or filled with a solid precursor, and the vessel walls are heated to sublime the solid precursor material while producing a gaseous precursor. In either case, the carrier gas combines with the vaporized precursor to form a process gas which is drawn from the vessel via dedicated conduits or gas lines to a reaction chamber.

A vapor deposition process that utilizes a solid precursor may suffer several problems. While a solid precursor should be provided enough heat to be sublimed into a gaseous state, the solid precursor may decompose if exposed to too much heat. Metal-organic solid precursors, which are usually very expensive, are especially susceptible to thermal decomposition and generally need to be maintained within narrow temperature and pressure ranges during a sublimation process. Once decomposed, solid precursors may contaminate the remaining precursor in the vessel, the delivery system of conduits and valves, the processing chamber, as well as the substrate. Furthermore, overheating a solid precursor may provide too high of a precursor concentration within the process gas, which may lead to wasted precursor that is never used or condensation of the precursor within the delivery lines or on the substrate.

Alternatively, the solid precursor may not sublime if exposed to too little heat. As the carrier gas is flowed through the vessel and impacts the solid precursor, particulates from the solid precursor may become entrained in the carrier gas and transferred into the process chamber. These undesired solid or liquid particulates may become a source of contamination for the delivery system, processing chamber, or substrate. The problem of particulate contamination has been addressed in the art by including a liquid carrier material mixed with a solid precursor. However, the mixture of the liquid carrier material and the solid precursor may only be conducive within limited temperature and pressure ranges since the liquid carrier material may be evaporated and become a contaminant within the delivery system, processing chamber, or on the substrate.

Therefore, there is a need for an improved apparatus and method for forming a process gas within an ampoule or bubbler and providing the process gas to a processing chamber.

SUMMARY OF THE INVENTION

Embodiments of the invention provide an apparatus and a method for generating a gaseous chemical precursor that may be used in a vapor deposition processing system. In one embodiment, the apparatus is a valve manifold assembly which includes a valve assembly body, at least one embedded electric heater within the valve assembly body, an inlet channel passing through the valve assembly body and containing a first inlet and a first outlet, a first pneumatic valve and a first manual valve coupled to the valve assembly body and positioned to control fluid flow within the inlet channel, an outlet channel passing through the valve assembly body and containing a second inlet and a second outlet, and a second pneumatic valve and a second manual valve coupled to the valve assembly body and positioned to control fluid flow within the outlet channel. The valve manifold assembly further contains a bypass channel, wherein a first end of the bypass channel is coupled to the inlet channel and a second end of the bypass channel is coupled to the outlet channel, and a bypass valve coupled to the valve assembly body and positioned to control fluid flow within the bypass channel. In one example, the bypass valve is a pneumatic valve.

In another embodiment, an apparatus for generating a chemical precursor used in a vapor deposition processing system is provided which includes a canister containing a sidewall, a top, and a bottom encompassing an interior volume therein, an inlet port and an outlet port in fluid communication with the interior volume, a heated valve assembly coupled to and in fluid communication with the inlet port and the outlet port, wherein the heated valve assembly contains a heater, a bypass channel, and at least five valves.

In another embodiment, an apparatus for generating a chemical precursor used in a vapor deposition processing system is provided which includes a heated valve assembly coupled to and in fluid communication with an ampoule, wherein the heated valve assembly further contains at least one heater, an inlet channel coupled to and in fluid communication with the ampoule, a first pneumatic valve and a first manual valve coupled to the heated valve assembly and positioned to control fluid flow within the inlet channel, an outlet channel coupled to and in fluid communication with the ampoule, a second pneumatic valve and a second manual valve coupled to the heated valve assembly and positioned to control fluid flow within the outlet channel, a bypass channel, wherein a first end of the bypass channel is coupled to the inlet channel and a second end of the bypass channel is coupled to the outlet channel, and a bypass valve coupled to the heated valve assembly and positioned to control fluid flow within the bypass channel.

In some examples, the heating source contains at least one embedded electric heater within the heated valve assembly. The heated valve assembly may contain a plurality of embedded electric heaters, for example, such as 3, 4, or more. The heated valve assembly may contain an overtemp sensor or a thermostat coupled to the embedded electric heater and pre-programmed to reduce or disconnect power to the embedded electric heaters in order to maintain or provide a limit to a predetermined temperature.

In some embodiments, the heated valve assembly contains an inlet channel coupled to and in fluid communication with the inlet port and an outlet channel coupled to and in fluid communication with the outlet port. A first pneumatic valve and a first manual valve may be attached to the heated valve assembly and positioned to control fluid flow within the inlet channel. The inlet channel may be coupled to and in fluid communication with a first end of the bypass channel. A second pneumatic valve and a second manual valve may be attached to the heated valve assembly and positioned to control fluid flow within the outlet channel. The outlet channel may be coupled to and in fluid communication with a second end of the bypass channel. Additionally, the bypass channel further contains at least one bypass valve, for example, a pneumatic valve.

In various examples, the ampoule contains a chemical precursor, at least partially filling the interior volume, which has a solid state at ambient conditions (e.g., temperature and pressure). In one example, the solid chemical precursor contains hafnium tetrachloride. In another example, the solid chemical precursor contains pentakis(dimethylamido) tantalum.

In another embodiment, a method for generating a chemical precursor used in a vapor deposition processing system is provided which includes heating a valve assembly to a temperature within a range from about 150° C. to about 225° C., wherein the valve assembly is coupled to and in fluid communication with an ampoule containing hafnium tetrachloride, and the valve assembly contains at least one embedded heater, an inlet channel coupled to and in fluid communication with the ampoule. The valve assembly further contains a first pneumatic valve and a first manual valve coupled to the valve assembly and positioned to control fluid flow within the inlet channel, an outlet channel coupled to and in fluid communication with the ampoule, a second pneumatic valve and a second manual valve coupled to the valve assembly and positioned to control fluid flow within the outlet channel, a bypass channel, wherein a first end of the bypass channel is coupled to the inlet channel and a second end of the bypass channel is coupled to the outlet channel, and a bypass valve coupled to the valve assembly and positioned to control fluid flow within the bypass channel. The method further provides flowing a carrier gas from a gas source, through the inlet channel, and into the ampoule to form a deposition gas containing hafnium tetrachloride, and flowing the deposition gas containing hafnium tetrachloride from the ampoule, through the outlet channel, and to a processing system.

In other embodiments, the method further includes stopping the flow of the carrier gas, cooling the ampoule to a temperature of about 40° C. or less, closing the first and second pneumatic valves and the first and second manual valves, and removing the ampoule from the processing system. In one example, the ampoule is cooled to a temperature of about 25° C. or less. In other examples, the valve assembly is heated to a temperature within a range from about 175° C. to about 200° C. The bypass valve may be a pneumatic valve.

In another embodiment, a method for generating a chemical precursor used in a vapor deposition processing system is provided which includes heating a valve assembly to a temperature within a range from about 100° C. to about 350° C., wherein the valve assembly is coupled to and in fluid communication with an ampoule containing a metal-containing precursor, and the valve assembly contains at least one embedded heater, an inlet channel coupled to and in fluid communication with the ampoule. The valve assembly further contains a first pneumatic valve and a first manual valve coupled to the valve assembly and positioned to control fluid flow within the inlet channel, an outlet channel coupled to and in fluid communication with the ampoule, a second pneumatic valve and a second manual valve coupled to the valve assembly and positioned to control fluid flow within the outlet channel, a bypass channel, wherein a first end of the bypass channel is coupled to the inlet channel and a second end of the bypass channel is coupled to the outlet channel, and a bypass valve coupled to the valve assembly and positioned to control fluid flow within the bypass channel. The method further provides flowing a carrier gas from a gas source, through the inlet channel, and into the ampoule to form a deposition gas containing the metal-containing precursor, and flowing the deposition gas containing the metal-containing precursor from the ampoule, through the outlet channel, and to a processing system. In some examples, the valve assembly may be heated to a temperature within a range from about 150° C. to about 275° C., preferably, from about 175° C. to about 200° C.

In another example, the method further includes stopping the flow of the carrier gas, cooling the ampoule to a temperature of about 40° C. or less, closing the first and second pneumatic valves and the first and second manual valves, and removing the ampoule from the processing system. The ampoule may be cooled to a temperature of about 25° C. or less.

In another embodiment, a method for generating a chemical precursor used in a vapor deposition processing system is provided which includes attaching an ampoule assemble containing a valve manifold assembly to a processing system, wherein the valve manifold assembly is coupled to and in fluid communication with an ampoule containing a chemical precursor, and the valve manifold assembly contains at least one embedded heater, an inlet channel coupled to and in fluid communication with the ampoule. The valve manifold assembly further contains a first pneumatic valve and a first manual valve coupled to the valve manifold assembly and positioned to control fluid flow within the inlet channel, an outlet channel coupled to and in fluid communication with the ampoule, a second pneumatic valve and a second manual valve coupled to the valve manifold assembly and positioned to control fluid flow within the outlet channel, a bypass channel, wherein a first end of the bypass channel is coupled to the inlet channel and a second end of the bypass channel is coupled to the outlet channel, and a bypass valve coupled to the valve manifold assembly and positioned to control fluid flow within the bypass channel. The method further provides opening the first and second manual valves and the bypass valve while maintaining closed the first and second pneumatic valves, evacuating the bypass channel and upper portions of the inlet and outlet channels, flowing a purge gas through the bypass channel and upper portions of the inlet and outlet channels, closing the bypass valve, and subsequently opening the first and second pneumatic valves.

The bypass channel and upper portions of the inlet and outlet channels may be evacuated while flowing the purge gas therethrough. The method further provides flowing a carrier gas from a gas source, through the inlet channel, and into the ampoule to form a deposition gas containing the chemical precursor. The purge gas and the carrier gas may be the same gas, such as nitrogen. The method further provides flowing the deposition gas containing the chemical precursor from the ampoule, through the outlet channel, and into the processing system. The valve manifold assembly and the ampoule may independently be heated to independent and predetermined temperatures.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8A illustrates a cross sectional schematic view of a precursor ampoule as described by another embodiment herein;

FIGS. 8B-8E are simplified schematic views of various tips for an inlet stem as described by alternative embodiments herein;

FIGS. 9A-9M schematically depict a valve manifold assembly, as described in embodiments herein;

DETAILED DESCRIPTION

Figure 1:
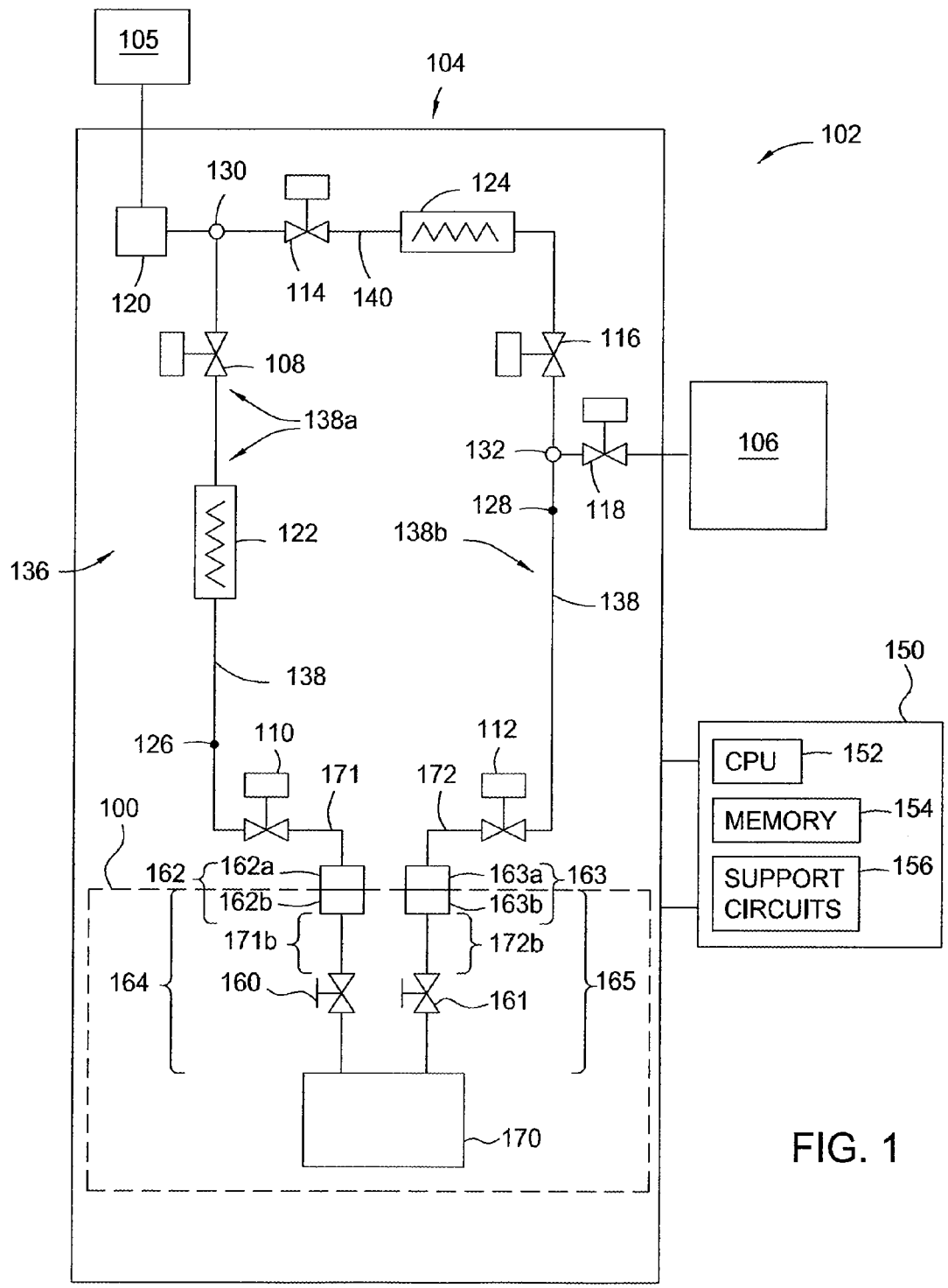
FIG. 1 is a simplified schematic of a process gas delivery system that employs a conventional ampoule assembly.

FIG. 1 is a simplified schematic of process gas delivery system 102 which suitable for producing a process gas containing a chemical precursor and generally includes process chamber 106 and a carrier gas source 105 coupled to gas panel 104, the components of the latter being controlled by a controller 150. Gas panel 104 generally controls the rate and pressure at which various process and carrier gases are delivered to process chamber 106. Process chamber 106 may be a chamber to conduct vapor deposition processes or thermal processes containing a vaporized chemical precursor in liquid, gaseous or plasma state. Process chamber 106 is generally a chemical vapor deposition (CVD) chamber, an atomic layer deposition (ALD) chamber, or a derivative thereof. Examples of process chamber 106 include a PRODUCER® CVD chamber and a DZX® CVD chamber, both available from Applied Materials, Inc., located in Santa Clara, Calif., or an ALD chamber, such as that described in commonly assigned U.S. Pat. No. 6,916,398, which is herein incorporated by references in its entirety.

In the configuration illustrated in FIG. 1, controller 150 includes central processing unit (CPU) 152, memory 154, and support circuits 156. Central processing unit 152 may be one of any form of computer processor that can be used in an industrial setting for controlling various chambers and subprocessors. Memory 154 is coupled to CPU 152 and may be one or more of readily available memory such as random access memory (RAM), read only memory (ROM), flash memory, compact disc, floppy disk, hard disk, or any other form of local or remote digital storage. Support circuits 156 are coupled to CPU 152 for supporting CPU 152 in a conventional manner. These circuits include cache, power supplies, clock circuits, input/output circuitry, subsystems, and the like.

Fluid delivery circuit 136 is generally intended to fluidly couple carrier gas source 105, ampoule 100, and process chamber 106 as necessary for operation of process chamber 106. Carrier gas source 105 may be a local vessel, remote vessel or a centralized facility source that supplies the carrier gas throughout the facility (e.g., in-house gas supply). Carrier gas source 105 typically supplies a carrier gas such as nitrogen, hydrogen, argon, helium, or combinations thereof. Additional purge fluid sources (not shown) may also be fluidly coupled to fluid delivery circuit 136 when the use of specialized purge fluids, such as a purge liquid, is required. Fluid delivery circuit 136 typically includes a flow controller 120 disposed between carrier gas source 105 and junction 130 and is adapted to modulate the flow rate of carrier gas or other fluids through fluid delivery circuit 136. Flow controller 120 may be a proportional valve, a modulating valve, a needle valve, a regulator, a mass flow controller (MFC) or the like. Junction 130 separates fluid delivery circuit 136 into gas generation line 138 and, bypass line 140. Junction 132 rejoins gas generation line 138 and bypass line 140 before connecting to process chamber 106.

Gas generation line 138 includes ampoule inlet leg 138a, ampoule outlet leg 138b, valves 108, 110, 112, sensors 126, 128, disconnect fittings 162, 163, and heater 122. Ampoule inlet leg 138a fluidly couples the inlet of ampoule 100 to carrier gas source 105 and to bypass line 140. Ampoule outlet leg 138b fluidly couples the outlet of ampoule assembly 100 to process chamber 106 and to bypass line 140. Valves 108, 110 and 112 are typically remotely controllable shut-off valves that serve to divert the flow of fluids within fluid delivery circuit 136 and/or are used to selectively isolate the various components within fluid delivery circuit 136 to facilitate removal, replacement and/or service of an isolated component, including sensors 126, 128, heater 122, and ampoule assembly 100. Valves 108, 110, 112, as well as valves 114, 116, 118 (described below in conjunction with bypass line 140) are generally pneumatically or electronically controlled and the internal wetted surfaces thereof are fabricated from materials compatible with the process and other fluids handled by fluid delivery circuit 136. Typically, valves 108, 110, 112, 114, 116, and 118 are actuated in response to a signal from a controller 150 to coordinate the delivery of gases through fluid delivery circuit 136. Sensors 126, 128 are generally adapted to detect the temperature of a process, carrier, and/or purge fluid flowing through gas generation line 138, such as a thermocouple disposed against a conduit of gas generation line 138.

Bypass line 140 generally includes valves 114, 116 and heater 124 and serves to fluidly couple process chamber 106 and carrier gas source 105 without the use of gas generation line 138 or ampoule assembly 100. Valve 118 is generally coupled between junction 132 and process chamber 106 and may be used to isolate process chamber 106 from fluid delivery circuit 136. Heaters 122, 124 are resistive heating elements or other heat sources adapted to heat a flow of fluid, such as a carrier gas, flowing through gas generation line 138 and bypass line 140, respectively.

Ampoule assembly 100 generally contains an ampoule, or body 170, an inlet line 164, an outlet line 165, disconnect fittings 162b, 163b, and manual shut-off valves, manual valves 160, 161, disposed in inlet line 164, 165, respectively. Dead leg conduit segment 171b is disposed in inlet line 164 between manual valve 160 and disconnect fitting 162 and dead leg conduit segment 172b is disposed in outlet line 165 between manual valve 161 and disconnect fitting 163. Ampoule assembly 100 may also be referred to as a bubbler, a canister, and other terms known in the art to describe containers designed and used to store, transport and distribute chemical precursors. Inlet line 164 is coupled to ampoule inlet leg 138a at disconnect fitting 162 and outlet line 165 is coupled to ampoule outlet leg 138b at disconnect fitting 163. Disconnect fitting 162, 163 are typically adapted to facilitate removal and replacement of ampoule assembly 100 in gas panel 104 while leaving all other components of gas panel 104 in place, such as gas generation line 138 and its constituent parts. To this end, disconnect fittings 162, 163 typically include mating disconnect fittings 162a, 162b and 163a, 163b respectively, wherein disconnect fittings 162b, 163b are inherent to ampoule assembly 100 and corresponding disconnect fittings 162a, 163a are contained in fluid delivery circuit 136. Depending on the application, disconnect fittings 162a, 162b and 163a, 163b may be quick disconnect type fittings, re-sealable vacuum-tight fittings, such as VCR fittings, or other suitable disconnect fittings.

Ampoule assembly 100 may have a variety of sizes and geometries. Ampoule assembly 100 may have a volume capacitance of a chemical precursor within a range from about 0.5 L to about 10 L and more typically from about 1.2 L to about 4 L. In one example, ampoule assembly 100 has a volume capacitance of a chemical precursor of about 2.5 L. Chemical precursors that may be within ampoule assembly 100 include liquid, solid and gaseous precursors, preferably in liquid or fluid-like states at predetermined temperatures and/or pressures. For example, a chemical precursor may exist in the solid state at room temperature, but melts to the liquid state upon being heated to a predetermined temperature within the ampoule. In another example, the majority of a chemical precursor may remain in the solid state in the ampoule, but is heated to an elevated temperature during processing such that a small amount of the solid precursor sublimates directly into vapor. In another example, a chemical precursor may exist in the gaseous state at ambient pressure, but condenses to the liquid state upon being pressurized to a predetermined pressure within the ampoule.

Solid chemical precursors may be used to form process gases include tantalum precursors, such as pentakis(dimethylamido) tantalum (PDMAT; $Ta(NMe_2)_5$), pentakis(diethylamido) tertiaryamylimido-tris(dimethylamido) tantalum (TAIMATA, $(^tAmylN)Ta(NMe_2)_3$), wherein $^tAmyl$ is the tertiaryamyl group ($C_5H_{11}$— or $CH_3CH_2C(CH_3)_2$—), or derivatives thereof. In one embodiment, the PDMAT has a low halogen content (e.g., Cl, F, I, or Br). The PDMAT may have a halogen concentration of less than about 100 ppm. For example, the PDMAT may have a chlorine concentration of less than about 100 ppm, preferably, less than about 20 ppm, more preferably, less than about 5 ppm, and more preferably, less than about 1 ppm, such as about 100 ppb or less.

Other solid chemical precursors that may be used to form process gases through a sublimation process include hafnium tetrachloride ($HfCl_4$), xenon difluoride, nickel carbonyl, and tungsten hexacarbonyl, or derivatives thereof. In other embodiments, liquid chemical precursors may be evaporated to form process gases within ampoules described herein. Other chemical precursors that may be used to form process gases include tungsten precursors, such as tungsten hexafluoride ($WF_6$), tantalum precursors, such as tantalum (PDEAT; $Ta(NEt_2)_5$), pentakis(methylethylamido) tantalum (PMEAT; $Ta(NMeEt)_5$), tertbutylimino-tris(dimethylamino) tantalum (TBTDMT, $^tBuNTa(NMe_2)_3$), tertbutylimino-tris(diethylamino) tantalum (TBTDET, $^tBuNTa(NEt_2)_3$), tertbutylimino-tris(methylethylamino) tantalum (TBTMET, $^tBuNTa(NMeEt)_3$), or derivatives thereof, titanium precursors, such as titanium tetrachloride ($TiCl_4$), tetrakis(dimethylamino) titanium (TDMAT, $(Me_2N)_4Ti$)), tetrakis(diethylamino) titanium (TEMAT, $(Et_2N)_4Ti$)), or derivatives thereof, ruthenium precursors, such as bis(ethylcyclopentadienyl) ruthenium ($(EtCp)_2Ru$), hafnium precursors, such as tetrakis(dimethylamino) hafnium (TDMAH, $(Me_2N)_4Hf$)), tetrakis(diethylamino) hafnium (TDEAH, $(Et_2N)_4Hf$)), tetrakis(methylethylamino) hafnium (TMEAH, $(MeEtN)_4Hf$)), or derivatives thereof, and aluminum precursors, such as 1-methylpyrolidrazine:alane (MPA, $MeC_4H_3N:AlH_3$), pyridine:alane ($C_4H_4N:AlH_3$), alkylamine alane complexes (e.g., trimethylamine:alane ($Me_3N:AlH_3$), triethylamine:alane ($Et_3N:AlH_3$), dimethylethylamine:alane ($Me_2EtN:AlH_3$)), trimethylaluminum (TMA, $Me_3Al$), triethylaluminum (TEA, $Et_3Al$), tributylaluminum ($Bu_3Al$), dimethylaluminum chloride ($Me_2AlCl$), diethylaluminum chloride ($Et_2AlCl$), dibutylaluminum hydride ($Bu_2AlH$), dibutylaluminum chloride ($Bu_2AlCl$), or derivatives thereof.

During processing, a carrier gas flows from carrier gas source 105 through fluid delivery circuit 136 to ampoule assembly 100. The carrier gas may be heated by heater 122, ampoule assembly 100 may be heated to a desired temperature, or in some applications, both the carrier gas and ampoule assembly 100 may be heated. During processing, valves 114 and 116 are closed, directing all carrier gas flow to process chamber 106 via gas generation line 138 and ampoule assembly 100.

During an initial pump-purge procedure performed prior to removing and replacing ampoule assembly 100, manual valves 160, 161 are closed. This isolates body 170 from gas generation line 138. During a pump-down segment of a pump-purge procedure, carrier gas source 105 is also isolated from fluid delivery circuit 136 by a shut-off valve (not shown) located between carrier gas source 105 and fluid delivery circuit 136. The vacuum source for process chamber 106 is typically used to pump down fluid delivery circuit 136 and dead leg conduit segments 171b, 172b of ampoule assembly 100. Alternatively, a dedicated vacuum source may be used, such as a vacuum pump fluidly coupled to fluid delivery circuit 136. In either case, all components of fluid delivery circuit 136 that are not isolated from the vacuum source are pumped down to a desired vacuum level, e.g. rough, medium, or high vacuum, by opening the requisite valves in gas panel 104. For example, when the vacuum source of process chamber 106 is used for pumping down fluid delivery circuit 136, valve 118 is opened to fluidly couple process chamber 106 to fluid delivery circuit 136, valves 114 and 116 are opened so that bypass line 140 fluidly couples ampoule inlet leg 138a to vacuum, and valves 110 and 112 are opened to fluidly couple conduit segments 171, 172 and dead leg conduit segments 171b, 172b to vacuum. The desired level of vacuum targeted during the pump-down segment depends on each particular CVD or ALD application and is a function of factors such as the vapor pressure of precursors, other residues being removed, and fluid delivery line length. In one embodiment, personnel may enter gas panel 104 despite the presence of unpurged fluid delivery lines in order to close manual valves 160, 161 of ampoule assembly 100.

For a purge segment of a pump-purge procedure, a purge fluid source, such as carrier gas source 105, is fluidly coupled to fluid delivery circuit 136 and the desired purge fluid is introduced therein. The desired purge fluid may be a gas, such as an inert gas or other carrier gas, or a liquid, including solvents such as tetrahydrofuran (THF) or triglyme. Composition of the purge fluid depends on the physical state and chemical make-up of the chemical residues to be purged, solid particles and low vapor pressure liquids sometimes requiring one or more liquid solvent purges. Further, the purge fluid may also be heated during the purge segment to aid in the removal of unwanted chemical residue, either prior to be introduced into fluid delivery circuit 136 or by heaters 122, 124. The vacuum source, such as process chamber 106 in one example, may be isolated from fluid delivery circuit 136 during the purge segment or it may be fluidly coupled thereto in order to continuously remove purge fluid throughout the purge segment. The active flow of purge fluid may occur principally along bypass line 140 during a purge procedure. The only active flow of purge fluid into ampoule inlet leg 138a and ampoule outlet leg 138b occurs when these two sections of fluid delivery circuit are back-filled with purge fluid at the beginning of a purge segment. Hence, ampoule inlet leg 138a and ampoule outlet leg 138b act as extensive dead legs of significant length and potentially include numerous flow-restricting elbows. Further, the regions of fluid delivery circuit 136 that will be exposed to atmosphere during ampoule replacement, i.e. conduit segments 171, 172, and dead leg conduit segments 171b, 172b, may likely to be contaminated and may be thoroughly purge in preparation thereof. However, conduit segments 171, 172, and dead leg conduit segments 171b, 172b are located at the distal ends of the above-described dead legs and are difficult regions of fluid delivery circuit 136 to effectively purge.

During removal, valves 110 and 112 are closed to fluidly isolate conduit segments 171, 172 from fluid delivery circuit 136, and disconnect fittings 162, 163 are separated to allow removal of ampoule assembly 100, wherein mating disconnect fittings 162b, 163b inherent to ampoule assembly 100 and are removed therewith. As noted above, it is known in the art that ampoule shut-off valves, i.e. manual valves 160, 161, may not always be completely leak-tight after prolonged exposure to the precursor chemicals contained in ampoule assembly 100. Because a single point of isolation is used for ampoule assembly 100 at inlet line 164 and outlet line 165, i.e. manual valves 160, 161, respectively, there is the potential of leakage into or out of ampoule assembly 100 during the removal of a depleted ampoule from gas panel 104. A freshly-charged ampoule is reconnected to fluid delivery circuit 136 at disconnect fittings 162, 163.

After installation of a new ampoule assembly 100, any fluid delivery connection points or other seals that were broken during ampoule removal/replacement are leak-checked, in this example disconnect fittings 162, 163. Leak checking ensures that contaminants are not drawn into fluid delivery circuit 136 and that toxic chemical precursors do not leak out of ampoule assembly 100 during processing. If either of disconnect fittings 162, 163 are not vacuum-tight, only a single point of isolation is present between the chemical contents of ampoule assembly 100 and any contaminants that may have leaked into dead leg conduit segments 171b, 172b.

Therefore, there is a need for an apparatus and process to purge gas lines as completely as possible, to perform pump-purge procedures with minimal entry into a gas cabinet, and to decrease the possibility of leakage into or out of precursor-containing ampoules before, during, and after removal and installation of such ampoules.

In some embodiments, a precursor ampoule contains an inlet conduit and an outlet conduit and also configured to include a bypass line and a remotely controllable valve fluidly connecting the inlet and outlet conduits. Aspects also contemplate a pair of shut-off valves configured in series on both the inlet and outlet conduits of the ampoule, wherein each pair of valves includes a positive sealing manual valve, such as a ¼-turn ball valve, and a remotely controllable valve, such as a pneumatic valve. Aspects further contemplate charging or back-filling some or all components of a precursor ampoule with an inert gas, such as He. In one example, the body and inlet and outlet lines of a precursor-containing ampoule assembly are charged with an inert gas above atmospheric pressure. In another example, segments of the inlet and outlet lines of a precursor-containing ampoule assembly are charged with an inert gas above atmospheric pressure. Another aspect of the invention contemplates an ampoule body that provides more uniform heating of its contents via one or more layers of a thermally conductive coating.

For reasons of chemical compatibility and mechanical strength, body 270 is typically made of a stainless steel, such as 316 stainless steel (316 SST). The material of body 270 should be fairly chemical inert since different types of chemical precursors, such as highly reactive materials, may be stored within body 270. Substantial mechanical strength is a desirable characteristic for body 270 of ampoule assembly 300a. In some embodiments, body 270 may be operated at below atmospheric pressure during processes and may be pressurized above atmospheric pressure for transport and storage. Hence, body 270 must act as a reliable containment vessel for a toxic chemical precursor while utilized as a vacuum chamber or as a pressure vessel.

Undesirable thermal gradients may develop inside body 300a during use since 316 SST is a poor medium for thermal conductivity. For example, when a liquid chemical precursor is contained inside body 300a, more volume of body 300a is vapor-filled as the liquid precursor is depleted, poor thermal conductivity of body 200 may result in uneven heating (e.g., hot spots) within the liquid precursor later in the life of the ampoule. In another example, such as when body 300a contains a solid chemical precursor, poor thermal conductivity of body 200 may create hot spots throughout the life of the a mpoule. In either case, a CVD process or an ALD process may be detrimentally affected by such temperature non-uniformities.

Figure 3A:
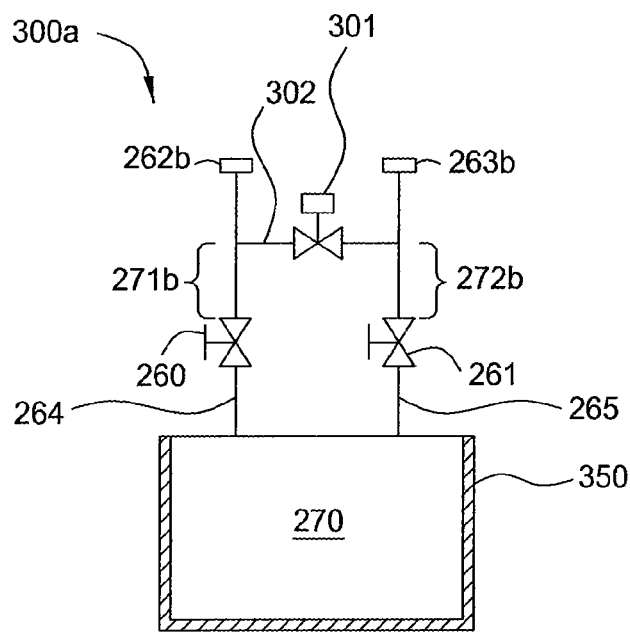
FIGS. 3A-3I are schematic diagrams of chemical-containing containers, as described in embodiments herein.
Figure 3B:
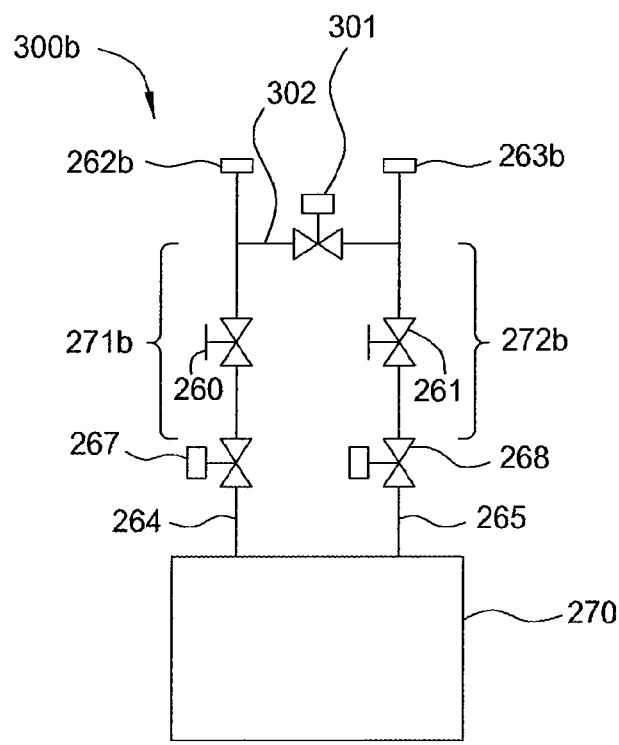
Figure 3C:
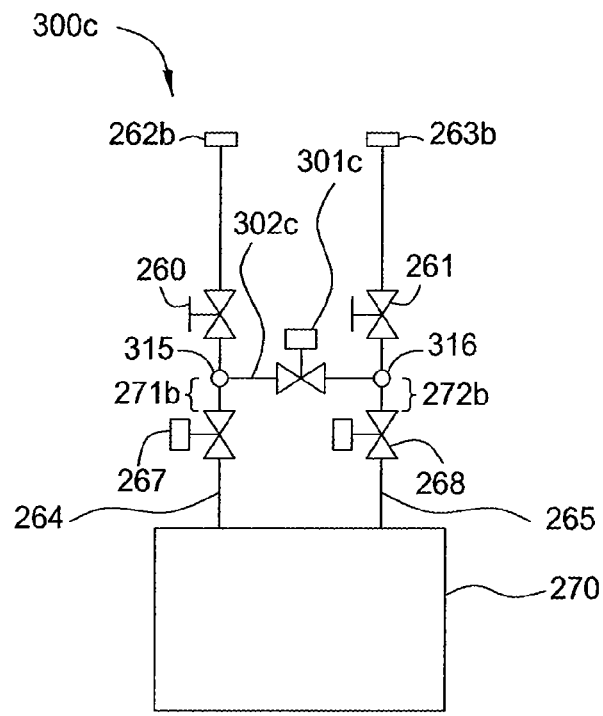
Figure 3D:
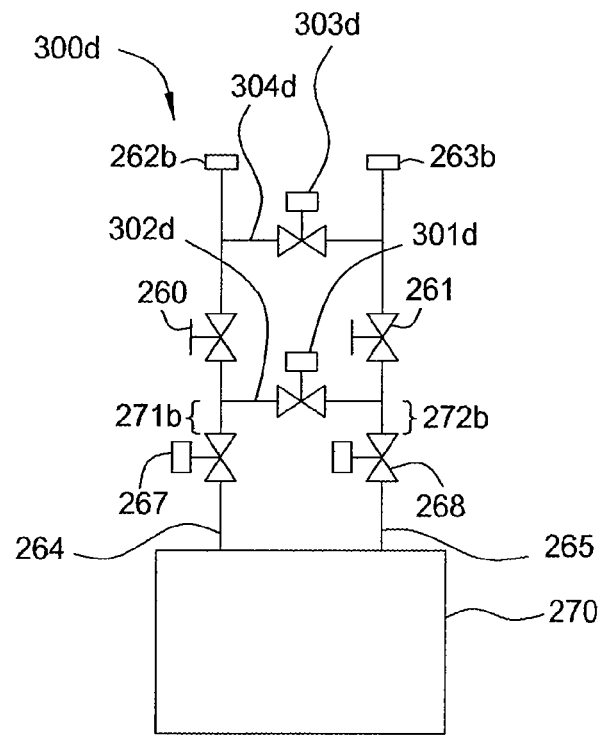
Figure 3E:
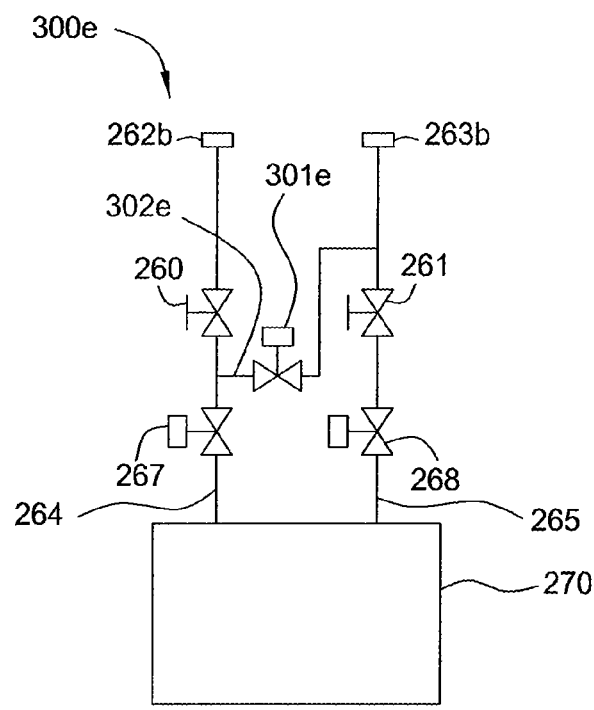
Figure 3F:
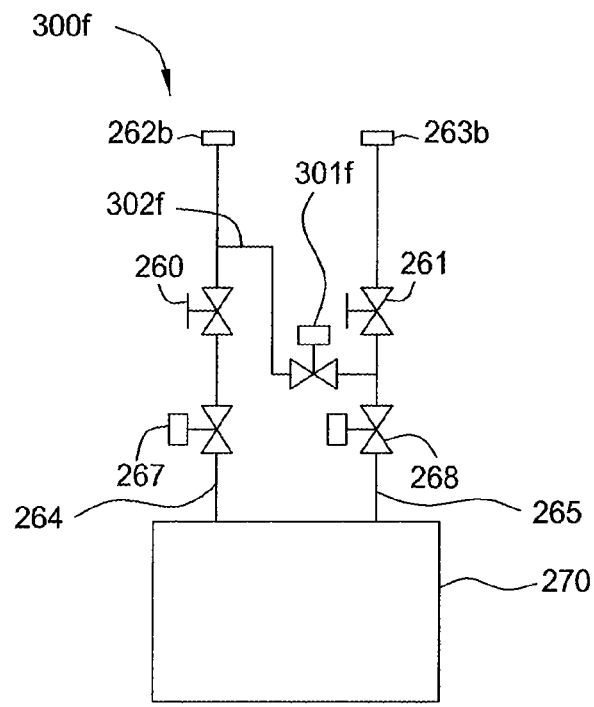
Figure 3G:
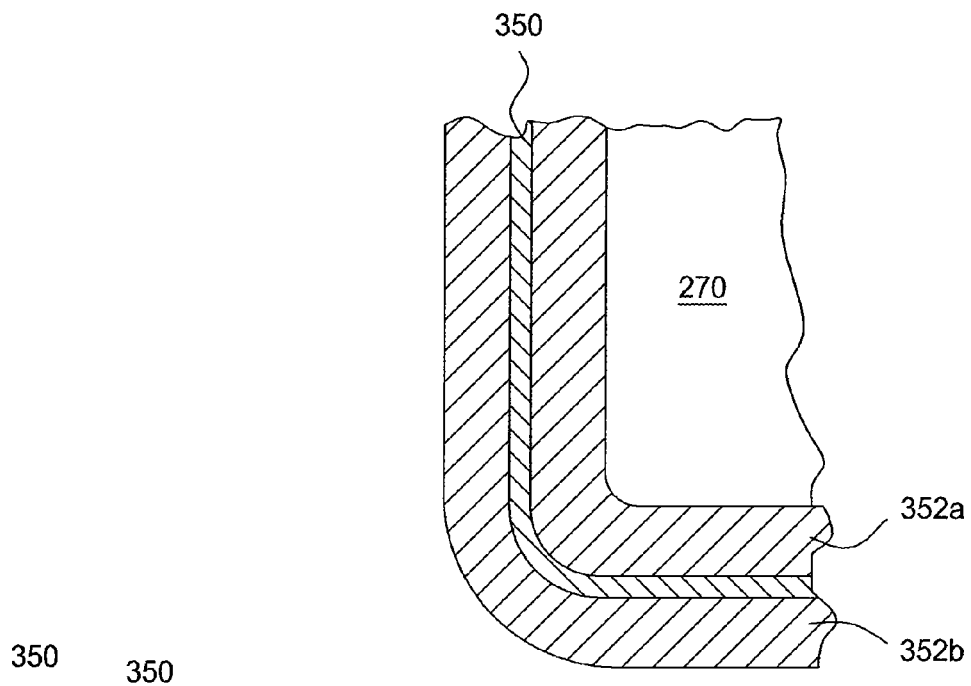
Figure 3H:
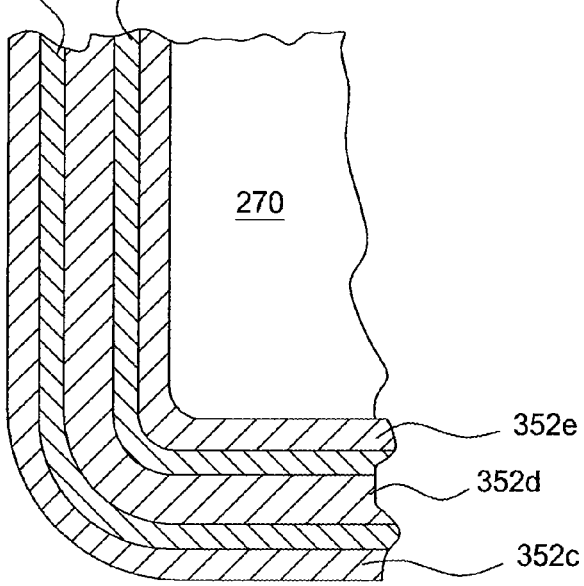

In one embodiment, the temperature uniformity of a chemical precursor contained in ampoule assembly 300a may be improved by using thermally conductive layer 350 containing a thermally conductive material disposed on body 270 to improve heat conduction throughout body 270, as depicted in FIGS. 3A and 3G-3H. Thermally conductive layer 350 may be a simple coating or may be an interlayer sandwiched between an inner layer and an outer layer of a stronger but less thermally conductive material, such as 316 SST. FIG. 3G illustrates a partial sectional schematic view of body 270, wherein thermally conductive layer 350 is sandwiched between two layers 352a, 352b of one or more mechanically stronger materials. FIG. 3H illustrates a partial sectional schematic view of body 270, wherein multiple thermally conductive layers 350 are sandwiched between multiple layers 352c, 352d, and 352e of one or more mechanically stronger materials to form a layered structure.

Figure 3I:
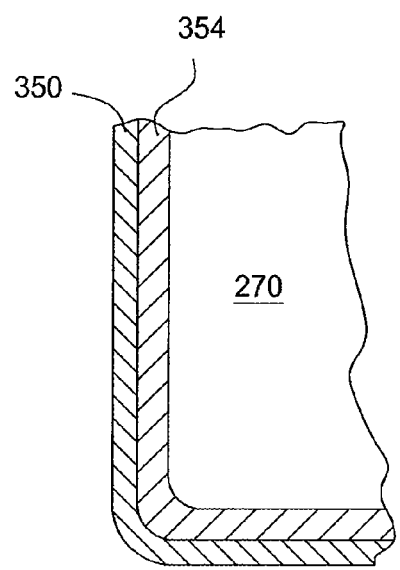

In another embodiment, adhesion layer 354 may be disposed on body 270 prior to depositing thermally conductive layer 350 thereon, as depicted in FIG. 3I. Adhesion layer 354 may contain a single layer or multiple layers and may be deposited or formed on body 270 by various deposition processes, such as an electron beam (e-beam) sputter process, a physical vapor deposition (PVD) process, a CVD process, an ALD process, an electrochemical plating (ECP) process, or an electroless deposition process. Adhesion layer 354 may contain titanium, tantalum, tungsten, ruthenium, cobalt, alloys thereof, or combinations thereof. In one example, adhesion layer contains titanium or tantalum and is deposited by an e-beam process, a PVD process, or an ECP process to the stainless steel surface of body 270.

Thermally conductive layer 350 is illustrated as a coating on or over body 270 of ampoule assembly 300a, as depicted in FIG. 3A. However, thermally conductive layer 350 may easily be incorporated into the embodiments illustrated in FIGS. 3B-3F as well. Thermally conductive layer 350 may be applied to body 270 by electroplating or other coating methods. Examples of possible materials for thermally conductive layer 350 include aluminum, aluminum nitride, copper, brass, silver, titanium, silicon nitride, alloys thereof, combinations thereof, or other thermally conductive materials that are substantially more heat conducting than the material contained within the bulk of body 270. The thickness of thermally conductive layer 350 may be within a range from about 2 μm to about 3 mm.

Thermally conductive layer 350 may contain a single layer or multiple layers and may be deposited or formed on body 270 or adhesion layer 354 by various deposition processes, such as e-beam, PVD, CVD, ALD, ECP, or an electroless deposition process. In one example, thermally conductive layer 350 contains aluminum or an aluminum alloy and is deposited by an e-beam process, a PVD process, or an ECP process to the stainless steel surface of body 270 or adhesion layer 354. In another example, thermally conductive layer 350 contains copper or a copper alloy and is deposited by an e-beam process, a PVD process, or an ECP process to the stainless steel surface of body 270 or adhesion layer 354.

Figure 4A:
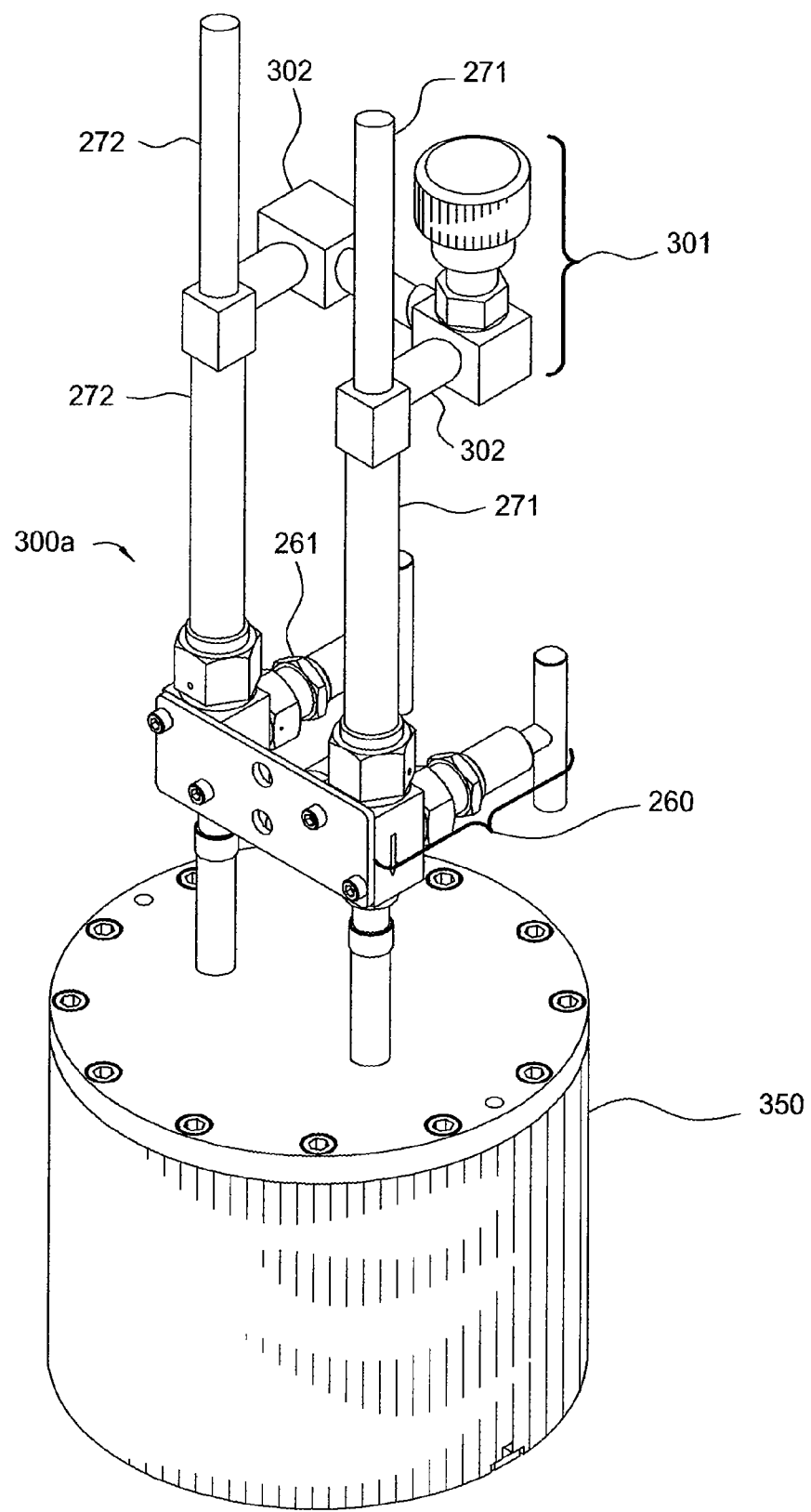
FIG. 4A is another perspective view of the chemical-containing container of FIG. 3A, as described in embodiments herein.

FIG. 3A is a schematic diagram of one aspect of the invention, wherein a precursor ampoule, ampoule assembly 300a, is configured with an inherent bypass line 302 with a remotely controllable valve disposed 301 therein. FIG. 4A is a perspective view of ampoule assembly 300a. Valve 301 may be actuated pneumatically, by an electric motor, or by any other remotely-controllable means. Ampoule assembly 300a, bypass line 302, valve 301 and manual valves 260, 261 are adapted to be a unitary assembly during removal and replacement of ampoule assembly 300a. Ampoule assembly 300a may be fluidly coupled to a gas panel, such as gas panel 204 illustrated in FIG. 2A, via disconnect fittings 262b and 263b.

Figure 2A:
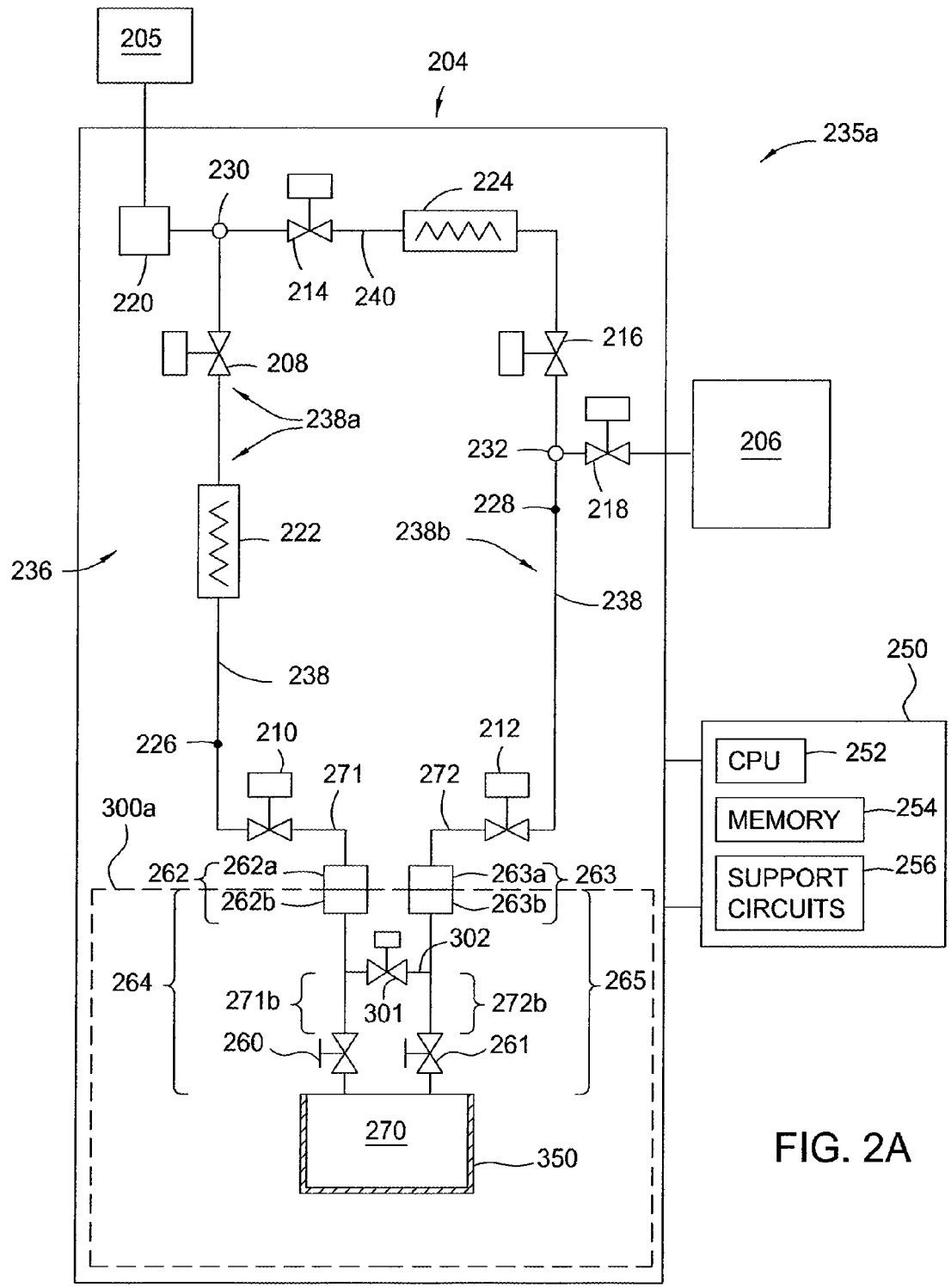
FIGS. 2A-2C are schematic diagrams of a fluid delivery system to which an ampoule assembly has been fluidly coupled, as described in embodiments herein.

FIG. 2A is a schematic diagram of a fluid delivery system 235a to which ampoule assembly 300a has been fluidly coupled.

This aspect allows the effective pump-purge of gas generation line 238 and its constituent parts via the active passage of purge fluid therethrough. Referring to FIG. 2A, during a pump-purge procedure, valves 214, 216 may be closed, forcing all purge fluids through ampoule inlet leg 238a, bypass line 302, and ampoule outlet leg 238b. During pump-purge procedures, the only remaining dead legs in fluid delivery circuit 236 are dead leg conduit segments 271b, 272b, which may be as short as 1-3 cm and, further, are without any elbows or other impediments to fluid flow. Hence dead leg conduit segments 271b, 272b, which in this aspect are short, straight dead legs, can be more effectively purged before and after replacement of ampoule assembly 300a.

Figure 2B:
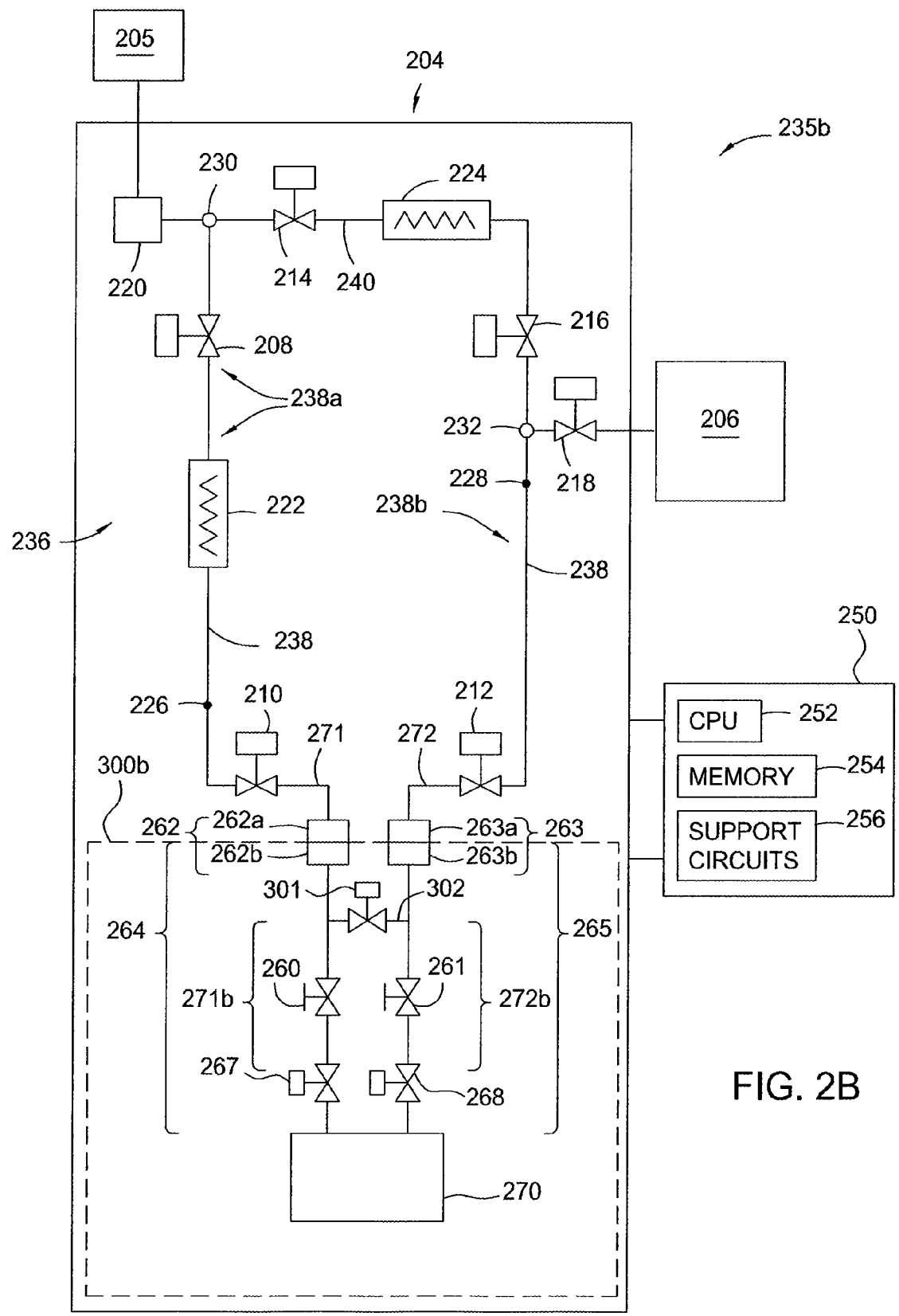
Figure 4B:
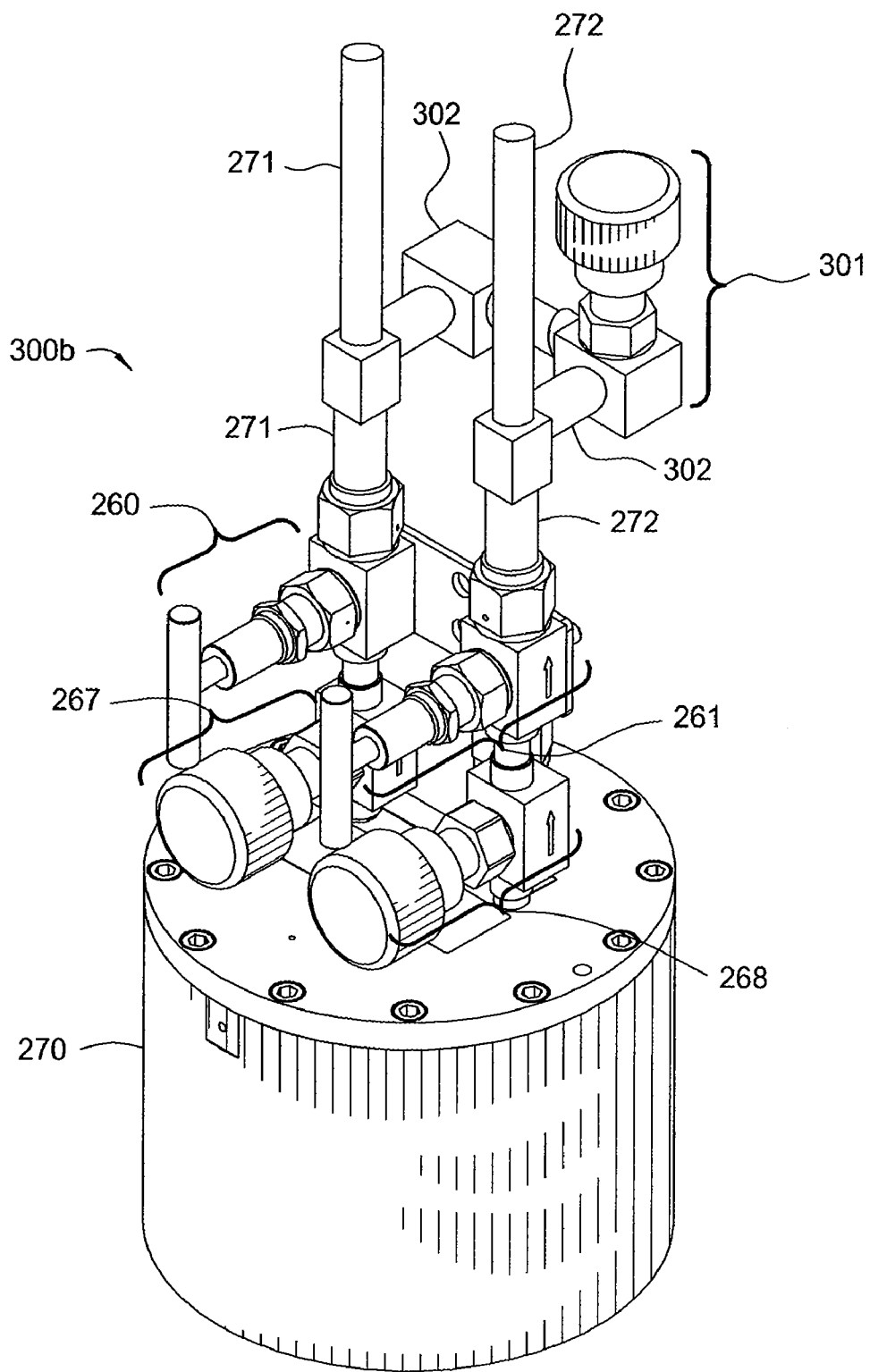
FIG. 4B is another perspective view of the chemical-containing container of FIG. 3B, as described in embodiments herein.

FIG. 3B is a schematic diagram of another aspect of the invention, wherein a precursor ampoule, ampoule assembly 300b, is configured with two additional remotely controllable shut-off valves, valves 267, 268 as well as with bypass line 302 with remotely controllable valve 301 disposed therein. FIG. 4B is a perspective view of ampoule assembly 300b. Valves 267, 268 may be actuated by a number of remotely-controllable means as detailed above for valve 301 in conjunction with FIG. 3A. Ampoule assembly 300b, bypass line 302, manual valves 260, 261, and valves 301, 267, 268 are adapted to be a unitary assembly during removal and replacement of ampoule assembly 300b. Ampoule assembly 300b may be fluidly coupled to gas panel 204, as illustrated in FIG. 2B. FIG. 2B is a schematic diagram of a fluid delivery system 235b to which ampoule assembly 300b has been fluidly coupled. Except for the substitution of ampoule assembly 300b for ampoule assembly 300a, fluid delivery system 235b is substantially identical to fluid delivery system 235a in function and organization as described above in conjunction with FIG. 2A.

This aspect allows the effective pump-purge of gas generation line 238 and its constituent parts via the active passage of purge fluid therethrough as described above in the previous aspect. In addition, maintenance personnel may perform a pump-purge procedure prior to ampoule replacement without entry into gas panel 204. Valve 301 and valves 267, 268 may be closed remotely via controller 250, fluidly coupling ampoule inlet leg 238a and ampoule outlet leg 238b to a vacuum source, such as process chamber 206, and a purge fluid source, such as carrier gas source 205. This is an important safety advantage since entry into gas panel 204 and manipulation of manual valves therein is not required until fluid delivery circuit 236 has been safely pump-purged. Ordinarily, maintenance personnel must enter gas panel 204 to close manual valves 260, 261 prior to initiating pump-purge procedures. Further, ampoule assembly 300b has two points of isolation from ambient contamination for inlet line 264 and outlet line 265, namely manual valve 260, valve 267 and manual valve 261, valve 268, respectively. This redundancy minimizes the risk of leakage into or out of ampoule assembly 300b in the event that manual valves 260, 261 are not leak-tight. There may only be a single point of isolation for the contents of an ampoule during ampoule removal, leak checking, and pump-purging.

Figure 5:
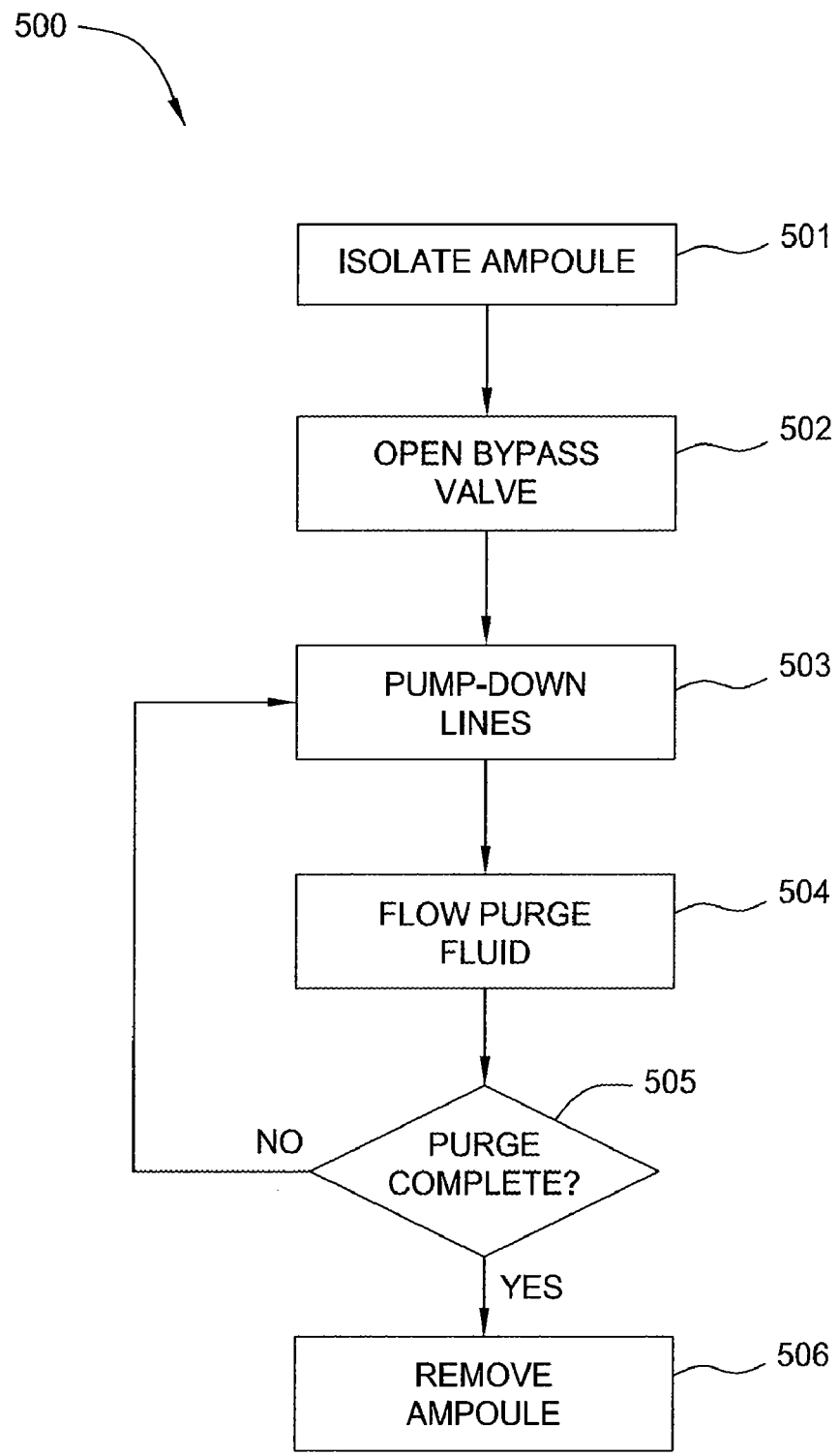
FIG. 5 illustrates a process sequence for pump-purging an ampoule assembly, as described in embodiments herein.

FIG. 5 illustrates a process sequence 500 for pump-purging ampoule assembly 300b. In step 501, valves 267, 268 are closed remotely via controller 250, isolating body 270 from ampoule inlet leg 238a and ampoule outlet leg 238b. In the step 502, bypass valve 301 is opened remotely via controller 250, fluidly coupling ampoule inlet leg 238a, ampoule outlet leg 238b and the majority of inlet line 264 and outlet line 265.

The vacuum source may be the vacuum source associated with process chamber 206. In step 503, fluid delivery circuit 236, bypass line 302, inlet line 264, and outlet line 265 are pumped down to the desired level of vacuum. In step 504, a purge fluid, such as a carrier gas or in some cases a liquid solvent, is then flowed through the evacuated lines. Heater 222 may heat the purge fluid, if desired. When the purge fluid source is configured relative to fluid delivery circuit 236 as illustrated in FIG. 2B, the purge fluid enters ampoule assembly 300b via ampoule inlet leg 238a, flows through bypass line 302, and leaves ampoule assembly 300b via ampoule outlet leg 238b. In addition, the purge fluid back-fills the portions of inlet line 264 and outlet line 265 fluidly coupled to bypass line 302. The duration and flow rate of purge fluid flow through ampoule assembly 300b is dependent on the purge fluid used, conduit size, chemical composition of unwanted residues, and quantity thereof present in the lines. In step 505, completion of pump-purge procedure is checked. If the purging of the desired lines is complete, the process continues to step 506, wherein ampoule assembly 300b is removed from gas panel 204. If further pump-purge steps are desired, the process returns to step 503. The number of pump-purge iterations desired is variable, depending on such factors as the purge fluid used, conduit size, chemical composition of unwanted residues, and quantity thereof that may be present in the lines.

Figure 2C:
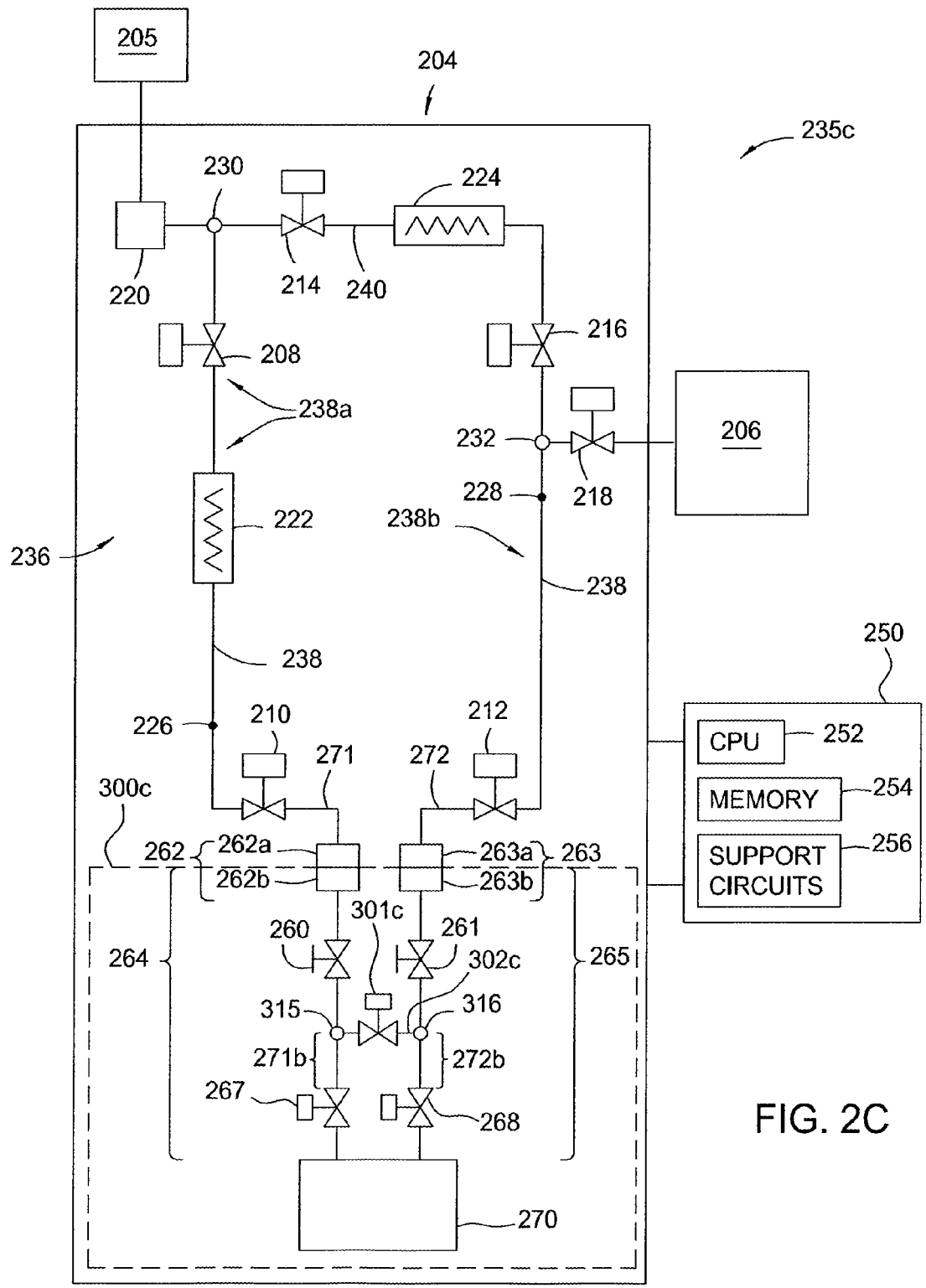

FIG. 3C is a schematic diagram of another aspect of the invention. In this aspect, ampoule assembly 300c is configured with an inherent valve assembly similar to that of ampoule assembly 300b, as illustrated in FIG. 3B. An inherent bypass line 302C that has a remotely controllable valve 301c disposed therein fluidly couples dead leg conduit segments 271b, 272b as in the previous two aspects, but in this aspect, the connection points of bypass line 302C to dead leg conduit segments 271b, 272b are located at junctions 315, 316, respectively. Junction 315 is disposed between manual valve 260 and valve 267 and junction 316 is disposed between manual valve 261 and valve 268. Ampoule assembly 300c may be fluidly coupled to gas panel 204 as illustrated in FIG. 2C. FIG. 2C is a schematic diagram of a fluid delivery system 235c to which ampoule assembly 300c has been fluidly coupled. Except for the substitution of ampoule assembly 300c for ampoule assembly 300a, fluid delivery system 235c is substantially identical to fluid delivery system 235a in function and organization as described above in conjunction with FIG. 2A.

This aspect allows the effective pump-purge of gas generation line 238 and its constituent parts as described above for the previous aspects of the invention. In addition, this aspect provides a means of actively passing a purge fluid through manual valves 260, 261 during a pump-purge procedure. Referring to FIGS. 2C, 3C, valve 301c and valves 267, 268 may be closed remotely via controller 250, allowing valves 267, 268 to be more thoroughly purged prior to removal of ampoule assembly 300c. In addition, the size of dead legs present during the pump-purge procedure are reduced to the dead leg conduit segments 271b, 272b, i.e., the conduit segment located between junction 315 and valve 267 and the conduit segment located between junction 316 and valve 268. Hence, the dead leg conduit segments 271b, 272b for this aspect are substantially reduced in length when compared to dead leg conduit segments 271b, 272b for the previous aspect shown in FIG. 3B.

FIG. 3D is a schematic diagram of another aspect of the invention. In this aspect, ampoule assembly 300d is configured with an inherent valve assembly similar to that of ampoule assembly 300c, as illustrated in FIG. 3C. An inherent bypass line 302d that has a remotely controllable valve 301d disposed therein fluidly couples dead leg conduit segments 271b, 272b as in the previous two aspects, but in this aspect there is a second bypass line 304d configured with a remotely controllable valve 303d disposed therein. Ampoule assembly 300d may be fluidly coupled to gas panel 204 as illustrated for ampoule assemblies 300A-300C in FIGS. 2A-2C.

FIGS. 3E-3F illustrate two other aspects of the invention. Ampoule assemblies 300e, 300f are each configured with an inherent valve assembly similar to that of ampoule assembly 300c, as illustrated above in FIG. 3C. In the aspect illustrated in FIG. 3E, bypass line 302e and remotely controllable valve 301e disposed therein fluidly couple inlet line 264 with outlet line 265. Bypass line 302e is connected to inlet line 264 between manual valve 260 and valve 267 and is connected to outlet line 265 between manual valve 261 and disconnect fitting 263b. In the aspect illustrated in FIG. 3F, bypass line 302f and remotely controllable valve 301f disposed therein fluidly couple inlet line 264 with outlet line 265. Bypass line 302f is connected to inlet line 264 between manual valve 260 and disconnect fitting 262b and is connected to outlet line 265 between manual valve 261 and valve 268.

As noted above, in some aspects of the invention, some or all components of a precursor ampoule are charged with an inert gas, such as helium. The advantages of this are twofold. First, charging the ampoule body with a pressurized atmosphere of an inert gas chemically protects the precursor contained therein, even if some leakage occurs through any of the seals or valves in the ampoule assembly. This is particularly true for a solid precursor-containing ampoule assembly. Second, during a leak-checking procedure, such as that described above in conjunction with FIG. 2A, a helium charge in the inlet line allows for leak-checking after new ampoule installation of not only of leakage into disconnect fittings 262, 263 from outside fluid delivery system 235a (see FIG. 2A), but also of leakage through the outermost shut-off valve located in inlet line 264 and outlet line 265, such as manual valves 260,261. The typical leak rate through shut-off valves, such as manual valves 260, 261, may be much higher than the typical leak rate externally, i.e., through the external seals of the valves, hence, checking for leakage through manual valves 260, 261 is an important procedure. In instances wherein it is undesirable for the ampoule body to be charged with an inert gas, which may be the case for certain liquid precursors, only a segment of the inlet and outlet lines may be charged with the inert gas. For example, referring to FIG. 2B, the segment of inlet line 264 disposed between manual valve 260 and valve 267, and the segment of outlet line 265 disposed between manual valve 261 and valve 268, may be the only regions of ampoule assembly 300a charged with an inert gas.

A more detailed description of internal features of an ampoule similar to ampoule assemblies 300a-300f is further described in commonly assigned U.S. Ser. No. 11/246,890, filed on Oct. 7, 2005, and published as US 2007-0079759, which is hereby incorporated by reference in its entirety to the extent not inconsistent with the claimed invention.

As noted above, the sealing surfaces of shut-off valves that are exposed to highly reactive chemical precursors for extended periods, such as manual valves 260, 261 (shown in FIGS. 2A-2C), may be damaged and fail to seal as desired. This is particularly true when an ampoule assembly contains a solid precursor. Solid precursors dissolved by a heated carrier gas may subsequently precipitate out of the carrier gas if not maintained at the necessary temperature and condense onto shut-off valve sealing surfaces, hindering a vacuum-tight seal and requiring valve replacement. Because valve replacement for ampoule assemblies occurs relatively frequently, ease of serviceability is also an important consideration.

Figure 6A:
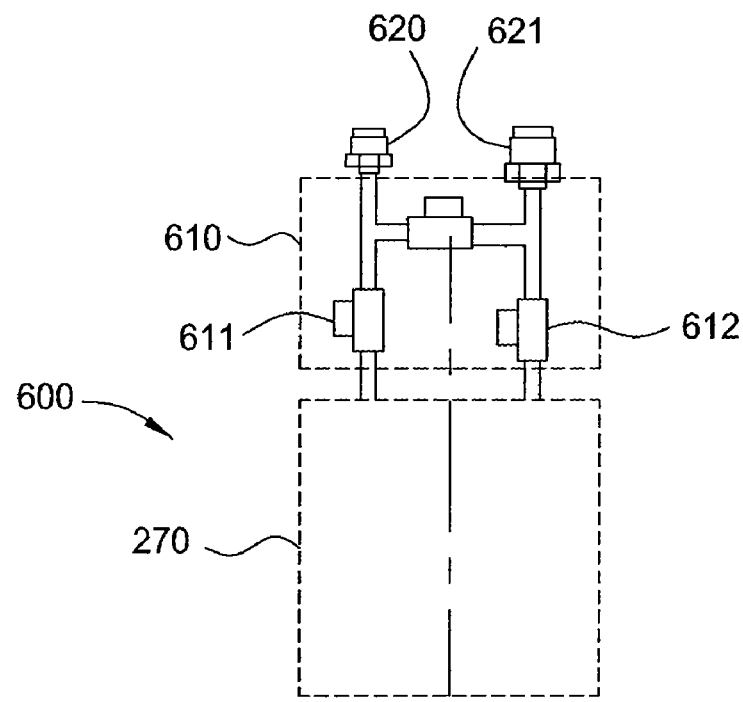
FIGS. 6A-6B schematically illustrate one embodiment of an ampoule assembly with easily serviceable shut-off valves, as described in embodiments herein.
Figure 6B:
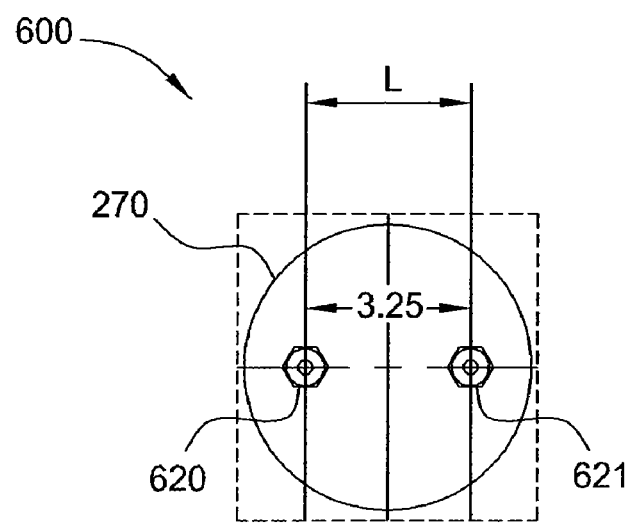

FIGS. 6A-6B schematically illustrate one embodiment of ampoule assembly 600 with easily serviceable shut-off valves. FIG. 6A is a schematic side view and FIG. 6B is a schematic top view. Ampoule assembly 600 includes valve assembly 610, ampoule body 270, inlet connection 620, and outlet connection 621. In one embodiment, inlet connection 620 is preferably a ¼ inch VCR connection and outlet connection 621 is preferably a ½ inch VCR connection for ease of repeated installation and removal of ampoule assembly 600 from a processing system. Valve assembly 610 includes shut-off valves 611 and 612, which are also configured to be easily removed. Shut-off valves 611 and 612 are preferably mounted to valve assembly 610 via VCR fittings (not shown for clarity) and positioned to have a convenient clearance from other components of valve assembly 610 and ampoule assembly 600. In one example, shut-off valves 611 and 612 are positioned 3.25 inches apart to allow adequate access for removal from and installation in valve assembly 610.

Additional Ampoules Containing Thermally Conductive Coatings

Embodiments of the invention provide an apparatus and a process for generating a chemical precursor used in a vapor deposition processing system. The apparatus includes a canister (e.g., ampoule or vessel) having a sidewall, a top, and a bottom encompassing an interior volume therein, inlet and outlet ports in fluid communication with the interior volume, and a thermally conductive coating disposed over the outside surface of the canister. The thermally conductive coating is more thermally conductive than the outside surface of the canister, which may be steel or stainless steel. The thermally conductive coating may contain aluminum, aluminum nitride, copper, brass, silver, titanium, silicon nitride, or alloys thereof. In some embodiments, an adhesion layer (e.g., titanium or tantalum) may be disposed between the outside surface of the canister and the thermally conductive coating. In other embodiments, the canister may contain a plurality of baffles or solid heat-transfer particles to help evenly heat a solid precursor therein.

Figure 7C:
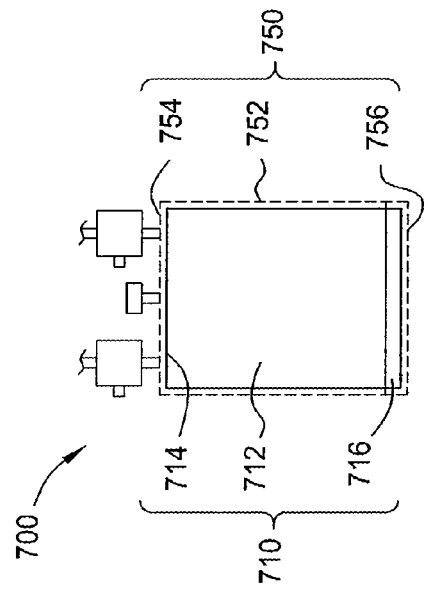
FIGS. 7A-7D illustrate cross sectional schematic views of other precursor ampoules as described by embodiments herein.
Figure 7D:
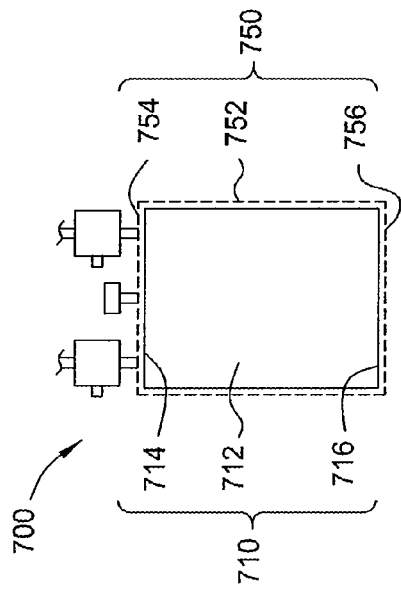
Figure 7A:
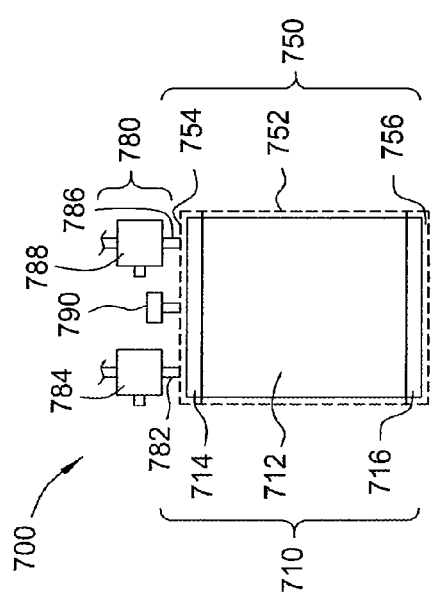
Figure 7B:
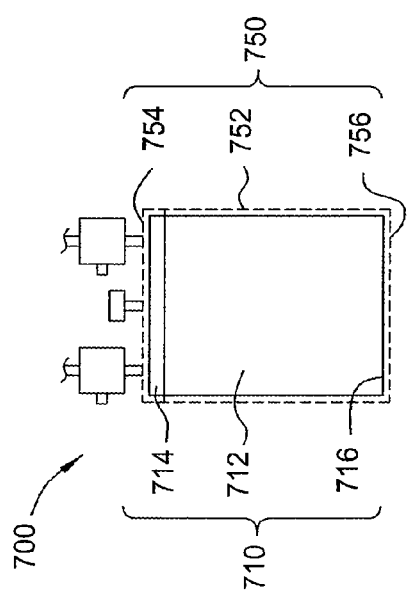

In another embodiment, ampoule assembly 700 includes ampoule 710 containing thermally conductive coating 750 thereon, as depicted in FIGS. 7A-7D. Ampoule 710 contains ampoule body 712, ampoule top 714, and ampoule bottom 716 that may have a variety of configurations. For example, ampoule 710 may contain ampoule body 712 with ampoule top 714 and ampoule bottom 716 that are both removable (FIG. 7A), ampoule body 712 and ampoule bottom 716 as a single piece and ampoule top 714 that is removable (FIG. 7B), ampoule body 712 and ampoule top 714 as a single piece and ampoule bottom 176 that is removable (FIG. 7C), or ampoule body 712, ampoule top 714, and ampoule bottom 716 as a single piece (FIG. 7D).

Each of ampoule body 712, ampoule top 714, and ampoule bottom 716 is independently made from a metal, such as steel, stainless steel, nickel, chromium, aluminum, or alloys thereof. Usually, for reasons of chemical compatibility and mechanical strength, each of ampoule body 712, ampoule top 714, and ampoule bottom 716 is independently made from stainless steel, such as 316 stainless steel (316 SST). Ampoule 710 may be formed from materials which are fairly chemical inert since different types of chemical precursors, such as highly reactive materials, may be stored within ampoule 710. Substantial mechanical strength is a desirable characteristic for ampoule 710 of ampoule assembly 700. In some embodiments, ampoule 710 may be operated at below atmospheric pressure during processes and may be pressurized above atmospheric pressure for transport and storage. Hence, ampoule 710 must act as a reliable containment vessel for a toxic chemical precursor while utilized as a vacuum chamber or as a pressure vessel.

Undesirable thermal gradients may develop inside ampoule 710 during use since 316 SST is a poor medium for thermal conductivity. For example, when a solid precursor is contained inside ampoule 710, poor thermal conductivity of ampoule 710 may result in uneven heating (e.g., hot spots) within the solid precursor. Therefore, a CVD process or an ALD process may be detrimentally affected by such temperature non-uniformities.

In one embodiment, the temperature uniformity of a chemical precursor contained in ampoule assembly 700 may be improved thermally conductive coating 750 containing a thermally conductive material disposed on or over ampoule 710 to improve heat conduction throughout ampoule 710, as depicted in FIGS. 7A-7D. Thermally conductive coating 750 may be a simple coating or may be an interlayer sandwiched between an inner layer and an outer layer of a stronger but less thermally conductive material, such as 316 SST.

Ampoule 710 contains thermally conductive coating 750 on or over each of ampoule body 712, ampoule top 714, and ampoule bottom 716. Thermally conductive coating 750 may contain body coating 752 on or over ampoule body 712, top coating 754 on or over ampoule top 714, and bottom coating 756 on or over ampoule bottom 716. Each of body coating 752, top coating 754, and bottom coating 756 may be different materials or the same materials. Preferably, each body coating 752, top coating 754, and bottom coating 756 contains a thermally conductive material. Also, each body coating 752, top coating 754, and bottom coating 756 may be deposited directly on the surface of ampoule body 712, ampoule top 714, and ampoule bottom 716, respectively, or alternately, over an adhesion layer initially deposited on ampoule body 712, ampoule top 714, and ampoule bottom 716.

An adhesion layer may contain a single layer or multiple layers and may be deposited or formed on ampoule body 712, ampoule top 714, or ampoule bottom 716 by various deposition processes, such as an e-beam process, a PVD process, an ECP process, a CVD process, an ALD process, an ECP process, or an electroless deposition process. The adhesion layer may contain titanium, tantalum, tungsten, ruthenium, cobalt, alloys thereof, or combinations thereof. The thickness of an adhesion layer may be within a range from about 1 μm to about 250 μm. In one example, adhesion layer contains titanium or tantalum and is deposited by an e-beam process, a PVD process, or an ECP process to the stainless steel surfaces of ampoule body 712, ampoule top 714, and ampoule bottom 716.

Thermally conductive coating 750 on or over ampoule 710 of ampoule assembly 700 is illustrated in FIGS. 7A-7D. Examples of possible materials for thermally conductive coating 750 include aluminum, aluminum nitride, copper, brass, silver, titanium, silicon nitride, alloys thereof, combinations thereof, or other thermally conductive materials that are substantially more heat conducting than the material contained within ampoule body 712, ampoule top 714, and ampoule bottom 716, such as stainless steel. The thickness of thermally conductive coating 750 may be within a range from about 2 μm to about 3 mm.

Thermally conductive coating 750 may contain a single layer or multiple layers and may be deposited or formed on or over ampoule 710 or an adhesion layer thereon by various deposition processes, such as e-beam, PVD, CVD, ALD, ECP, or an electroless deposition process. In one embodiment, thermally conductive coating 750 may contain multiple layers as depicted in FIGS. 3G-3I. In one example, thermally conductive coating 750 contains aluminum or an aluminum alloy and is deposited by an e-beam process, a PVD process, or an ECP process to the stainless steel surface of ampoule 710 or an adhesion layer. In another example, thermally conductive coating 750 contains copper or a copper alloy and is deposited by an e-beam process, a PVD process, or an ECP process to the stainless steel surface of ampoule 700 or an adhesion layer thereon.

Ampoule assembly 700 may also contain valve assemble 780 coupled to and in fluid communication with ampoule top 714. In one embodiment, valve assemble 780 may contain inlet line 782, inlet valve 784, outlet line 786, and outlet valve 788. Inlet 790 may be used to fill ampoule 710 with a chemical precursor. In one example, inlet 790 may be a VCR connection, such as a ¼ inch VCR connector or a ½ inch VCR connector.

Figure 8F:
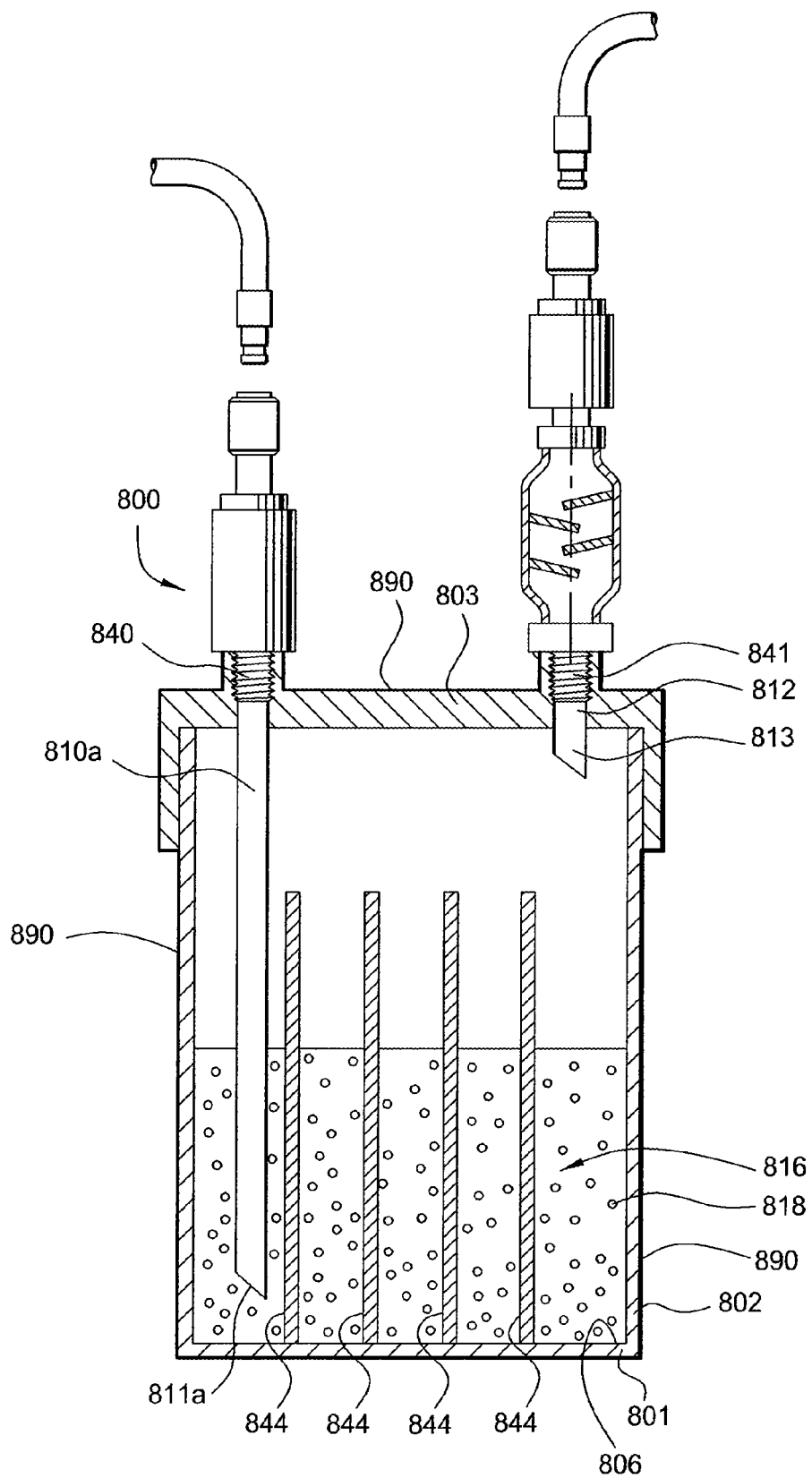
FIGS. 8F-8G illustrate cross sectional schematic views of other precursor ampoules as described by embodiments herein.
Figure 8G:
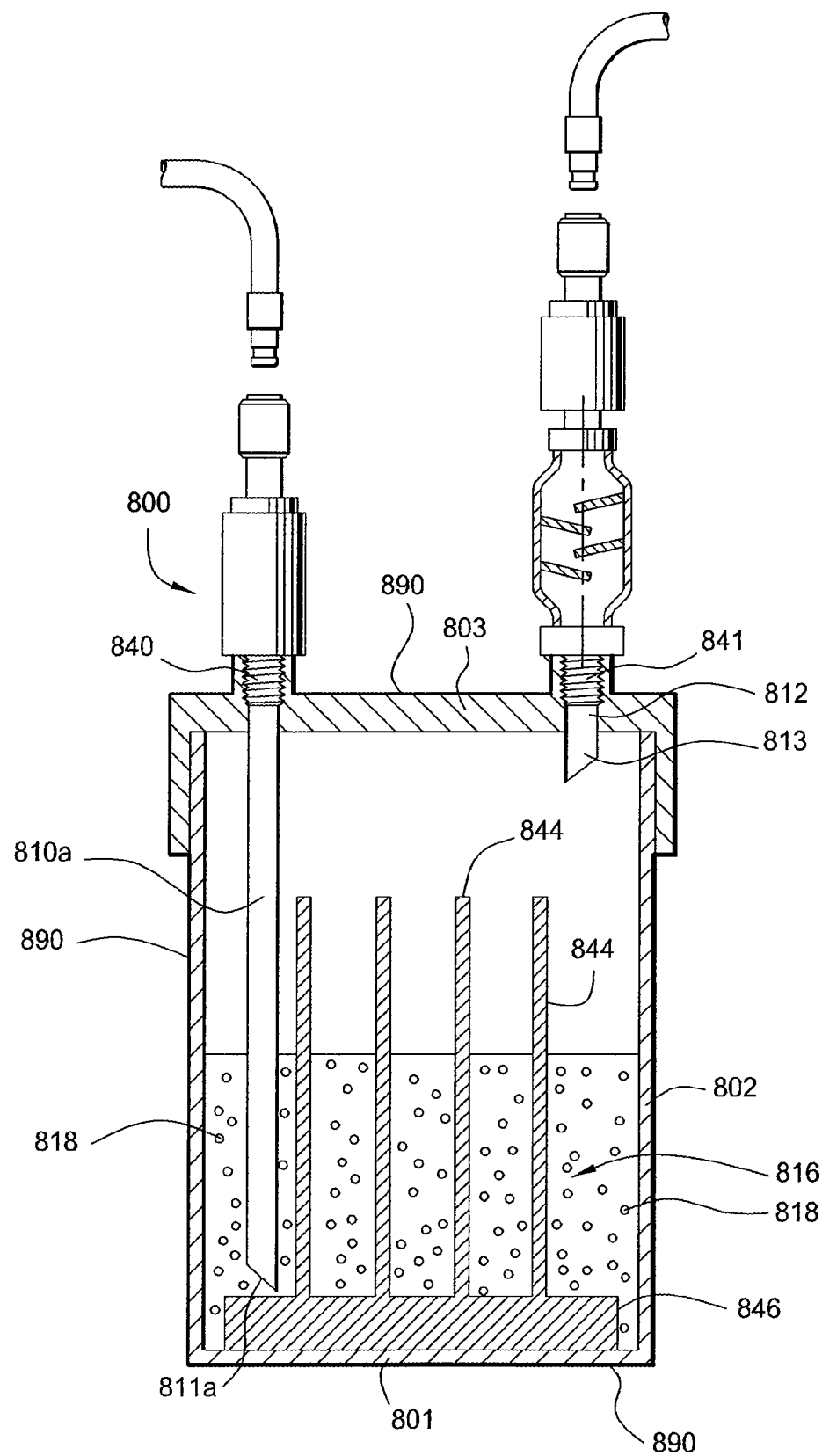

In an alternative embodiment, FIGS. 8A and 8F-8G depict cross sectional schematic views of ampoule assembly 800 containing body 802 having bottom 801 and lid 803 along with a variety of optional features and configurations. Body 802 contains inner wall surface 805 and inner bottom surface 806, while lid 803 contains inner lid surface 804. Seal 830 is disposed between lid 803 and body 802 to form a gas-tight seal for maintaining chemical precursor 816 within ampoule assembly 800 and for maintaining air from entering ampoule assembly 800. Seal 830 may cover a portion or all of inner lid surface 804. For example, seal 830 may cover a substantial portion of inner lid surface 804 and contains holes for accepting fasteners.

Thermally conductive coating 890 is disposed on or over outside surfaces of ampoule assembly 800, as depicted in FIGS. 8A and 8F-8G. The outside surfaces of ampoule assembly 800 include the ampoule body, the ampoule top, and the ampoule bottom, such as body 802, bottom 801, and lid 803. Thermally conductive coating 890 may be deposited directly on the surface of ampoule assembly 800, or alternately, over an adhesion layer initially deposited on ampoule assembly 800.

An adhesion layer may contain a single layer or multiple layers and may be deposited or formed on or over ampoule assembly 800 by various deposition processes, such as an e-beam process, a PVD process, an ECP process, a CVD process, an ALD process, an ECP process, or an electroless deposition process. The adhesion layer may contain titanium, tantalum, tungsten, ruthenium, cobalt, alloys thereof, or combinations thereof. The thickness of an adhesion layer may be within a range from about 1 μm to about 250 μm. In one example, adhesion layer contains titanium or tantalum and is deposited by an e-beam process, a PVD process, or an ECP process to the stainless steel surfaces of ampoule assembly 800. Examples of possible materials for thermally conductive coating 890 include aluminum, aluminum nitride, copper, brass, silver, titanium, silicon nitride, alloys thereof, combinations thereof, or other thermally conductive materials that are substantially more heat conducting than the material contained within ampoule assembly 800, such as stainless steel. The thickness of thermally conductive coating 890 may be within a range from about 2 μm to about 3 mm.

Thermally conductive coating 890 may contain a single layer or multiple layers and may be deposited or formed on or over ampoule assembly 800 or an adhesion layer thereon by various deposition processes, such as e-beam, PVD, CVD, ALD, ECP, or an electroless deposition process. In one embodiment, thermally conductive coating 890 may contain multiple layers as depicted in FIGS. 3G-3I. In one example, thermally conductive coating 890 contains aluminum or an aluminum alloy and is deposited by an e-beam process, a PVD process, or an ECP process to the stainless steel surface of ampoule assembly 800 or an adhesion layer. In another example, thermally conductive coating 890 contains copper or a copper alloy and is deposited by an e-beam process, a PVD process, or an ECP process to the stainless steel surface of ampoule assembly 800 or an adhesion layer thereon.

Inlet assembly 821 contains inlet tube 810a attached to lid 803, such as threaded into inlet port 840. Inlet assembly 821 also contains outlet tube 812 attached to lid 803, such as threaded into outlet port 841. Inlet tube 810a contains outlet end 811a with a tapered angle $\alpha_1$ relative to the horizontal plane of inner bottom surface 806. Outlet end 811a may be angled in the opposite direction of outlet tube 812 to minimize the amount of chemical precursor 816 splashed towards outlet tube 812. Outlet tube 812 contains inlet end 813 with a tapered angle $\alpha_2$ relative to the horizontal plane of inner bottom surface 806.

In one embodiment, the angles $\alpha_1$ and $\alpha_2$ may independently be within a range from about 0° to about 70°, preferably, from about 30° to about 60°, and more preferably, from about 40° to about 50°, such as about 45°. In one example, outlet end 811a has an angle $\alpha_1$ of about 45° and is positioned away from inlet end 813, and inlet end 813 has an angle $\alpha_2$ of about 45° and is positioned towards outlet end 811a, as depicted in FIGS. 8A and 8F. In another example, outlet end 811a has an angle $\alpha_1$ of about 45° and is positioned away from inlet end 813, and inlet end 813 has an angle $\alpha_2$ of about 45° and is positioned away from outlet end 811a, as depicted in FIG. 8G.

Ampoule assembly 800 further contains splash guard 820 attached to inner lid surface 804. Fasteners 822, such as bolts, screws, rivets and the like, may protrude through seal 830 and into inner lid surface 804. Alternatively, splash guard 820 may be positioned onto inner lid surface by other techniques, such as with an adhesion or a welding. Also, splash guard 820 may be attached to inner wall surface 805 or inner bottom surface 806. Splash guard 820 may be positioned at angle $\alpha_3$ relative from the inner bottom surface 806. In one embodiment, splash guard 820 may be positioned at angle $\alpha_3$, which is equal to angle $\alpha_2$ of inlet end 813. The angle $\alpha_3$ may be within a range from about 0° to about 90°, preferably, from about 30° to about 60°, and more preferably, from about 40° to about 50°, such as about 45°.

FIGS. 8B-8E illustrate an assortment of stem tips for inlet stems. In one aspect, FIG. 8B depicts inlet tube 810b with outlet end 811b having a "J"-shape to direct the flow of carrier gas exiting outlet end 811b towards inner lid surface 804 within ampoule assembly 800. Outlet end 811b may be positioned at an angle, relative from the axis of inlet tube 810b, within a range from about 135° to about 180°, preferably, from about 160° to about 180°, and more preferably, from about 170° to about 180°. In another aspect, FIG. 8C depicts inlet tube 810c with outlet end 811c having cap 815 obstructing the end of inlet tube 810c and at least one opening 817. Outlet end 811c may direct the flow of a carrier gas throughout ampoule assembly 800. Usually carrier gas exiting opening 817 is typically directed perpendicular relative from the axis of inlet tube 810c. Therefore, the flow of a carrier gas is directed towards inner wall surface 805 to prevent direct (linear) gas flow through ampoule assembly 800 and minimize bumps or splashes of chemical precursor 816. In another aspect, FIG. 8D depicts inlet tube 810d with outlet end 811d having a bent-shape stem to direct the flow of carrier gas towards inner wall surface 805. Outlet end 811d also prevents direct gas flow through ampoule assembly 800 to minimize bumps or splashes of chemical precursor 816. Generally, outlet end 811d may be positioned at an angle, relative from the axis of inlet tube 810d, within a range from about 5° to about 175°, preferably, from about 45° to about 135°, and more preferably, from about 60° to about 120°, for example, about 90°. In another aspect, FIG. 8E depicts inlet tube 810e with outlet end 811e straight or substantially straight relative from inlet tube 810e. Outlet end 811e may direct flow of the carrier gas towards inner bottom surface 806. Inlet tube 810e may be positioned at an angle, relative from the axis of inlet tube 810e, within a range from about 0° to about 20°, preferably, from about 0° to about 10°, and more preferably, from about 0° to about 5°.

Outlet assembly 823 contains outlet tube 812 threaded into lid 803 and coupled to valve 860b. Outlet tube 812 contains inlet end 813 with a tapered angle $\alpha_1$ relative to the horizontal plane of inner lid surface 804. Angle $\alpha_1$ may be positioned in the opposite direction of outlet end 811a to minimize the amount of chemical precursor 816 splashed into outlet tube 812. In an alternative embodiment, outlet tube 812 may substitute inlet end 813 with any of tube outlet ends 811b-811e.

In one embodiment of ampoule assembly 800, outlet assembly 823 contains trap 850 connected to outlet tube 812 by gas outlet 808. Chemical precursor 816 that is agitated (e.g., bumped or splashed) may form precursor droplets that are entrained within the carrier gas, bypass splash guard 820 and carried into outlet tube 812 towards the process chamber. Trap 850 is optionally coupled to gas outlet 808 for preventing such precursor droplets of chemical precursor 816 from reaching the process chamber. Trap 850 includes trap body 852 containing and a plurality of interleaved baffles 854 which extend past centerline 856 of trap body 852 and are angled at least slightly downward towards ampoule assembly 800. Baffles 854 force the gas flowing towards the process chamber to flow a tortuous path around baffles 854. The surface area of baffles 854 provides an exposed area to adhere precursor droplets that may be entrained within the flowing process gas. The downward angle of baffles 854 allows any precursor droplets accumulated within trap 850 to flow downward and back into ampoule assembly 800.

Ampoule assembly 800 contains valve 860a for controlling the gas flow through inlet port 840 and inlet tube 810a and valve 860b for controlling the gas flow through outlet port 841 and outlet tube 812. Valves 860a and 860b may be pneumatic valves or manual valves. Valve 860a may be directly connected to inlet tube 810a or merely in fluid communication with inlet tube 810a, such as coupled through lid 803, trap 850, another valve, a conduit, or the like (not shown). Similarly, valve 860b may be directly connected to trap 850 and in fluid communication with outlet tube 812, such as coupled through a conduit, lid, another valve or the like (not shown). Generally, valve 860a may be anywhere between a carrier gas source and ampoule assembly 800 while valve 860b may be anywhere between ampoule assembly 800 and a process chamber.

Mating disconnect fittings containing female fittings 862a, 862b and male fittings 864a, 864b may be coupled to valves 860a, 860b to facilitate removal and replacement of ampoule assembly 800 to and from a gas delivery system, such as gas delivery system 104 depicted in FIG. 1. Valves 860a, 860b are typically ball valves or other positive sealing valves that allows ampoule assembly 800 to be removed from the gas delivery system efficiently loaded and recycled while minimizing potential leakage from ampoule assembly 800 during filling, transport or coupling to the gas delivery system. Alternatively, ampoule assembly 800 may be refilled through a refill port, similar to refill port 218 depicted in FIG. 3A.

In another embodiment of ampoule assembly 800, at least one silo or baffle may be disposed between inlet tube 810a and outlet tube 812. Baffles 842c and 842d may extend from body 802, such as bottom surface 806, into the interior of ampoule assembly 800, as depicted in FIG. 8A. Baffles 842a and 842b may extend from lid 803, such as lid surface 804, into the interior of ampoule. Baffles 842a-842d create an extended mean flow path, thereby preventing direct (e.g., straight line) flow of the carrier gas from inlet tube 810a and outlet tube 812. An extended mean flow path increases the mean dwell time of the carrier gas in ampoule assembly 800 and increases the quantity of vaporized precursor gas carried by the carrier gas. Additionally, baffles 842a-842d direct the carrier gas over the entire exposed surface of chemical precursor 816 disposed in ampoule assembly 800, ensuring repeatable gas generation characteristics and efficient consumption of chemical precursor 816. In one embodiment, baffles 844 may be attached to, coupled with, or formed of bottom surface 806, as depicted in FIG. 8F. In another embodiment, baffles 844 may be attached to, coupled with, or formed of baffle insert 846 which is disposed on bottom surface 806, as depicted in FIG. 8G.

The number, spacing, and shape of baffles 842a-842d may be selected to tune ampoule assembly 800 for optimum generation of precursor gas. For example, a greater number of baffles 842a-842d may be selected to impart higher carrier gas velocities at chemical precursor 816 or the shape of baffles 842a-842d may be configured to control the consumption of chemical precursor 816 for more efficient usage of the precursor material. In one example, baffles 842a-842d disposed in ampoule assembly 800 contain four rectangular plates fabricated of stainless steel. Baffles 842a-842d may be welded or otherwise fastened to bottom surface 806, lid 803 and/or inner wall surface 805, parallel or substantially parallel to each other. Baffles 842a-842d are interleaved, fastened to opposing sides of the canister in an alternating fashion to form a serpentine extended mean flow path, as illustrated in FIG. 8A.

In another embodiment, ampoule assembly 800 and chemical precursor 816 therein may each be regulated at a predetermined temperature. FIG. 8A illustrates a sectional view of ampoule assembly 800 surrounded by a heating media 870, which is configured to create a controllable temperature gradient between a lower region and an upper region of ampoule assembly 800. In one example, heating media 870 is a canister heater containing heating element 872 disposed therein. In another example, heating media 870 is an insulating jacket heater containing heating element 872 disposed therein. Heating element 872 may be configured to generate more heat near a particular region of ampoule assembly 800, such as a lower region or an upper region. Controller 874 may be used to regulate the temperature of ampoule assembly 800 by adjusting power levels to heating element 872. Alternatively, a cooling apparatus (not shown) may be used to regulate the temperature of ampoule assembly 800 and chemical precursor 816.

In another embodiment, ampoule assembly 800 may contain particulates 818 in contact with chemical precursor 816 and aids in transferring heat throughout chemical precursor 816. The material of the particulates 818 is preferably one with high thermal conductivity and high heat capacity. Particulates 818 may be formed or fabricated from and contain a metal, such as stainless steel, aluminum, nickel, chromium, titanium, zirconium, tungsten, tantalum, alloys thereof, or combinations thereof. Particulates 818 may have any wide variety of shapes to provide varying surface areas useful for temperature regulation. For examples, particulates 818 may be spherical, cylindrical, conical, ellipsoidal, regular or irregular polyhedrons, other geometries, derivatives thereof or combinations thereof. Particulates 818 may have smooth, roughened or patterned surfaces or textures. Particulates 818 that include a roughened surface have a greater surface area available to assist temperature regulation of chemical precursor 816. Particulates 818 may have the same or different shapes and sizes, where the geometry of particulates 818 is generally selected depending upon a number of parameters, such as, density, porosity and composition of particulates 818, as well as, the internal volume and shape of ampoule assembly 800, type of chemical precursor 816 and the desired amount of process gas generation during a deposition process. In one example, a slurry or a mixture containing PDMAT and particulates 818 of stainless steel is contained within ampoule assembly 800.

Therefore, ampoule assembly 800 provides many optional features that may be configured and utilized in tandem with any of the embodiments described herein. A more detailed description of internal features of an ampoule similar to ampoule assembly 800 is further described in commonly assigned U.S. Ser. No. 11/246,890, filed on Oct. 7, 2005, and published as US 2007-0079759, which is hereby incorporated by reference in its entirety to the extent not inconsistent with the claimed invention. Further disclosure relating to optional ampoule accessories, such as step tips (inlet and outlet), disconnect fittings (male and female), traps, baffles, heater, temperature regulators, or precursor particulates, is described in commonly assigned U.S. Pat. Nos. 6,905,541, 6,915,592, and 7,186,385, commonly assigned U.S. Ser. No. 10/281,079, filed Oct. 25, 2002, and published as US 2003-0121608, which are each incorporated herein by reference to describe optional ampoule accessories and configurations that may be used in some embodiments herein.

Heated Valve Manifold

FIGS. 9A-9M depict valve manifold assembly 900 as described in embodiments herein. Valve manifold assembly 900 may be mounted or connected to an ampoule, a bubbler, a canister, or similar reservoir used to store, collect, dispense, or evaporate a chemical compound. Valve manifold body 902 is the nucleus of valve manifold assembly 900 and usually contains and is made from a metal, such as steel, stainless steel, iron, nickel, chromium, aluminum, derivatives thereof, or alloys thereof. Usually, due to chemical compatibility and mechanical strength, valve manifold body 902 is made from stainless steel, such as 316 stainless steel (316 SST). In one embodiment, valve manifold body 902 and other parts of valve manifold 900 are resistant or substantially resistant to chlorine, fluorine, compounds thereof, or derivatives thereof.

As depicted in FIGS. 9A-9M, valve manifold body 902 contains front 912, back 914, side 916, side 917, top 918, and bottom 919. Upper inlet 904 is positioned on side 916, upper outlet 906 is positioned on top 918, and both lower outlet 908 and lower inlet 910 are positioned on bottom 919. However, other configurations for the placement of inlets and outlets have also been successfully implemented in alternative embodiments. For example, in a configuration not shown, upper inlet 904 and upper outlet 906 may both be positioned on top 918, while lower outlet 908 and lower inlet 910 may both be positioned on bottom 919.

Figure 9A:
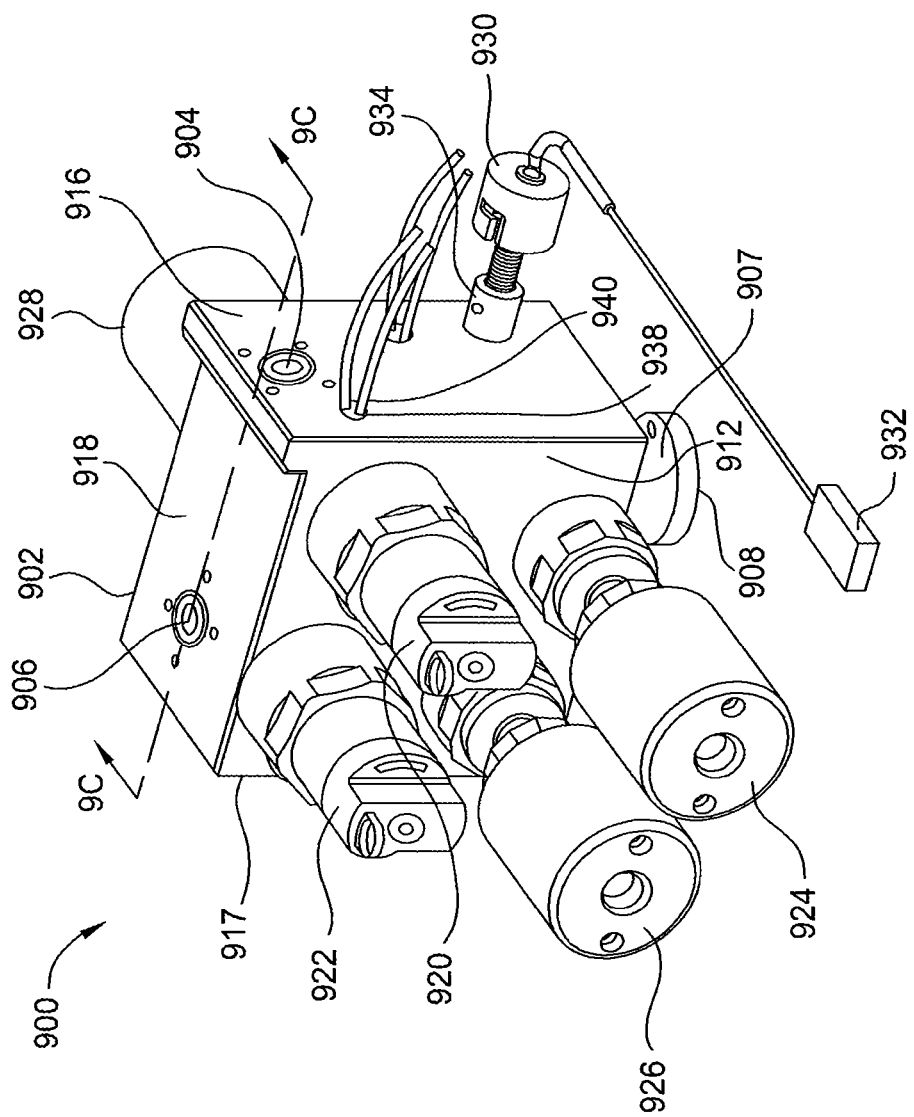
Figure 9B:
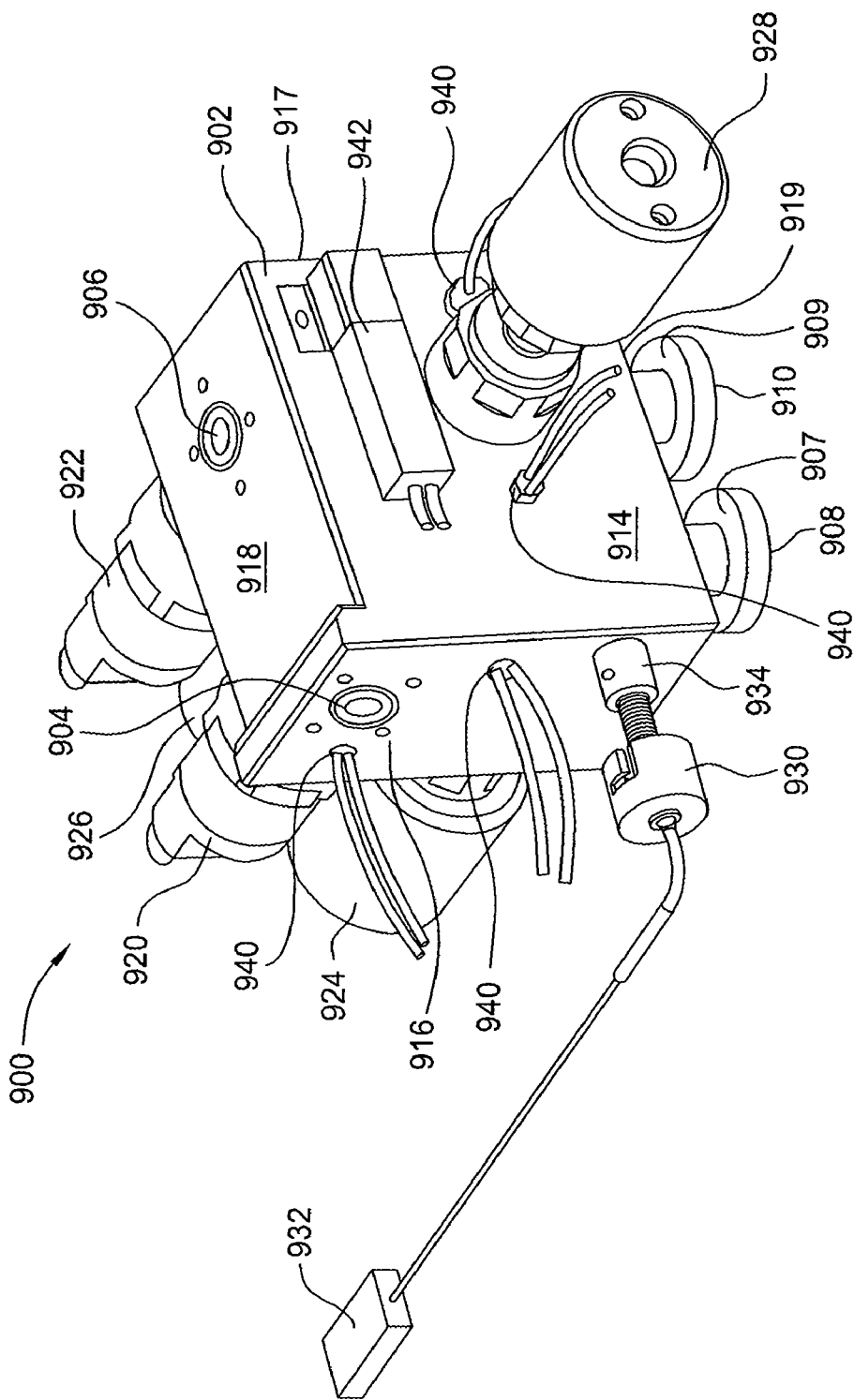
Figure 9C:
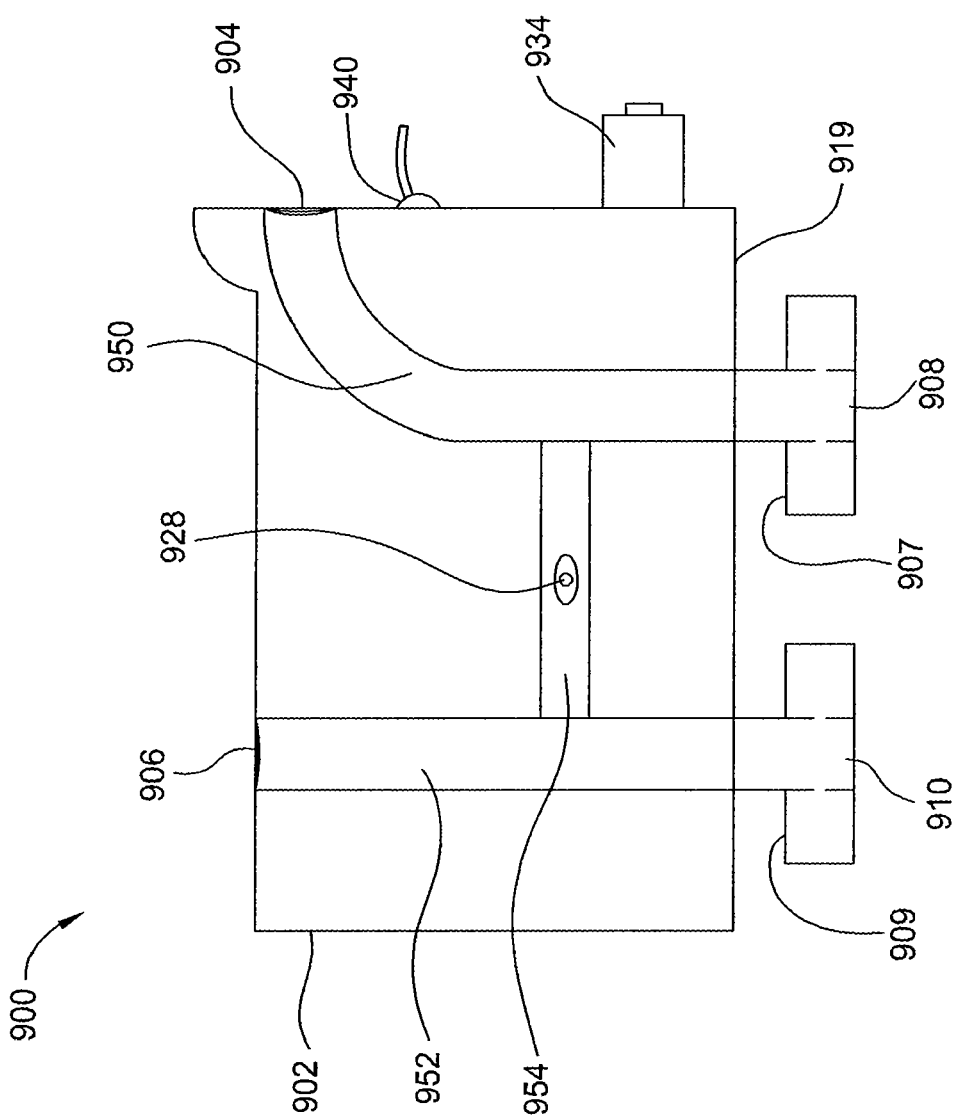

In one embodiment, FIG. 9C depicts a cross sectional view of FIG. 9A in which the different channels or passageways are illustrated within valve manifold body 902. Inlet channel 950 extends from upper inlet 904 to lower outlet 908, while outlet channel 952 extends from lower inlet 910 to upper outlet 906. Along the passageway of inlet channel 950, manual valve 920 and pneumatic valve 924 are attached or coupled to valve manifold body 902 and positioned to control fluid flow within inlet channel 950, as depicted in FIGS. 9A-9M. Also, manual valve 922 and pneumatic valve 926 are attached or coupled to valve manifold body 902 along the passageway of outlet channel 952 and positioned to control fluid flow within outlet channel 952. As used herein, channels, passageways, conduits, lines, tubes, pipes may be used to describe inlet channel 950, outlet channel 952, and bypass channel 954, in part or in whole. In one embodiment, inlet channel 950 and outlet channel 952 may extend through a conduit, pipe, or tubing connected to valve manifold body 902. For example, inlet channel 950 may extend through conduit 907 forming lower outlet 908 and outlet channel 952 may extend through conduit 909 forming lower inlet 910. In some embodiments, the fluid flow paths and passageways of valve manifold assembly are very similar, or even identical, to the fluid flow path for ampoule assembly 300c, depicted in FIG. 3C.

Bypass channel 954 extends therebetween and connects inlet channel 950 and outlet channel 952 to be in fluid communication. Bypass valve 928 is attached or coupled to valve manifold body 902 along the passageway of bypass channel 954 and positioned to control fluid flow within bypass channel 954. Bypass valve 928, in an opened position, provides fluid communication between inlet channel 950 and outlet channel 952 through bypass channel 954. Alternatively, bypass valve 928, in a closed position, ceases the fluid communication between inlet channel 950 and outlet channel 952 through bypass channel 954. Bypass valve 928 may be a manual valve, but preferably is a pneumatic valve. Manual and pneumatic valves useful in embodiments described herein are available from Swagelok Co. Manual and pneumatic valves may attach to valve manifold body or other bodies by a variety of ways, including by having a main shaft which screws or bolts into valve manifold body or by having a base with is attached (e.g., screwed, bolted, or riveted) onto valve manifold body. In one embodiment, pneumatic valves may be ALD or CVD valves enabled with an open/close cycle lasting a time period within a range from about 0.1 seconds to about 2 seconds. In one example, pneumatic valves may be ALD valves enabled with an open/close cycle lasting about 0.1 seconds.

In another embodiment, FIGS. 9E-9I depict various views of the channels or passageways within valve manifold assembly 900 and valve manifold body 902. Inlet channel 950 extends from upper inlet 904 to lower outlet 908, while outlet channel 952 extends from lower inlet 910 to upper outlet 906. Along the passageway of inlet channel 950, manual valve 920 and pneumatic valve 924 are attached or coupled to valve manifold body 902 and positioned to control fluid flow within inlet channel 950, as depicted in FIGS. 9A-9C. Also, manual valve 922 and pneumatic valve 926 are attached or coupled to valve manifold body 902 along the passageway of outlet channel 952 and positioned to control fluid flow within outlet channel 952. As used herein, channels, passageways, conduits, lines, tubes, pipes may be used to describe inlet channel 950, outlet channel 952, and bypass channel 954, in part or in whole. In one embodiment, inlet channel 950 and outlet channel 952 may extend through a conduit, pipe, or tubing connected to valve manifold body 902. For example, inlet channel 950 may extend through conduit 907 forming lower outlet 908 and outlet channel 952 may extend through conduit 909 forming lower inlet 910. In some embodiments, the fluid flow paths and passageways of valve manifold assembly are very similar, or even identical, to the fluid flow path for ampoule assembly 300c, depicted in FIG. 3C.

Bypass channel 954 extends between and includes portions of inlet channel 950 and outlet channel 952. Bypass valve 928 is attached or coupled to valve manifold body 902 along the passageway of bypass channel 954 and positioned to control fluid flow within bypass channel 954. Bypass valve 928, in an opened position, provides fluid communication between inlet channel 950 and outlet channel 952 through bypass channel 954. Alternatively, bypass valve 928, in a closed position, ceases the fluid communication between inlet channel 950 and outlet channel 952 through bypass channel 954. Bypass valve 928 may be a manual valve, but preferably is a pneumatic valve. Manual and pneumatic valves useful in embodiments described herein are available from Swagelok Co. Manual and pneumatic valves may attach to valve manifold body or other bodies by a variety of ways, including by having a main shaft which screws or bolts into valve manifold body or by having a base with is attached (e.g., screwed, bolted, or riveted) onto valve manifold body.

Valve manifold body 902 contains at least one, preferably, a plurality of heater cartridges 940, such as 2, 3, 4, 5, 6, or more heater cartridges 940 that may be used to heat valve manifold body 902 to a predetermined temperature. Heater cartridge 940 may be a resistive heating element contained within an isolatable cartridge and/or embedded within valve manifold body 902. Heater cartridges 940 quickly and evenly heat valve manifold body 902 due to the high thermal conductivity of the metal composition of valve manifold body 902. Therefore, the specific number of heater cartridges may be chosen based on the desire to transfer heat quickly and evenly and the specific temperature desired for valve manifold body 902.

Figure 9E:
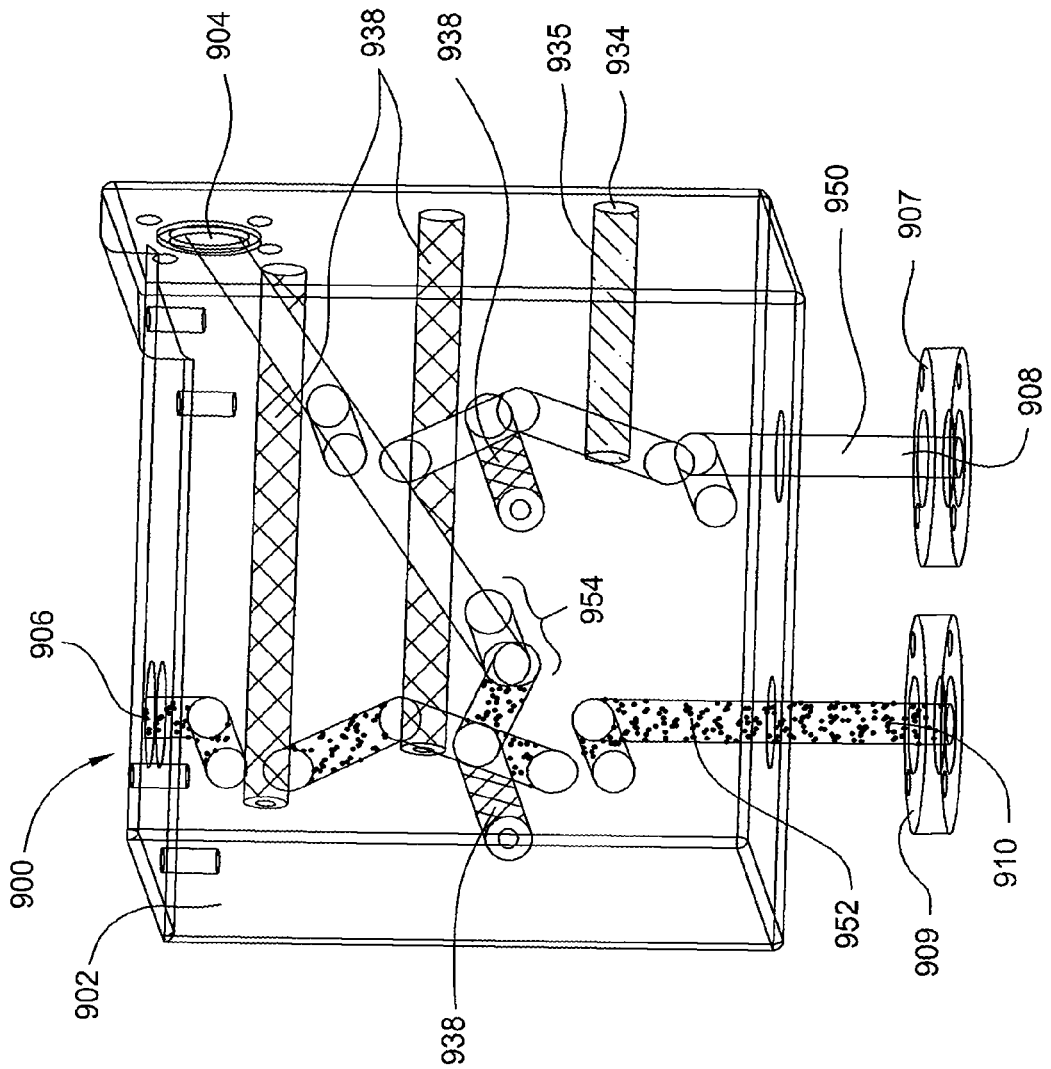
Figure 9F:
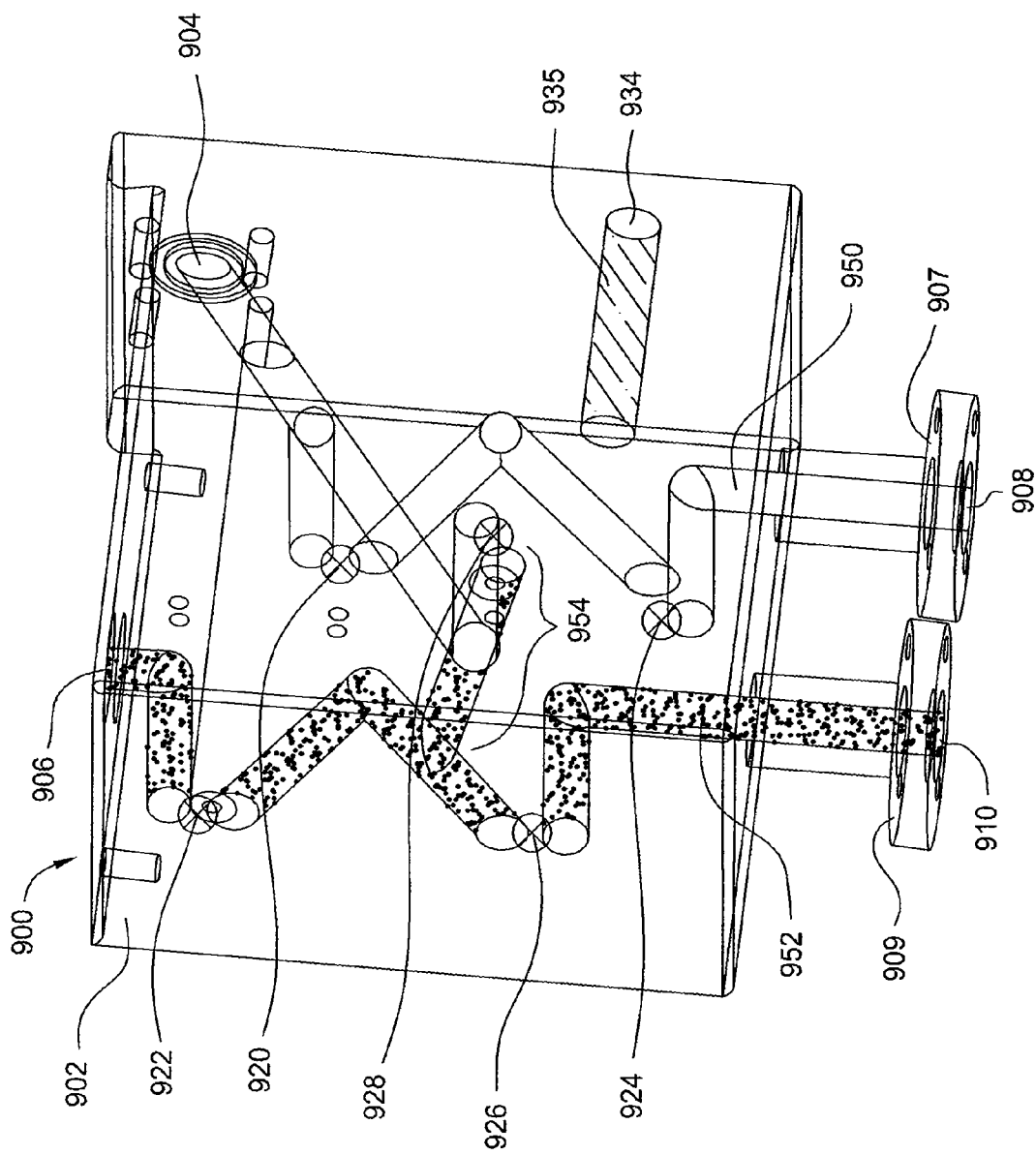
Figure 9G:
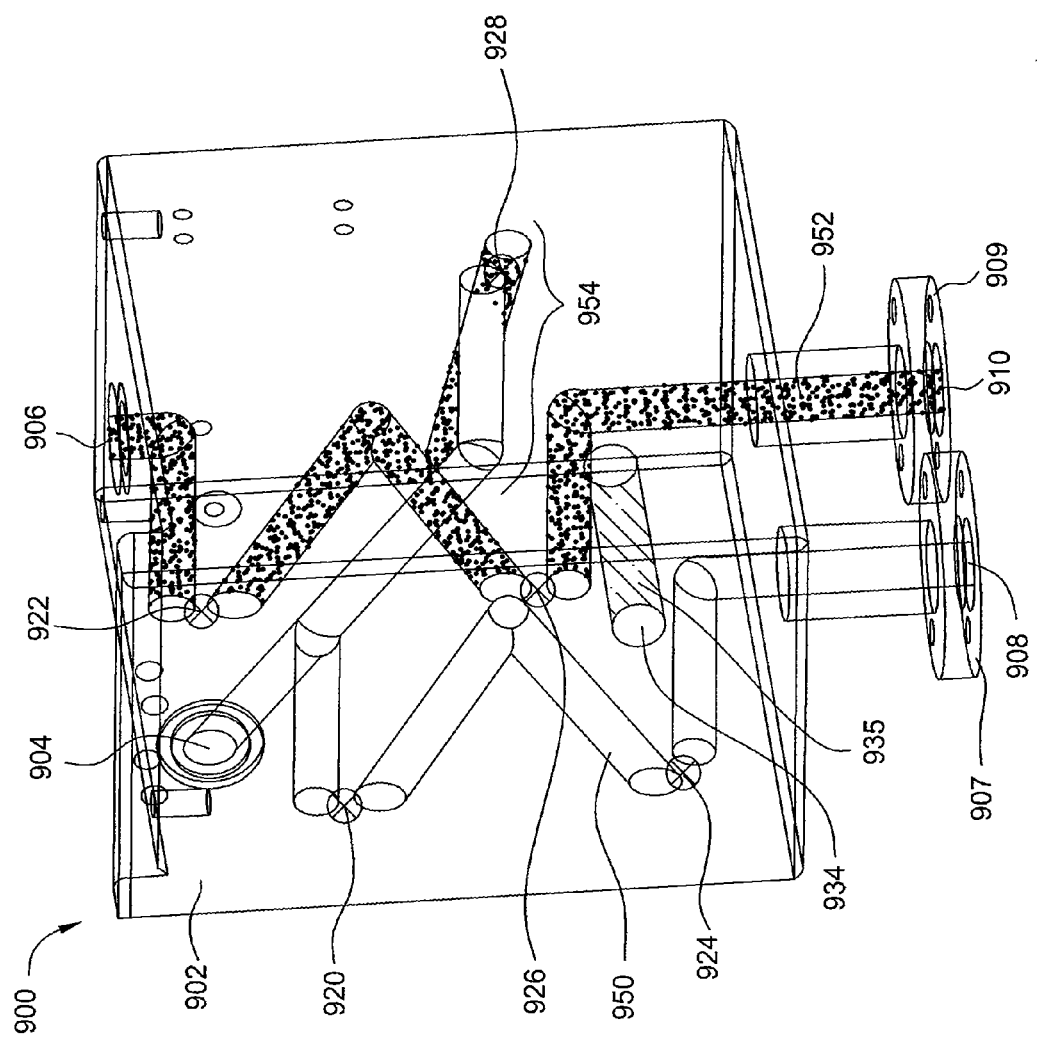
Figure 9H:
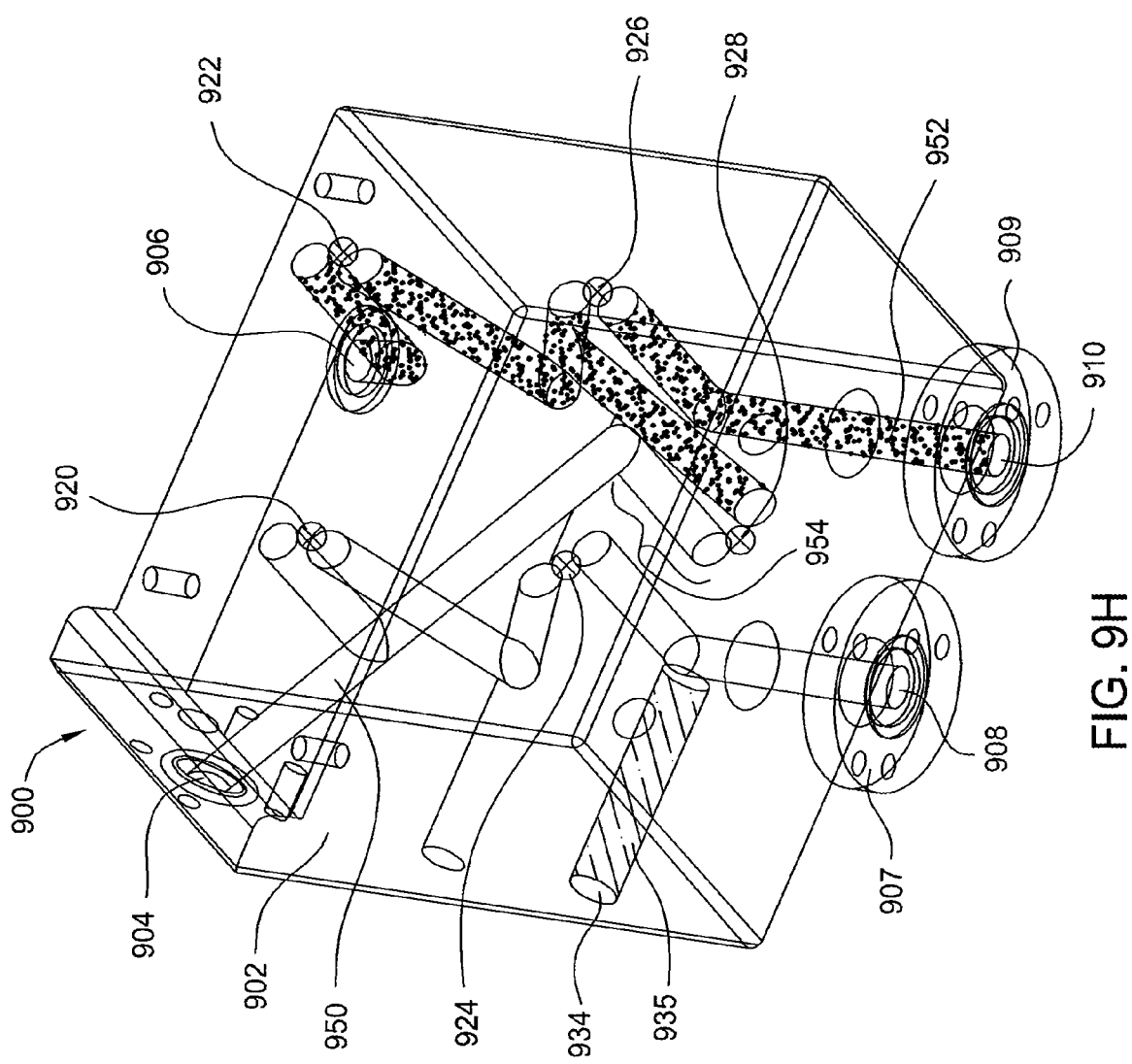
Figure 9I:
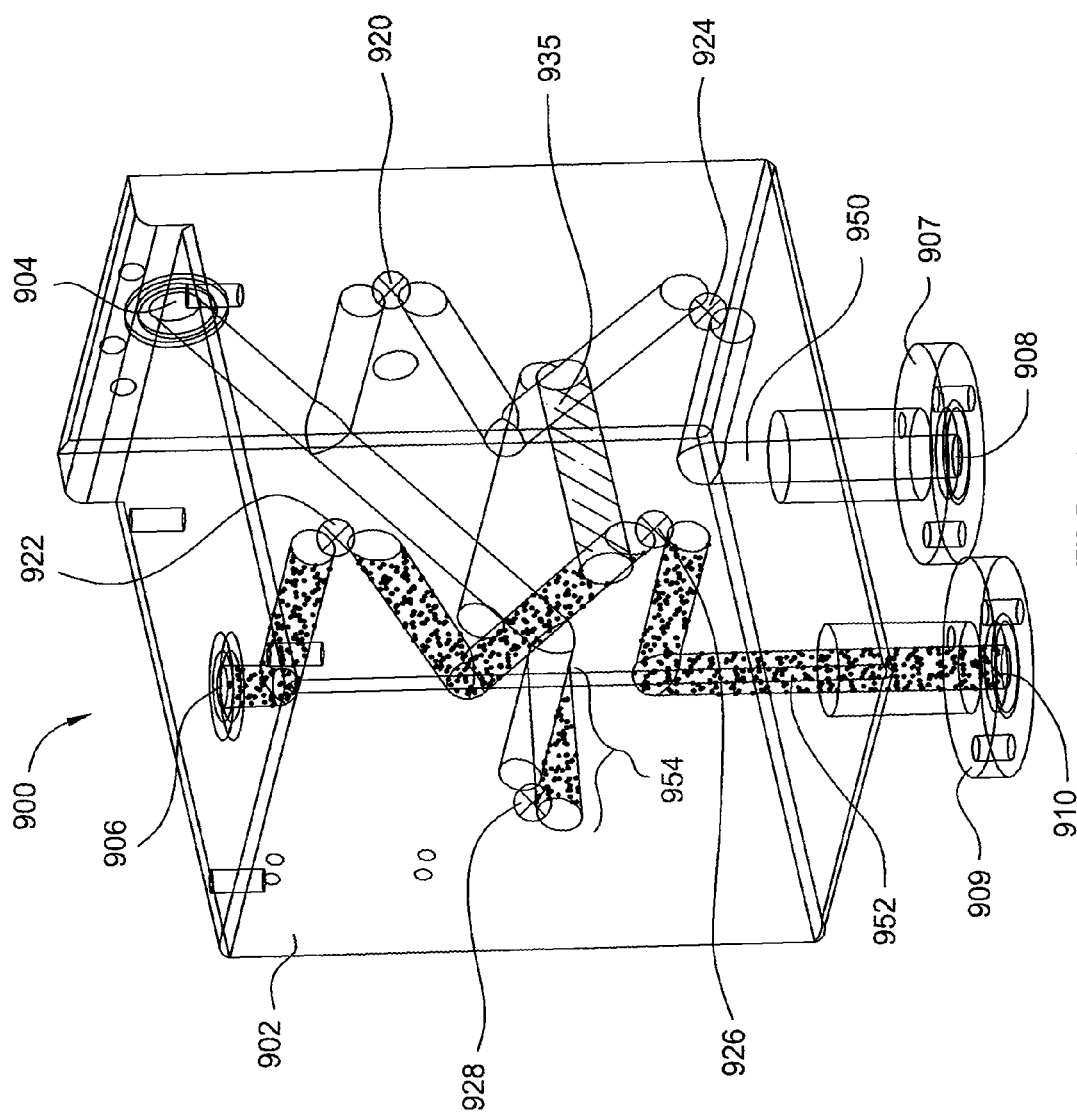
Figure 9J:
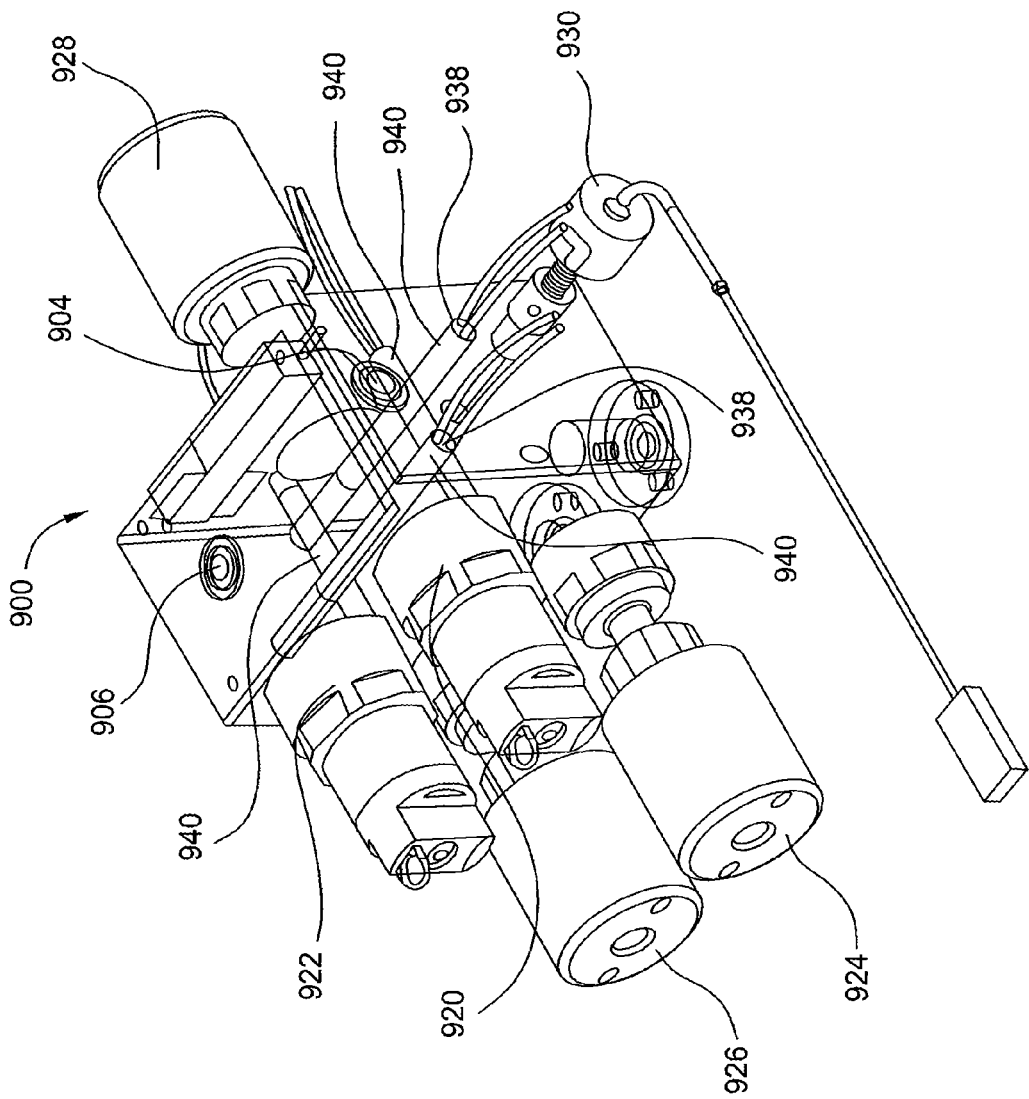
Figure 9K:
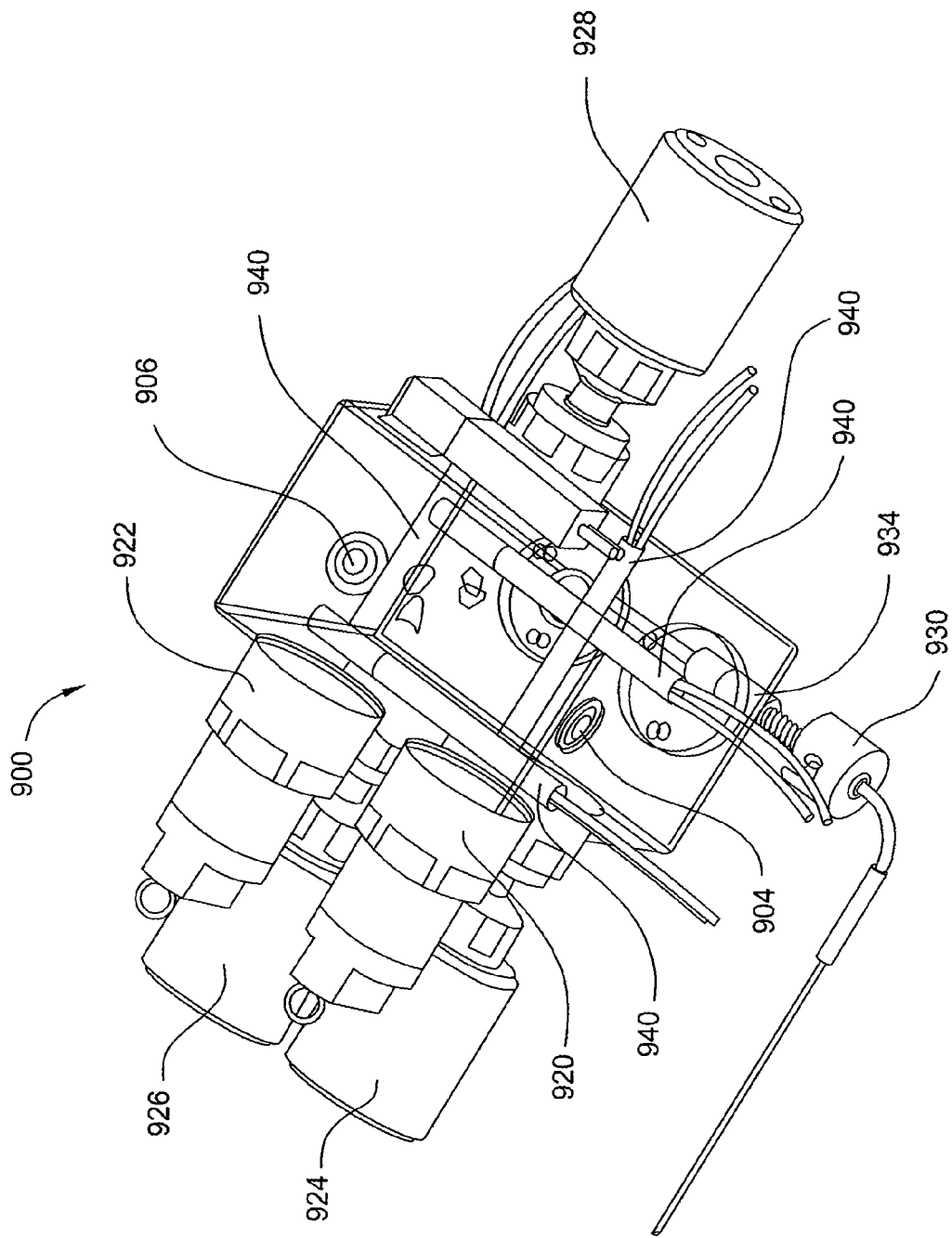

FIGS. 9B and 9J-9K depict valve manifold assembly 900 containing four heater cartridges 940, each within an individual heater cartridge port 938. Heater cartridge ports 938 may be formed through the various surfaces of and within valve manifold body 902. For example, side 916 of valve manifold body 902 contains two heater cartridges 940 contained within heater cartridge ports 938, and back 914 of valve manifold body 902 contains two heater cartridges 940 contained within heater cartridge ports 938. In one example, heater cartridge 940 contains an electric heating element within a stainless steel sheath. Resistive heating elements or electric heater cartridges, such as heater cartridge 940, which may be used to heat valve manifold body 902 are available from Watlow Electric Manf. Co., located in St. Louis, Mo.

Other heating sources may be adapted to heat valve manifold body 902, as well as gases or fluids passing therethrough. In an alternative embodiment, a heat transfer fluid may be circulated through an independent, winding channel within valve manifold body 902 (not shown). The winding channel has an inlet and an outlet each connected to a fluid reservoir, such as a heated source of a liquid, gas, or fluid (e.g., water circulation bath).

Thermocouple 930 may be inserted into valve manifold body 902 through inlet 934 attached to port 935 and used to monitor the temperature of valve manifold body 902 during a heating process. Port 935 may be formed within valve manifold body 902, as depicted in FIG. 9E. Meter 932 displays the temperature of valve manifold body 902 as measured by thermocouple 930. Thermocouples which may be used to measure and monitor the temperature of valve manifold body 902 are available from Watlow Electric Manf. Co., located in St. Louis, Mo. Sensor 942 may be a thermostat or overtemp sensor which is programmed or pre-set to reduce or cease power supplied to heater cartridges 940 at a predetermined temperature of valve manifold body 902. Sensor 942 is connected to and controls each heater cartridge 940. Sensor 942 may be attached to valve manifold body 902, as depicted in FIG. 9B.

In another embodiment, FIGS. 9D and 9L-9M depict ampoule assembly 990 which contains valve manifold assembly 900 coupled to and in fluid communication with ampoule 1110. In one example, ampoule 1110 contains ampoule body 1112 and ampoule lid 1114. Also, inlet channel 950 of valve manifold assembly 900 may extend through conduit 907 forming lower outlet 908 which is coupled to and in fluid communication an inlet on ampoule lid 1114. Similarly, outlet channel 952 of valve manifold assembly 900 may extend through conduit 909 forming lower inlet 910 which is coupled to and in fluid communication an outlet on ampoule lid 1114.

Cooling device 1120, such as a cooling loop or cooling plate, may be in physical contact with ampoule 1110 and used to reduce the temperature, as depicted in FIGS. 9L-9M. Cooling device 1120 may flow a liquid, gas, or other heat transfer fluid, for example, nitrogen gas or clean dry air (CDA) for absorbing heat. In one example, the base of ampoule 1110 is exposed to the cooling loop. Ampoule 1110 may be cooled to a temperature of about 40° C. or less, preferably, about 25° C. or less, such as room temperature or about 20° C. Ampoule 1110 is cooled in order to condense gaseous precursor within ampoule prior to removing ampoule assembly 990 from a delivery or process system.

FIGS. 10A-10F depict valve manifold assembly 1000 as described in another embodiment herein. Valve manifold assembly 1000 may be mounted or connected to an ampoule, a bubbler, a canister, or similar reservoir used to store, collect, dispense, or evaporate a chemical compound. Valve manifold body 1002 is the nucleus of valve manifold assembly 1000 and usually contains and is made from a metal, such as steel, stainless steel, iron, nickel, chromium, aluminum, derivatives thereof, or alloys thereof. Usually, due to chemical compatibility and mechanical strength, valve manifold body 1002 is made from stainless steel, such as 316 SST. In one embodiment, valve manifold body 1002 and other parts of valve manifold 1000 are resistant or substantially resistant to chlorine, fluorine, compounds thereof, or derivatives thereof. In some examples, valve manifold body 1002 may be formed, fabricated, machined, or molded from a single piece of metal or assembled from multiple pieces of metal or other materials.

As depicted in FIGS. 10A-10F, valve manifold body 1002 contains front 1012, back 1014, side 1016, side 1017, top 1018, and bottom 1019. Inlet 1004 is positioned on bottom 1019, outlet 1006 is positioned on front 1012, inlet 1008 is positioned on side 1016, and outlet 1010 is positioned on side 1017. However, other configurations for the placement of inlets and outlets have also been successfully implemented in alternative embodiments. For example, in a configuration not shown, inlet 1004 may be positioned on bottom 1019, while outlet 1006, and inlet 1008 may both be positioned on top 1018, and outlet 1010 is positioned on side 1017. While outlet 1006 and inlet 1008 are shown with VCR connections, other types of connectors have been used with success. In one example, outlet 1006 and inlet 1008, each contains a VCR connector, such as a ¼ inch VCR connector or a ½ inch VCR connector.

In one embodiment, FIGS. 10B-10F depict a schematic illustration of the channels or passageways within valve manifold body 1002. Channel 1050 extends inwards from inlet 1004 to channel 1052 and to outlet 1010. Channel 1052 extends inwards from inlet 1008 and to channels 1050 and 1054. Channel 1054 extends inwards from channel 1052 to outlet 1006.

In one embodiment, gas (e.g., deposition gas) may enter inlet 1004 (coming from ampoule and or valve assembly 900), along the passageway of channel 1050, pneumatic valve 1026 is attached or coupled to valve manifold body 1002 and positioned to control fluid flow within channel 1050, as depicted in FIGS. 10A-10F. The fluid may be flow to outlet 1006, towards divert, or to outlet 1010, towards the processing chamber. Pneumatic valve 1024 is attached or coupled to valve manifold body 1002 along the passageway of channel 1052 and positioned to control fluid flow within channel 1052. The fluid (e.g., purge gas) may flow from inlet 1008, through channel 1052, pass pneumatic valve 1024, to pneumatic valve 1028 and channel 1050, thereafter, to outlet 1006, towards divert, or to outlet 1010, towards the processing chamber. Pneumatic valve 1026 is attached or coupled to valve manifold body 1002 along the passageway of channel 1054 and positioned to control fluid flow within channel 1054. As used herein, channels, passageways, conduits, lines, tubes, pipes may be used to describe channels 1050, 1052, and 1054, in part or in whole.

In one example, a bypass channel or passageway may be formed between inlet 1008 and outlet 1006 through channels 1052 and 1054, in either direction, by maintaining pneumatic valves 1024 and 1026 in an opened position and pneumatic valve 1028 in a closed position. In another example, a bypass channel or passageway may be formed between inlet 1008 and outlet 1010 through channels 1052 and 1050, in either direction, by maintaining pneumatic valves 1024 and 1028 in an opened position and pneumatic valve 1026 in a closed position.

Valve manifold body 1002 contains at least one, preferably, a plurality of heater cartridges 1040, such as 2, 3, 4, 5, 6, or more heater cartridges 1040 that may be used to heat valve manifold body 1002 to a predetermined temperature. Heater cartridge 1040 may be a resistive heating element contained within an isolatable cartridge and/or embedded within valve manifold body 1002. Heater cartridges 1040 quickly and evenly heat valve manifold body 1002 due to the high thermal conductivity of the metal composition of valve manifold body 1002. Therefore, the specific number of heater cartridges may be chosen based on the desire to transfer heat quickly and evenly and the specific temperature desired for valve manifold body 1002.

Figure 10A:
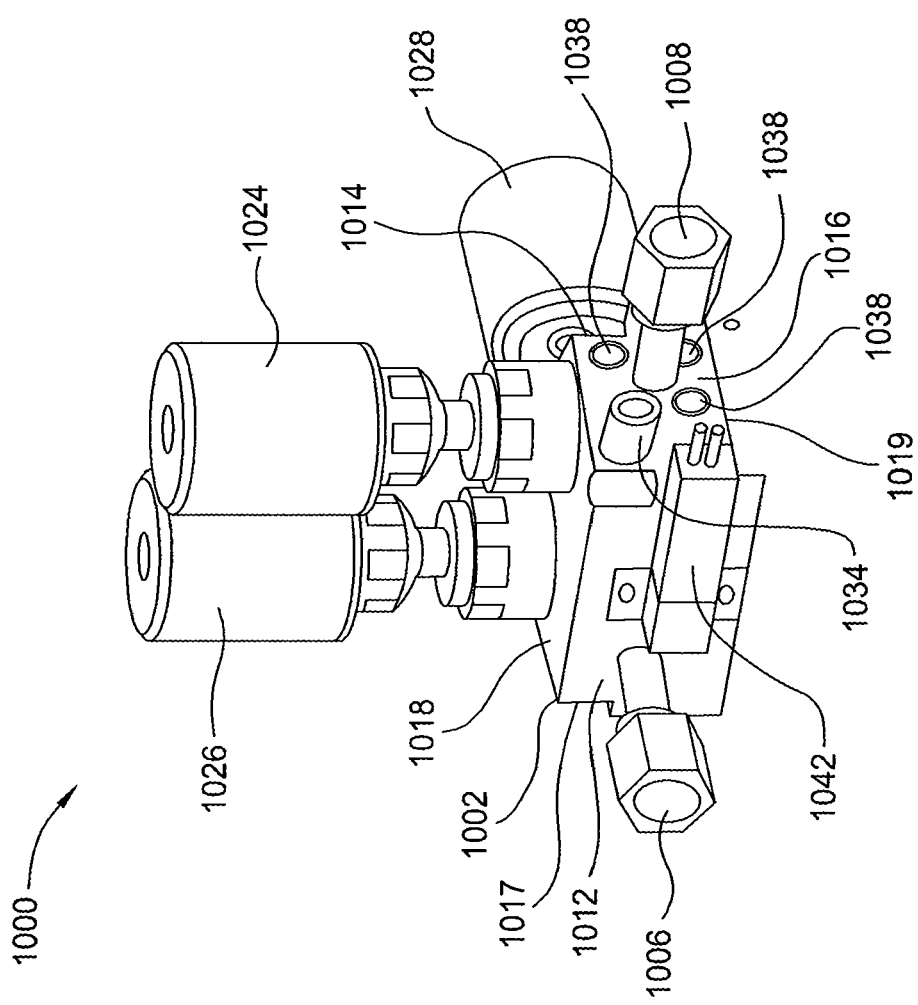
FIGS. 10A-10F schematically depict another valve manifold assembly, as described in other embodiments herein.
Figure 10B:
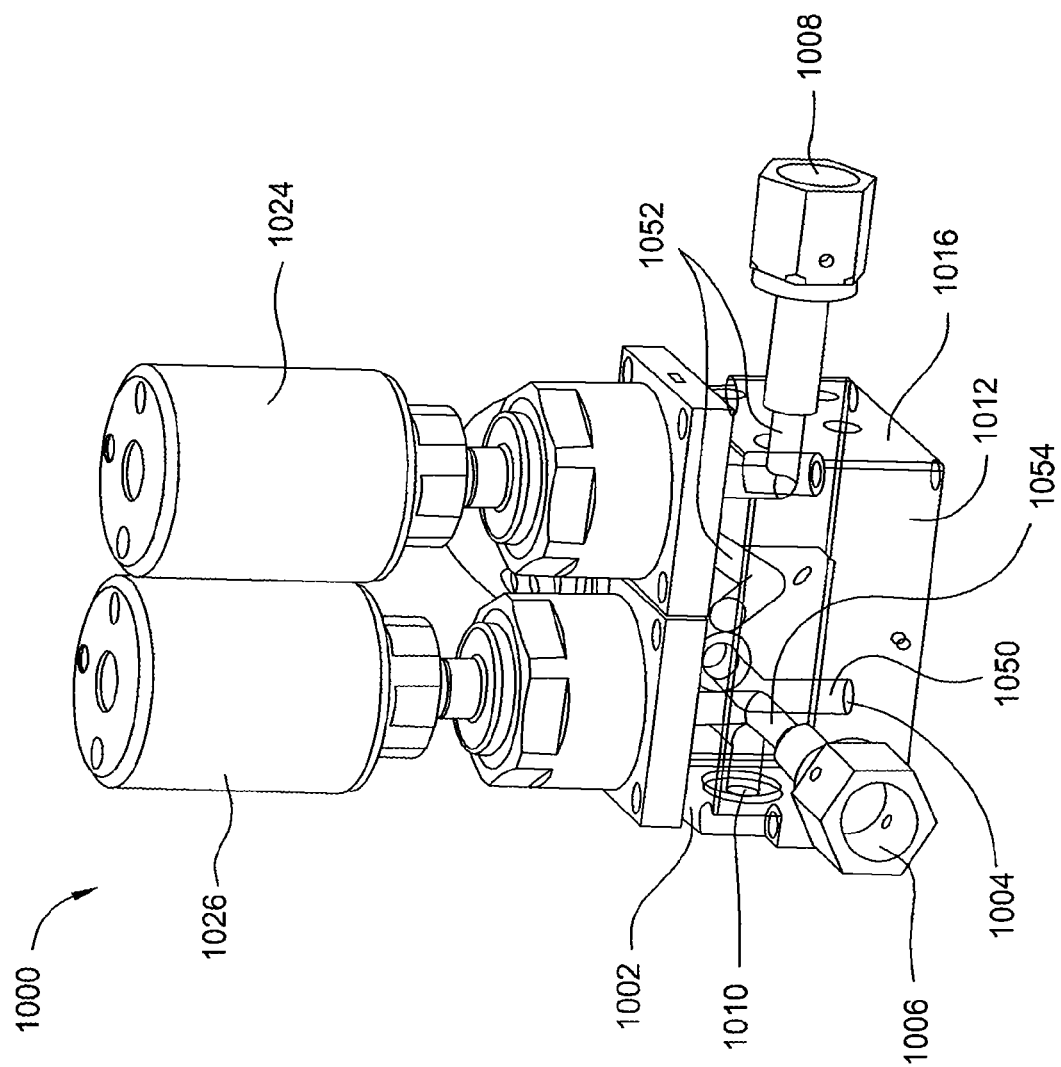
Figure 10C:
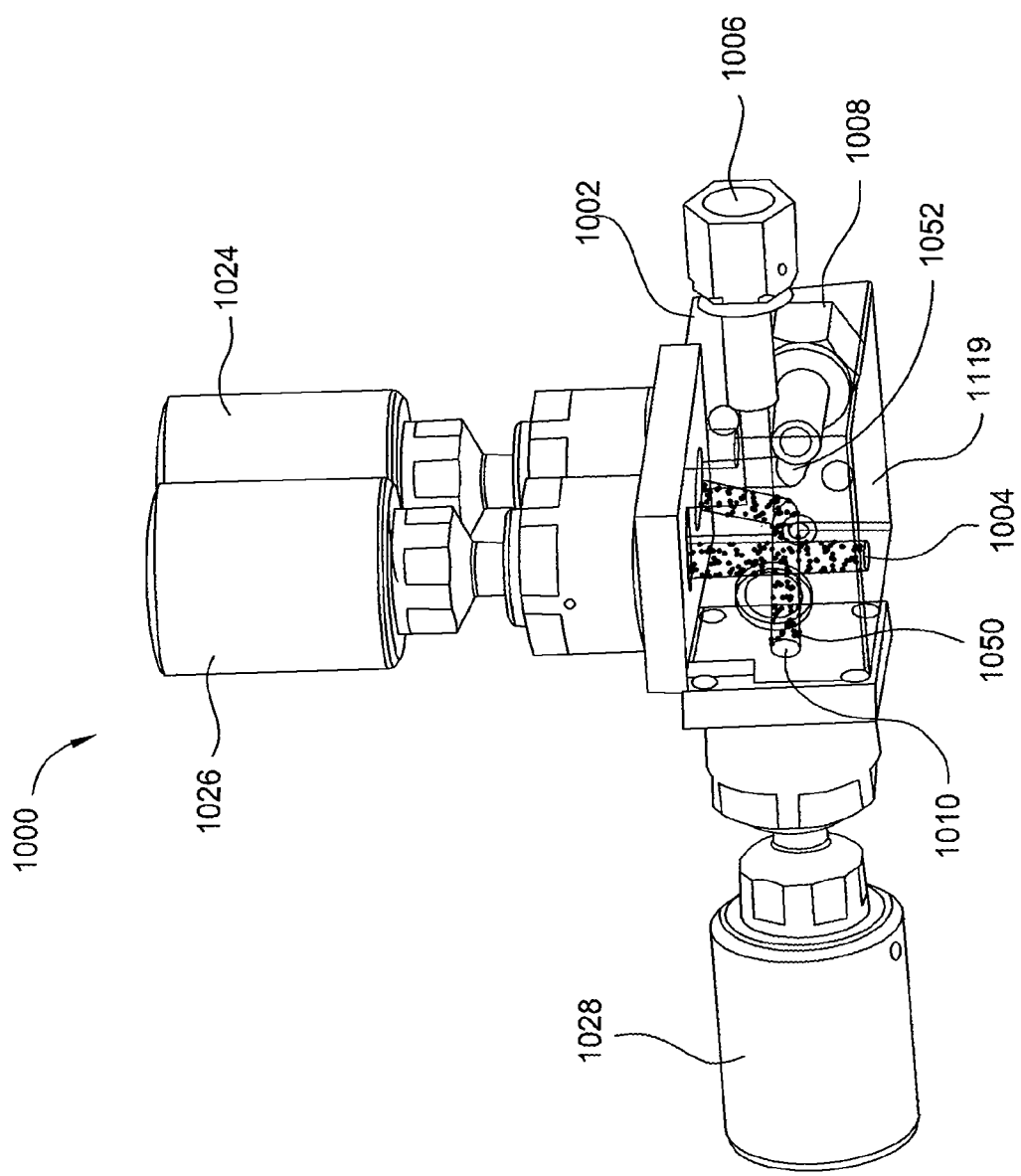
Figure 10D:
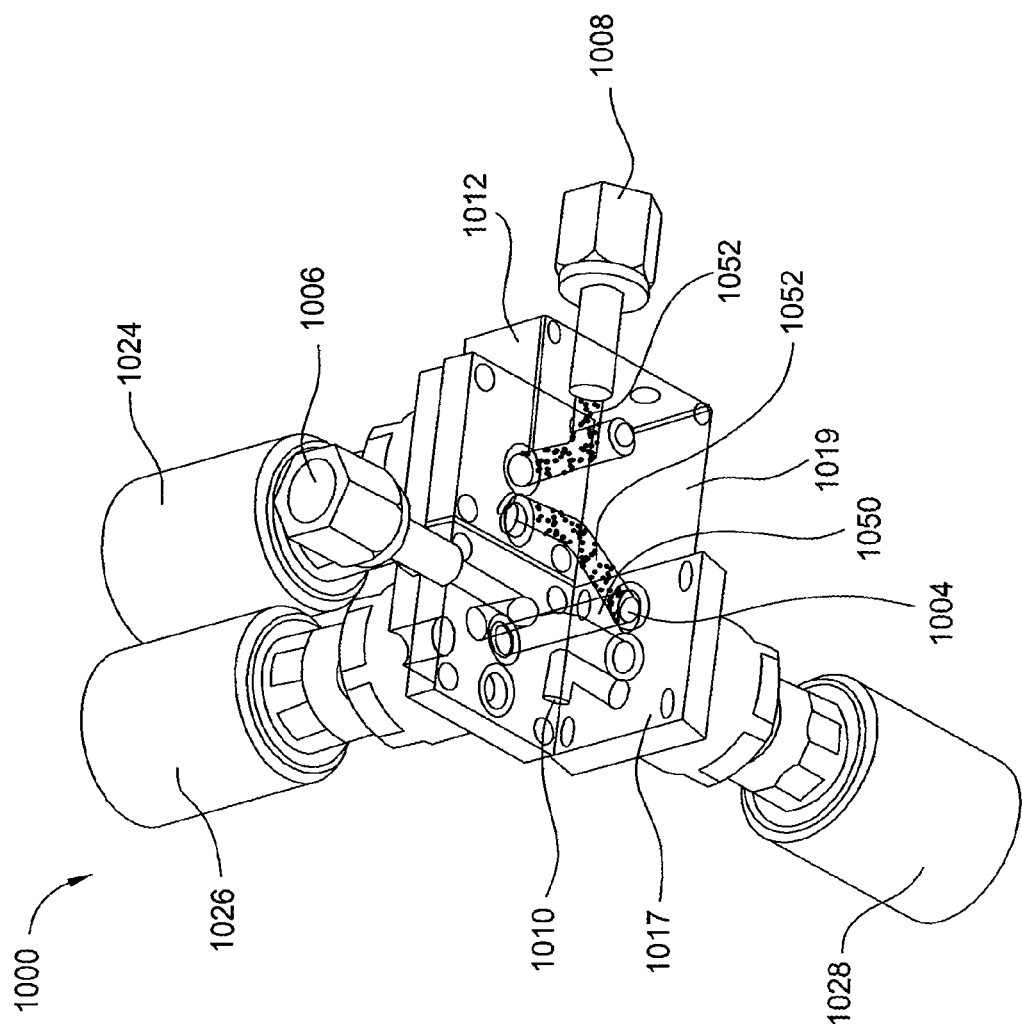
Figure 10E:
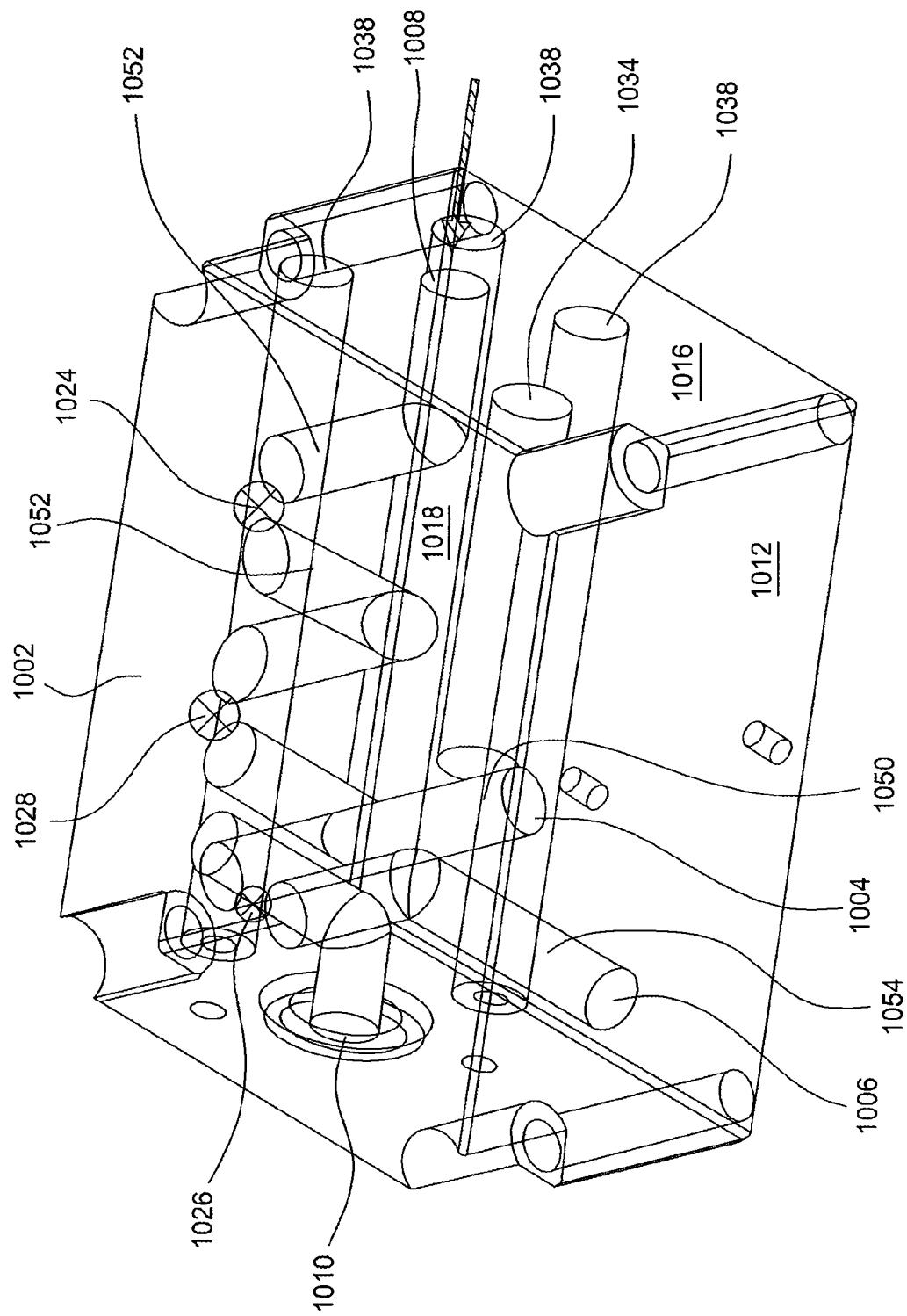
Figure 10F:
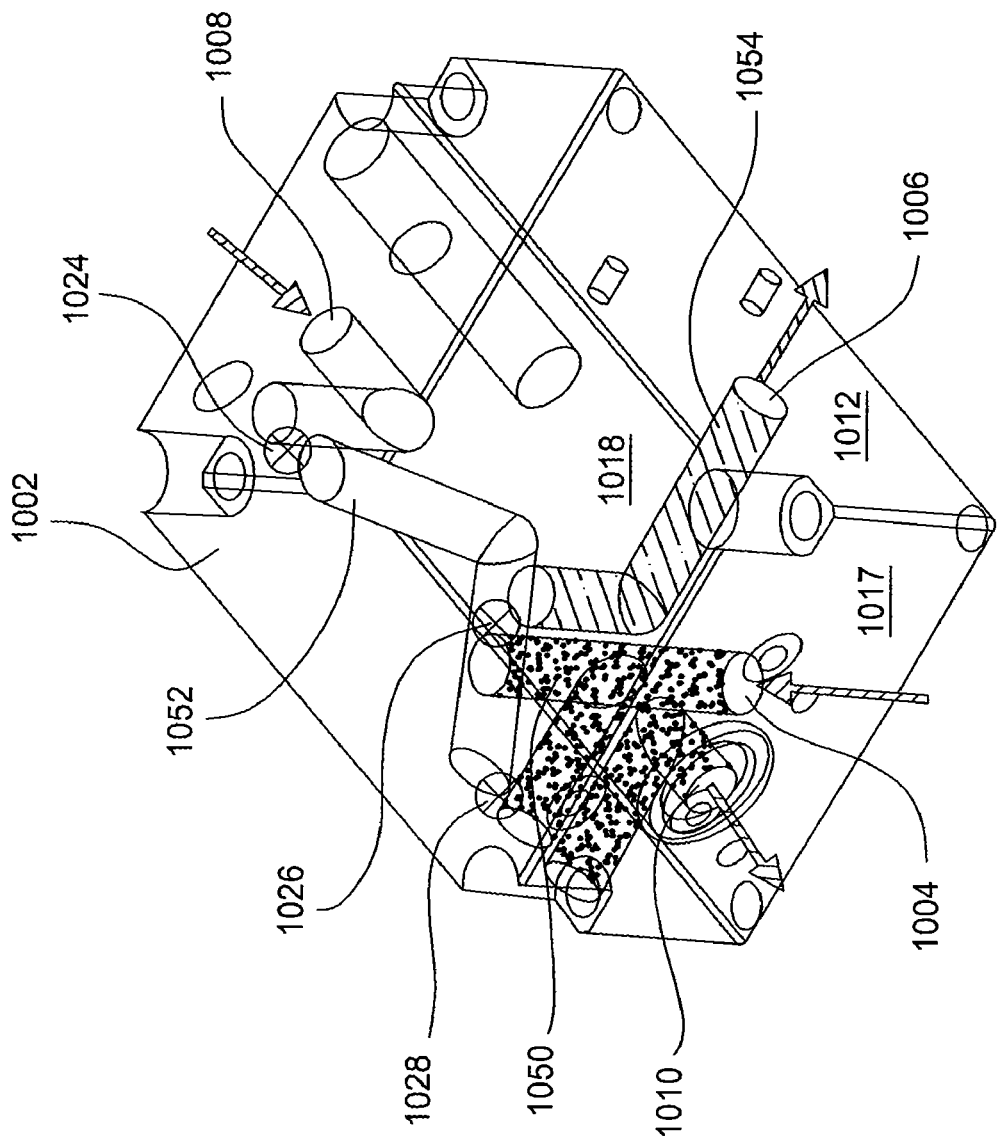

FIG. 10A depicts valve manifold assembly 1000 containing three heater cartridge ports 1038, each for containing a heater cartridge 1040 (not shown). Heater cartridge ports 1038 may be formed through the various surfaces of and within valve manifold body 1002. For example, side 1016 of valve manifold body 1002 contains three heater cartridge ports 1038, which are used to contain heater cartridges. In one example, heater cartridge 1040 contains an electric heating element within a stainless steel sheath. Resistive heating elements or electric heater cartridges, such as heater cartridge 1040, which may be used to heat valve manifold body 1002 are available from Watlow Electric Manf. Co., located in St. Louis, Mo.

Other heating sources may be adapted to heat valve manifold body 1002, as well as gases or fluids passing therethrough. In an alternative embodiment, a heat transfer fluid may be circulated through an independent, winding channel within valve manifold body 1002 (not shown). The winding channel has an inlet and an outlet each connected to a fluid reservoir, such as a heated source of a liquid, gas, or fluid.

A thermocouple may be inserted into valve manifold body 1002 through inlet 1034 and used to monitor the temperature of valve manifold body 1002 during a heating process. Meter 1032 displays the temperature of valve manifold body 1002 as measured by the thermocouple. Thermocouples which may be used to monitor the temperature of valve manifold body 1002 are available from Watlow Electric Manf. Co., located in St. Louis, Mo. Sensor 1042 may be a thermostat or overtemp sensor which is programmed or pre-set to reduce or cease power supplied to heater cartridges 1040 at a predetermined temperature of valve manifold body 1002. Sensor 1042 is connected to and controls each heater cartridge 1040. Sensor 1042 may be attached to valve manifold body 1002, as depicted in FIG. 10A.

In another embodiment, FIGS. 11A-11D depict ampoule assembly 1100 which contains valve manifold assembly 1000, disposed on valve manifold assembly 900, which is coupled to and in fluid communication with ampoule 1110. Heater cartridges 940 and 1040 are shown outside of heater cartridge ports 938 and 1038, and may be used to independently heat valve manifold assembly 900 and 1000 to independently predetermined temperatures. In one example, ampoule 1110 contains ampoule body 1112 and ampoule lid 1114. Valve manifold assembly 1000 may be in fluid communication with valve manifold assembly 900, by outlet 906 of valve manifold body 902 coupled to and in fluid communication with inlet 1004 of valve manifold body 1002. Also, inlet channel 950 of valve manifold assembly 900 may extend through conduit 907 forming lower outlet 908 which is coupled to and in fluid communication an inlet on ampoule lid 1114. Similarly, outlet channel 952 of valve manifold assembly 900 may extend through conduit 909 forming lower inlet 910 which is coupled to and in fluid communication an outlet on ampoule lid 1114.

Ampoule body 1112 and ampoule lid 1114, independently, contain and may be made from a metal, such as steel, stainless steel, iron, nickel, chromium, aluminum, derivatives thereof, or alloys thereof. Usually, due to chemical compatibility (e.g., high chlorine resistivity) and mechanical strength, ampoule body 1112 and ampoule lid 1114 are made from stainless steel, such as 316 SST. In some embodiments, ampoule lid 1114 may have a thickness within a range from about ⅛" to about ⅜", for example, about ¼". In other embodiments, ampoule lid 1114 is thicker in order to increase heat retention and heat stabilization within ampoule 1110. Therefore, ampoule lid 1114 may have a thickness within a range from about ⅜" to about ¾", preferably, from about 7/16" to about 9/16", for example, about ½".

In one embodiment, ampoule 1110 may be the aforementioned ampoules described herein, such that ampoule body 1112 may be ampoule bodies 170, 270, 712, and 802. Ampoule 1110 may contain heating particulates, baffles, silos, nozzles, deflection plates, heating shelves, and other accessories and components used within ampoules or as described herein. In another embodiment, an ampoule which may be used as ampoule 1110 is commercially available as the PROE-VAP™ delivery system, available from Advanced Technology Materials, Inc.

In one example, ampoule assembly 1100 contains hafnium tetrachloride within ampoule body 1112. Valve manifold assemblies 900 and 1100 may be heated to a temperature within a range from about 150° C. to about 225° C., preferably, from about 175° C. to about 200° C. Ampoule 1110 may contain a plurality of metallic heating shelves contained within ampoule body 1112 for supporting and heating hafnium tetrachloride.

Figure 11A:
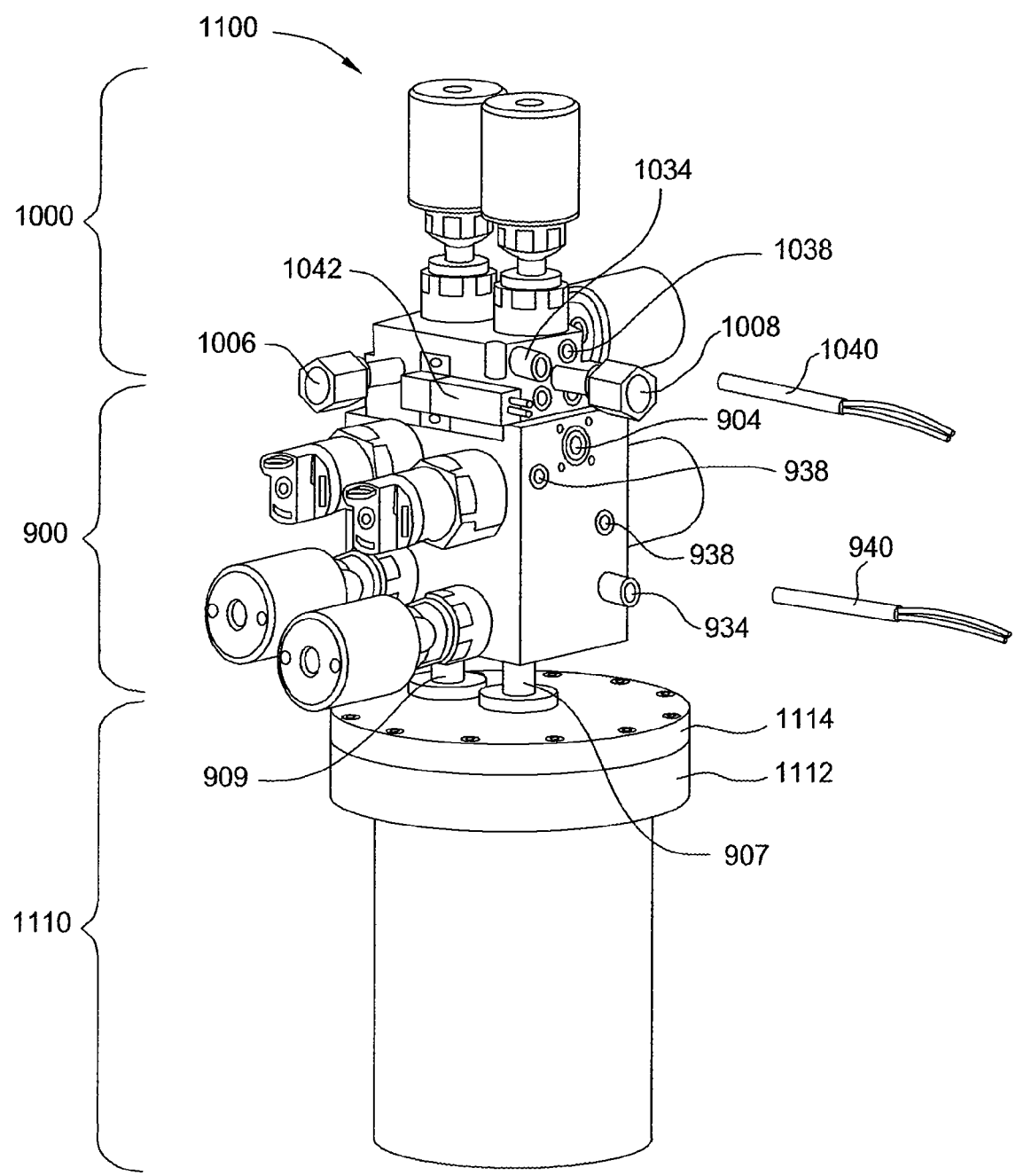
FIGS. 11A-11D schematically depict an ampoule assembly containing valve manifold assemblies, as described in embodiments herein.
Figure 11B:
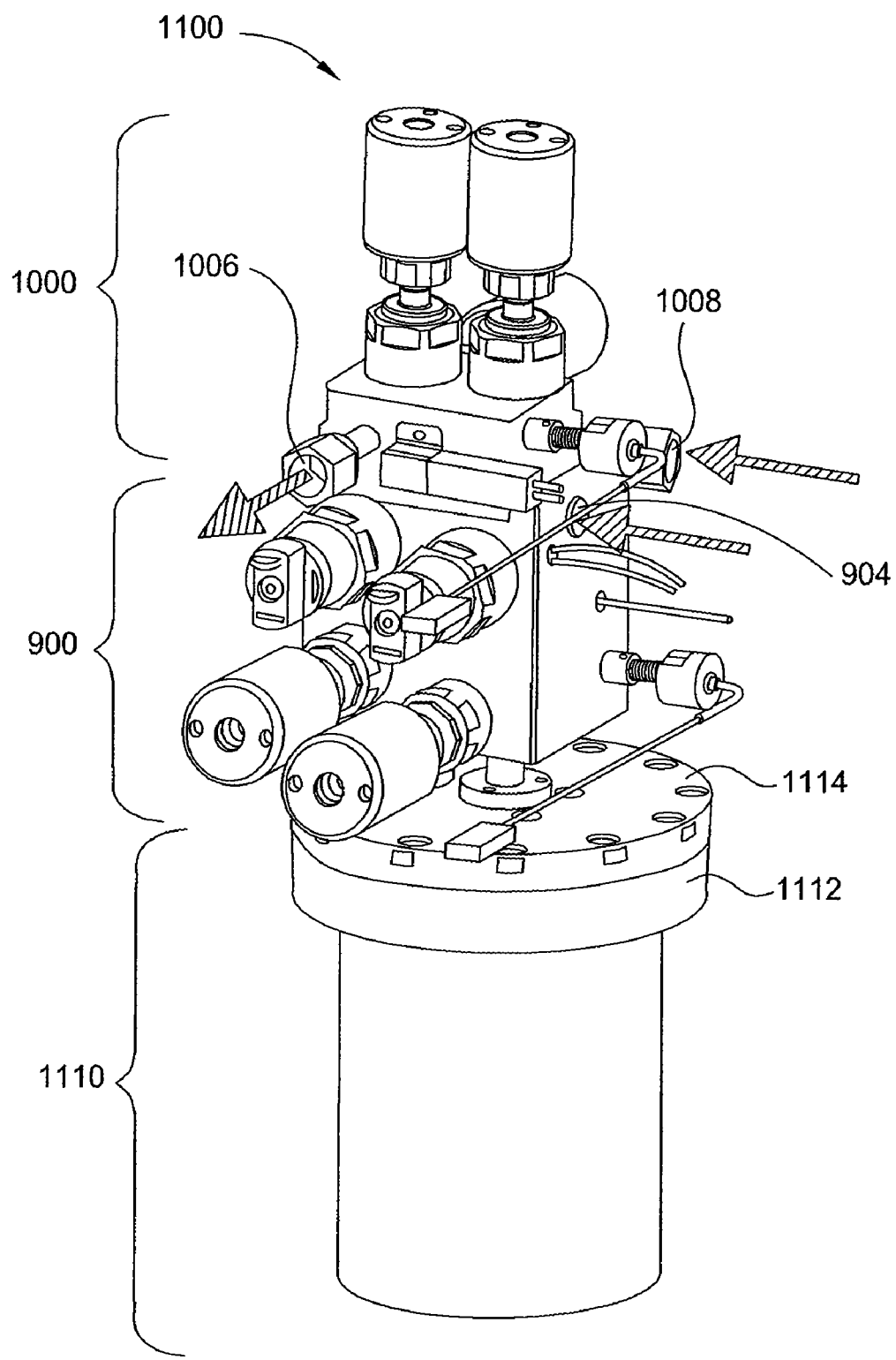
Figure 11C:
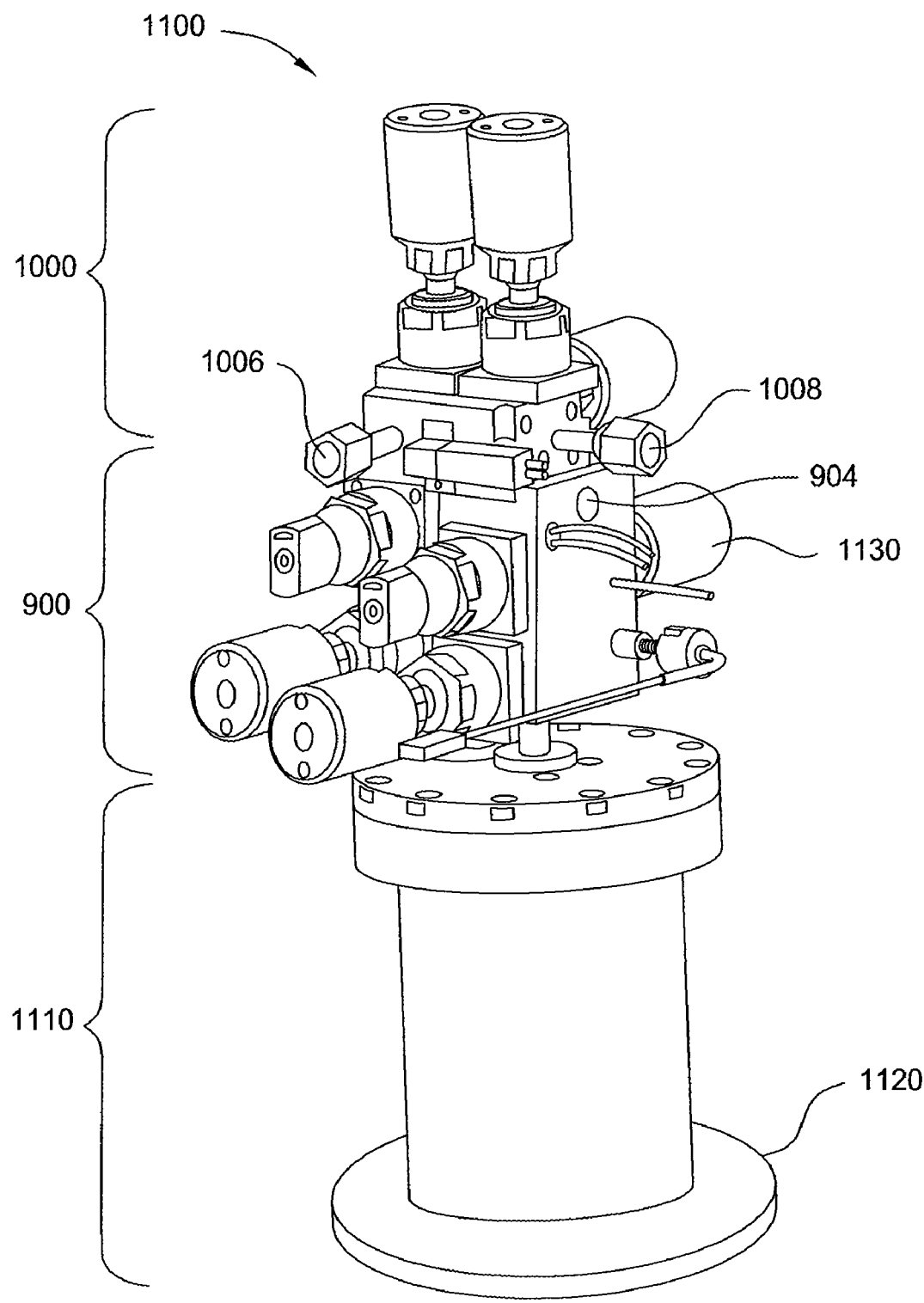
Figure 11D:
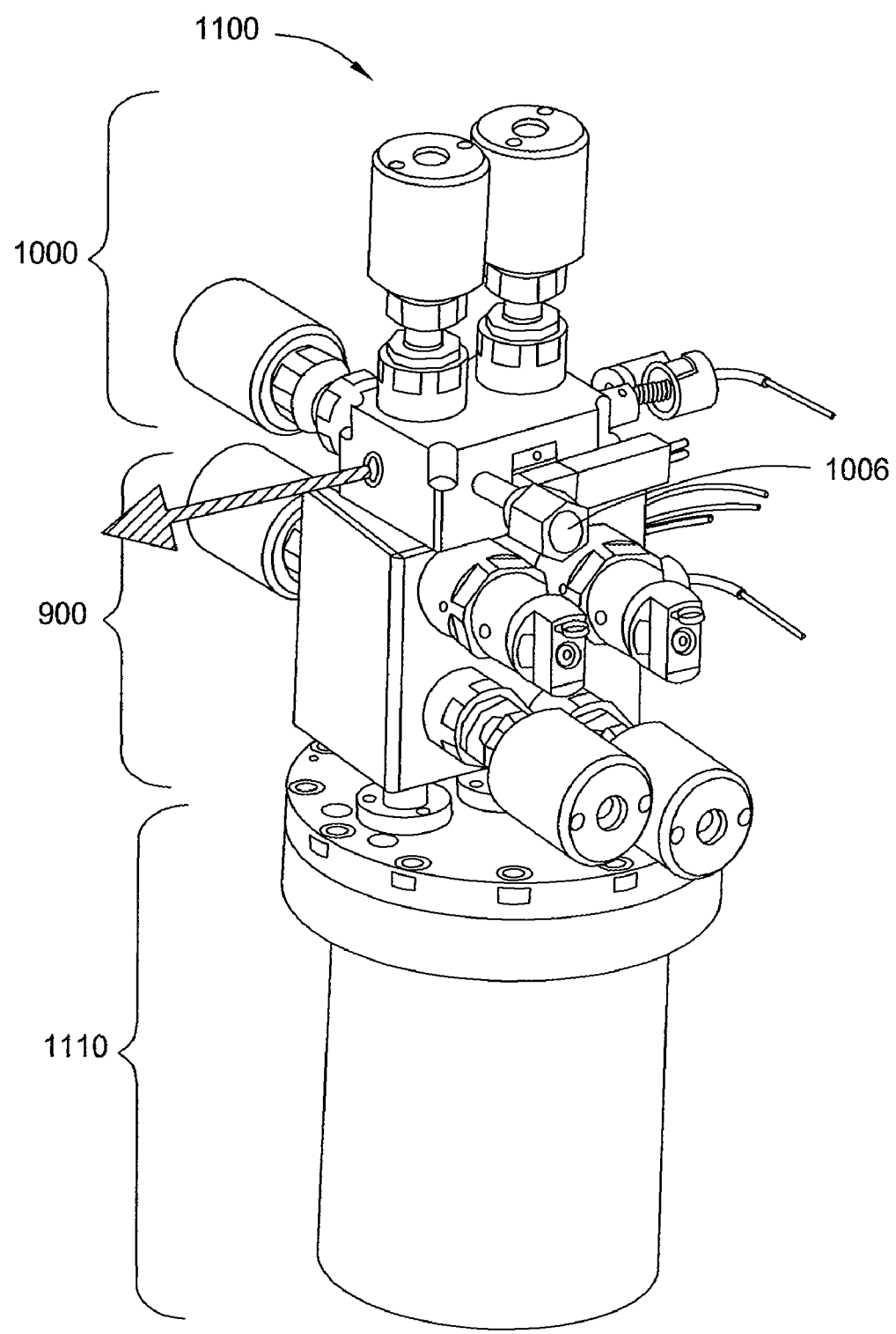

In an alternative embodiment, ampoule assembly 1100 contains cooling device 1120 and manifold 1130 containing inlet 904, as depicted in FIG. 11C. Cooling device 1120, such as a cooling loop or cooling plate, may be in physical contact with ampoule 1110 and used to reduce the temperature. Manifold 1130 maybe a heating manifold used to heat or keep warm incoming gas through inlet 904. Manifold 1130 may be coupled to valve manifold assembly 900. Manifold 1130 contain valves and heaters (not shown) and may be heated to a temperature within a range from about 150° C. to about 225° C.

In another embodiment, a method for generating a chemical precursor used in a vapor deposition processing system is provided which includes heating a valve assembly to a temperature within a range from about 150° C. to about 225° C., wherein the valve assembly is coupled to and in fluid communication with an ampoule containing hafnium tetrachloride, and the valve assembly contains at least one embedded heater, an inlet channel coupled to and in fluid communication with the ampoule. The valve assembly further contains a first pneumatic valve and a first manual valve coupled to the valve assembly and positioned to control fluid flow within the inlet channel, an outlet channel coupled to and in fluid communication with the ampoule, a second pneumatic valve and a second manual valve coupled to the valve assembly and positioned to control fluid flow within the outlet channel, a bypass channel, wherein a first end of the bypass channel is coupled to the inlet channel and a second end of the bypass channel is coupled to the outlet channel, and a bypass valve coupled to the valve assembly and positioned to control fluid flow within the bypass channel. The method further provides flowing a carrier gas from a gas source, through the inlet channel, and into the ampoule to form a deposition gas containing hafnium tetrachloride, and flowing the deposition gas containing hafnium tetrachloride from the ampoule, through the outlet channel, and to a processing system.

In other embodiments, the method further includes stopping the flow of the carrier gas, cooling the ampoule to a temperature of about 40° C. or less, closing the first and second pneumatic valves and the first and second manual valves, and removing the ampoule from the processing system. In one example, the ampoule is cooled to a temperature of about 25° C. or less. In other examples, the valve assembly is heated to a temperature within a range from about 175° C. to about 200° C. The bypass valve may be a pneumatic valve.

In another embodiment, the method further includes heating a valve assembly to a temperature within a range from about 100° C. to about 350° C., wherein the valve assembly is coupled to and in fluid communication with an ampoule containing a metal-containing precursor, and the valve assembly contains at least one embedded heater, an inlet channel coupled to and in fluid communication with the ampoule. The valve assembly further contains a first pneumatic valve and a first manual valve coupled to the valve assembly and positioned to control fluid flow within the inlet channel, an outlet channel coupled to and in fluid communication with the ampoule, a second pneumatic valve and a second manual valve coupled to the valve assembly and positioned to control fluid flow within the outlet channel, a bypass channel, wherein a first end of the bypass channel is coupled to the inlet channel and a second end of the bypass channel is coupled to the outlet channel, and a bypass valve coupled to the valve assembly and positioned to control fluid flow within the bypass channel. The method further provides flowing a carrier gas from a gas source, through the inlet channel, and into the ampoule to form a deposition gas containing the metal-containing precursor, and flowing the deposition gas containing the metal-containing precursor from the ampoule, through the outlet channel, and to a processing system. In some examples, the valve assembly may be heated to a temperature within a range from about 150° C. to about 275° C., preferably, from about 175° C. to about 200° C. The metal-containing precursor may be $HfCl_4$ or PDMAT.

In another embodiment, the method further includes stopping the flow of the carrier gas, cooling the ampoule to a temperature of about 40° C. or less, closing the first and second pneumatic valves and the first and second manual valves, and removing the ampoule from the processing system. The ampoule may be cooled to a temperature of about 25° C. or less, such as room temperature or about 20° C. A cooling loop or cooling plate may be in contact with the ampoule and used to reduce the temperature. The cooling loop or cooling plate may flow a liquid, gas, or other heat transfer fluid, for example, nitrogen gas or clean dry air (CDA) for absorbing heat. In one example, the base of the ampoule is exposed to the cooling loop. The ampoule may be heated to sublime or vaporize a chemical precursor. The ampoule may be heated by a heater jacket or other heating sources known in the art or described herein. In one example, the base, top, and sides are independently wrapped with an electrical heating jacket.

In another embodiment, a method for generating a chemical precursor used in a vapor deposition processing system is provided which includes attaching an ampoule assemble containing a valve manifold assembly to a processing system, wherein the valve manifold assembly is coupled to and in fluid communication with an ampoule containing a chemical precursor, and the valve manifold assembly contains at least one embedded heater, an inlet channel coupled to and in fluid communication with the ampoule. The valve manifold assembly further contains a first pneumatic valve and a first manual valve coupled to the valve manifold assembly and positioned to control fluid flow within the inlet channel, an outlet channel coupled to and in fluid communication with the ampoule, a second pneumatic valve and a second manual valve coupled to the valve manifold assembly and positioned to control fluid flow within the outlet channel, a bypass channel, wherein a first end of the bypass channel is coupled to the inlet channel and a second end of the bypass channel is coupled to the outlet channel, and a bypass valve coupled to the valve manifold assembly and positioned to control fluid flow within the bypass channel. The method further provides opening the first and second manual valves and the bypass valve while maintaining closed the first and second pneumatic valves, evacuating the bypass channel and upper portions of the inlet and outlet channels, flowing a purge gas through the bypass channel and upper portions of the inlet and outlet channels, closing the bypass valve, and subsequently opening the first and second pneumatic valves.

Ampoule assemblies 100, 300a-300f, 600, 700, 800, and 1100 may contain solid or liquid chemical precursors that are used as a chemical precursor during an ALD process or a CVD process. The solid chemical precursors that may be used to form process gases include tantalum precursors, such as pentakis(dimethylamido) tantalum (PDMAT; $Ta(NMe_2)_5$), pentakis(diethylamido) tertiaryamylimido-tris(dimethylamido) tantalum (TAIMATA, $(^tAmylN)Ta(NMe_2)_3$, wherein $^tAmyl$ is the tertiaryamyl group ($C_5H_{11}$— or $CH_3CH_2C(CH_3)_2$—), or derivatives thereof. In one embodiment, the PDMAT has a low halogen content (e.g., Cl, F, I, or Br). The PDMAT may have a halogen concentration of less than about 100 ppm. For example, the PDMAT may have a chlorine concentration of less than about 100 ppm, preferably, less than about 20 ppm, more preferably, less than about 5 ppm, and more preferably, less than about 1 ppm, such as about 100 ppb or less.

Other solid chemical precursors that may be used to form process gases through a sublimation process include hafnium tetrachloride, xenon difluoride, nickel carbonyl, and tungsten hexacarbonyl, or derivatives thereof. In other embodiments, liquid chemical precursors may be evaporated to form process gases within ampoules described herein. Other chemical precursors that may be used to form process gases include tungsten precursors, such as tungsten hexafluoride ($WF_6$), tantalum precursors, such as tantalum (PDEAT; $Ta(NEt_2)_5$), pentakis(methylethylamido) tantalum (PMEAT; $Ta(NMeEt)_5$), tertbutylimino-tris(dimethylamino) tantalum (TBTDMT, $^tBuNTa(NMe_2)_3$), tertbutylimino-tris(diethylamino) tantalum (TBTDET, $^tBuNTa(NEt_2)_3$), tertbutylimino-tris(methylethylamino) tantalum (TBTMET, $^tBuNTa(NMeEt)_3$), or derivatives thereof, titanium precursors, such as titanium tetrachloride ($TiCl_4$), tetrakis(dimethylamino) titanium (TDMAT, $(Me_2N)_4Ti$)), tetrakis(diethylamino) titanium (TEMAT, $(Et_2N)_4Ti$)), or derivatives thereof, ruthenium precursors, such as bis(ethylcyclopentadienyl) ruthenium (($EtCp)_2Ru$), hafnium precursors, such as tetrakis(dimethylamino) hafnium (TDMAH, $(Me_2N)_4Hf$)), tetrakis(diethylamino) hafnium (TDEAH, $(Et_2N)_4Hf$)), tetrakis(methylethylamino) hafnium (TMEAH, $(MeEtN)_4Hf$)), or derivatives thereof, and aluminum precursors, such as 1-methylpyrolidrazine:alane (MPA, $MeC_4H_3N:AlH_3$), pyridine: alane ($C_4H_4N:AlH_3$), alkylamine alane complexes (e.g., trimethylamine:alane ($Me_3N:AlH_3$), triethylamine:alane ($Et_3N:AlH_3$), dimethylethylamine:alane ($Me_2EtN:AlH_3$)), trimethylaluminum (TMA, $Me_3Al$), triethylaluminum (TEA, $Et_3Al$), tributylaluminum ($Bu_3Al$), dimethylaluminum chloride ($Me_2AlCl$), diethylaluminum chloride ($Et_2AlCl$), dibutylaluminum hydride ($Bu_2AlH$), dibutylaluminum chloride ($Bu_2AlCl$), or derivatives thereof. In one example, ampoule assembly 1100 contains hafnium tetrachloride within ampoule body 1112. In another example, ampoule assembly 1100 contains PDMAT within ampoule body 1112.

While the foregoing is directed to embodiments of the invention, other and further embodiments of the invention may be devised without departing from the basic scope thereof, and the scope thereof is determined by the claims that follow.

The invention claimed is:

1. An apparatus for generating a chemical precursor used in a vapor deposition processing system, comprising:
   a first heated valve assembly coupled to and in fluid communication with an ampoule, wherein the first heated valve assembly comprises:
      a first body;
      a heating source, wherein the heating source is at least partially contained within the first body;
      an inlet channel at least partially contained within the first body, wherein one end of the inlet channel is coupled to and in fluid communication with the ampoule;
      a first pneumatic valve and a first manual valve, wherein both of the first pneumatic valve and the first manual valve are coupled to the first body along the inlet channel and positioned to control fluid flow within the inlet channel;
      an outlet channel at least partially contained within the first body, wherein one end of the outlet channel is coupled to and in fluid communication with the ampoule;
      a second pneumatic valve and a second manual valve, wherein both of the second pneumatic valve and the second manual valve are coupled to the first body and along the outlet channel and positioned to control fluid flow within the outlet channel;
      a bypass channel, wherein a first end of the bypass channel is coupled to the inlet channel and a second end of the bypass channel is coupled to the outlet channel; and
      a bypass valve coupled to the first body and positioned to control fluid flow within the bypass channel, wherein the bypass valve in an opened position provides fluid communication between the inlet channel and the outlet channel through the bypass channel; and
   a second heated valve assembly coupled to and in fluid communication with the first heated valve assembly, wherein the first and second heated valve assemblies are configured to obtain independently predetermined temperatures, and the second heated valve assembly comprises:
      a second body;
      at least one heating source, wherein the at least one heating source is at least partially contained within the second body; and
      at least three additional valves, wherein the at least three additional valves are coupled to the second body.

2. The apparatus of claim 1, wherein the at least one heating source of the second heated valve assembly comprises at least one embedded electric heater.

3. The apparatus of claim 1, wherein the second heated valve assembly further comprises a thermostat coupled with the at least one heating source.

* * * * *

UNITED STATES PATENT AND TRADEMARK OFFICE
CERTIFICATE OF CORRECTION

PATENT NO. : 8,137,468 B2
APPLICATION NO. : 12/405692
DATED : March 20, 2012
INVENTOR(S) : Choi et al.

It is certified that error appears in the above-identified patent and that said Letters Patent is hereby corrected as shown below:

In the Detailed Description:

Column 28, Line 59, please delete "Cl" and insert --Cl-- therefor.

Signed and Sealed this
Twelfth Day of June, 2012

David J. Kappos
*Director of the United States Patent and Trademark Office*